(12) United States Patent
Saito et al.

(10) Patent No.: US 7,054,116 B2
(45) Date of Patent: May 30, 2006

(54) SPIN VALVE ELEMENT AND THIN FILM MAGNETIC HEAD

(75) Inventors: Masamichi Saito, Niigata-ken (JP); Kenichi Tanaka, Niigata-ken (JP); Yosuke Ide, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/631,576

(22) Filed: Jul. 31, 2003

(65) Prior Publication Data

US 2004/0022108 A1 Feb. 5, 2004

Related U.S. Application Data

(62) Division of application No. 09/741,409, filed on Dec. 19, 2000, now abandoned.

(30) Foreign Application Priority Data

Dec. 20, 1999 (JP) .................................. 11-361955

(51) Int. Cl.
*G11B 5/39* (2006.01)

(52) U.S. Cl. .................................. 360/324.12

(58) Field of Classification Search ............ 360/324.12
See application file for complete search history.

(56) References Cited

U.S. PATENT DOCUMENTS

| | | | |
|---|---|---|---|
| 5,408,377 A | 4/1995 | Gurney et al. | |
| 5,828,531 A | 10/1998 | Gill | |
| 5,959,810 A | 9/1999 | Kakihara et al. | |
| 6,191,926 B1 | 2/2001 | Everitt et al. | |
| 6,303,218 B1 * | 10/2001 | Kamiguchi et al. | 428/332 |
| 6,400,536 B1 | 6/2002 | Gill | |
| 6,473,278 B1 * | 10/2002 | Gill | 360/324.12 |
| 6,674,616 B1 | 1/2004 | Gill | |
| 6,788,499 B1 * | 9/2004 | Lin et al. | 360/324.1 |

FOREIGN PATENT DOCUMENTS

JP 10004226 A * 1/1998

OTHER PUBLICATIONS

1996 Digests of INTERMAG '96; IEEE International Magnetics Conference; Seattle, WA USA; Apr. 9-12, 1996; Session AA-04; Spin Valves with Synthetic Ferrimagnets; V.S. Speriosu et al.

* cited by examiner

*Primary Examiner*—Brian E. Miller
(74) *Attorney, Agent, or Firm*—Brinks Hofer Gilson & Lione

(57) ABSTRACT

A spin valve element includes an antiferromagnetic layer, a pinned magnetic layer formed in contact with the antiferromagnetic layer so that the magnetization direction thereof is pinned by an exchange coupling magnetic field with the antiferromagnetic layer, a nonmagnetic conductive layer in contact with the pinned magnetic layer, and a free magnetic layer in contact with the nonmagnetic conductive layer. The free magnetic layer includes a nonmagnetic intermediate layer, and first and second free magnetic layers with the nonmagnetic intermediate layer provided therebetween, the second free magnetic layer is formed in contact with the nonmagnetic conductive layer, the first and second free magnetic layers are antiferromagnetically coupled with each other to bring both layers into a ferrimagnetic state, and either of the first and second free magnetic layers comprises a ferromagnetic insulating film. It is thus possible to increase the sensitivity to an external magnetic field, and suppress the occurrence of a shunt loss to increase the rate of change in magnetoresistance.

25 Claims, 30 Drawing Sheets

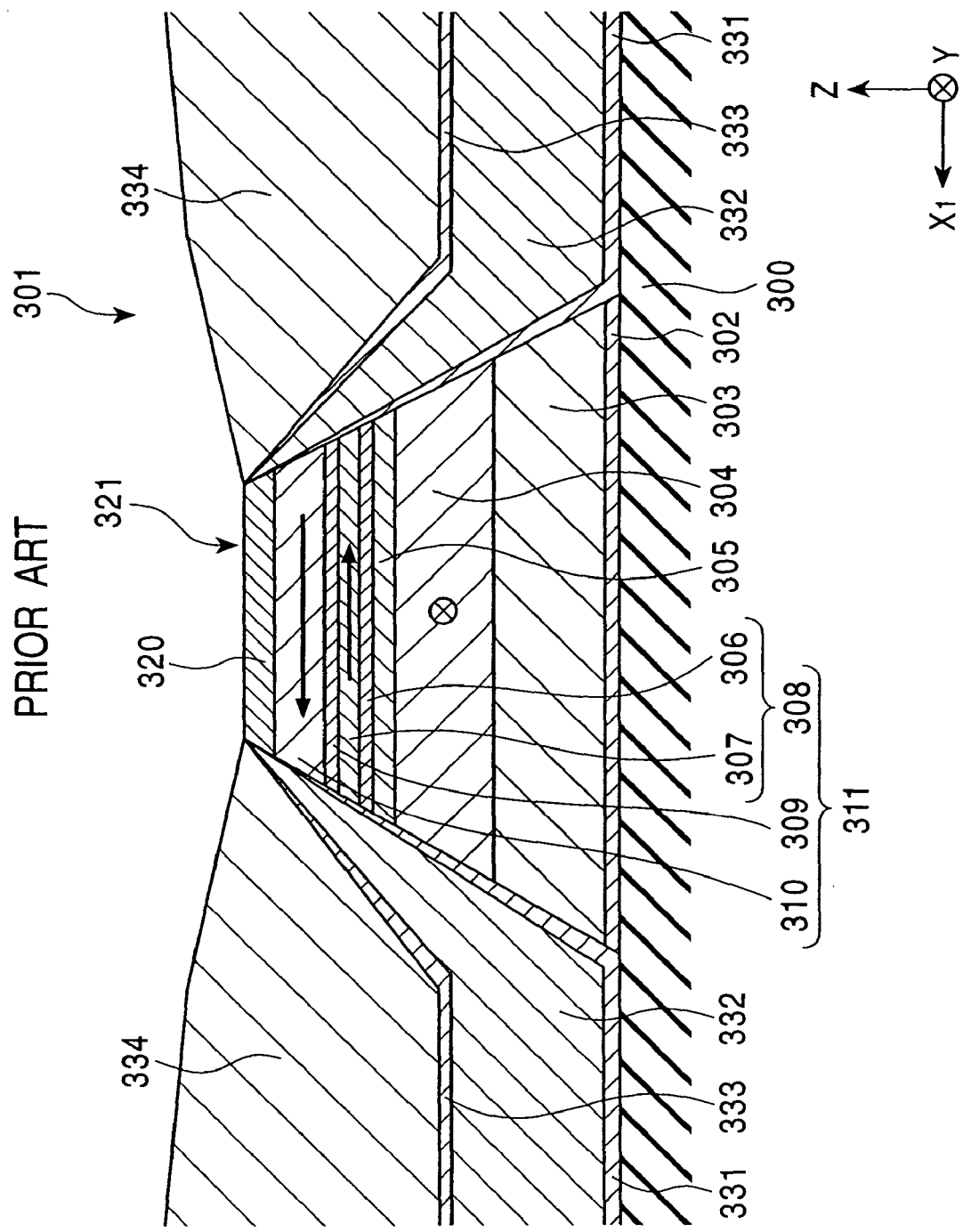

US 7,054,116 B2

SPIN VALVE ELEMENT AND THIN FILM MAGNETIC HEAD

This application is a divisional application of U.S. application Ser. No. 09/741,409 filed on Dec. 19, 2000 now abandoned, entitled "Spin Valve Element and Thin Film Magnetic Head."

BACKGROUND OF THE INVENTION

1. Field of the Invention

The present invention relates to a spin valve element and a thin film magnetic head, and particularly to a spin valve element and a thin film magnetic head having both high sensitivity to an external magnetic field and a high rate of change in magnetoresistance.

2. Description of the Related Art

Magnetoresistive magnetic heads include a MR (Magnetoresistive) head comprising an element exhibiting a magnetoresistive effect, and a GMR (Giant Magnetoresistive) head comprising an element exhibiting a giant magnetoresistive effect. In the MR head, the element exhibiting a magnetoresistive effect has a single layer structure comprising a magnetic material. On the other hand, in the GMR head, the element exhibiting a magnetoresistive effect has a multilayer structure in which a plurality of materials are laminated. Although there are several types of structures creating the giant magnetoresistive effect, a spin valve element has a relatively simple structure and exhibits a high rate of change in resistance with an external magnetic field.

Recently, high-density magnetic recording has been increasingly demanded, and a spin valve element adaptable for higher recording density has increasingly attracted attention.

A conventional spin valve element is described with reference to the drawings. FIG. 31 is a schematic sectional view showing a conventional spin valve element 301 as viewed from the magnetic recording medium side.

Furthermore, shield layers are formed above and below the spin valve element 301 with gap layers provided therebetween to form a reproducing thin film magnetic head comprising the spin valve element 301, the gap layers and the shield layers. A recording inductive head may be laminated on the thin film magnetic head.

The thin film magnetic head is provided at the trailing side end of a floating slider together with the inductive head to constitute a thin film magnetic head which detects a recording magnetic field of a magnetic recording medium such as a hard disk or the like.

In FIG. 31, the Z direction coincides with the movement direction of the magnetic recording medium, the Y direction coincides with the direction of a leakage magnetic field from the magnetic recording medium, and the $X_1$ direction coincide with the track width direction of the spin valve element 301.

The spin valve element 301 shown in FIG. 31 is a bottom-type single spin valve thin film magnetic element comprising an antiferromagnetic layer 303, a pinned magnetic layer 304, a nonmagnetic conductive layer 305, and a free magnetic layer 311, which are laminated in turn.

In FIG. 31, reference numeral 300 denotes an insulating layer made of $Al_2O_3$ or the like, and reference numeral 302 denotes an underlying layer made of Ta (tantalum) or the like and laminated on the insulating layer 300. The antiferromagnetic layer 303, the pinned magnetic layer 304, the nonmagnetic conductive layer 305 made of Cu or the like, and the free magnetic layer 311 are laminated on the underlying layer 302, and a capping layer 320 made of Ta or the like is laminated on the free magnetic layer 311.

In this way, the layers from the underlying layer 302 to the capping layer 320 are laminated in turn to constitute a laminate 321 having a substantially trapezoidal sectional shape having a width corresponding to the track width.

The pinned magnetic layer 304 is made of, for example, Co, and laminated in contact with the antiferromagnetic layer 303 so that an exchange coupling magnetic field (exchange anisotropic magnetic field) occurs in the interface between the pinned magnetic layer 304 and the antiferromagnetic layer 303 to pin the magnetization direction of the pinned magnetic layer 304 in the Y direction shown in the drawing.

The free magnetic layer 311 comprises a nonmagnetic intermediate layer 309, and first and second free magnetic layers 310 and 308 formed with the nonmagnetic intermediate layer 309 provided therebetween. The first free magnetic layer 310 is provided on the capping layer 320 side of the nonmagnetic intermediate layer 309, and the second free magnetic layer 308 is provided on the nonmagnetic conductive layer 305 side of the nonmagnetic intermediate layer 309. The thickness of the first free magnetic layer 310 is slightly larger than the thickness of the second free magnetic layer 308. The first and second free magnetic layers 310 and 308 are antiferromagnetically coupled with each other so that both layers are put into a ferrimagnetic state.

The first free magnetic layer 310 comprises a ferromagnetic conductive film made of a NiFe alloy or the like, and the nonmagnetic intermediate layer 309 is made of a nonmagnetic material such as Ru or the like.

The second free magnetic layer 308 comprises a anti-diffusion layer 306 and a ferromagnetic layer 307. Each of the anti-diffusion layer 306 and the ferromagnetic layer 307 comprises a ferromagnetic conductive film, and for example, the anti-diffusion layer 306 is made of Co, and the ferromagnetic layer 307 is made of a NiFe alloy.

The anti-diffusion layer 306 is provided for preventing mutual diffusion between the ferromagnetic layer 307 and the nonmagnetic conductive layer 305 to increase the GMR effect (ΔMR) produced in the interface with the nonmagnetic conductive layer 305.

Since the first free magnetic layer 310 and the second free magnetic layer 308 are antiferromagnetically coupled with each other, when the magnetization direction of the first free magnetic layer 310 is oriented in the $X_1$ direction shown in the drawing by bias layers 332, the magnetization direction of the second free magnetic layer 308 is oriented in the direction opposite to the $X_1$ direction. At this time, the magnetization of the first free magnetic layer 310 remains to orient the magnetization direction of the entire free magnetic layer 311 in the $X_1$ direction shown in the drawing.

In this way, the first free magnetic layer 310 and the second free magnetic layer 308 are antiferromagnetically coupled with each other so that the magnetization directions are antiparallel to each other to bring the free magnetic layer 311 into a synthetic ferrimagnetic state (synthetic ferrimagnetic free).

Therefore, the magnetization direction of the free magnetic layer 311 crosses the magnetization direction of the pinned magnetic layer 304.

The bias layers 332 are formed on both sides of the laminate 321. The bias layers 332 orient the magnetization direction of the first free magnetic layer 310 in the $X_1$ direction to bring the free magnetic layer 311 in a single magnetic domain state, suppressing Barkhausen noise of the free magnetic layer 311.

Reference numeral 334 denotes a conductive layer made of Cu or the like, for applying a sensing current to the laminate 321.

Furthermore, bias underlying layers 331 made of, for example, Cr or the like are provided between the bias layers 332 and the insulating layer 300, and between the bias layer 332 and the laminate 321, and intermediate layers 333 made of, for example, Ta or Cr are provided between the bias layers 332 and the conductive layers 334.

In the spin valve thin film magnetic element 301, when the magnetization direction of the free magnetic layer 311, which is oriented in the $X_1$ direction, is changed by a leakage magnetic field from the recording medium such as a hard disk or the like, the electric resistance changes with the relation to magnetization of the pinned magnetic layer 304 which is pinned in the Y direction, and the leakage magnetic field from the recording medium is detected by a voltage change based on the change in the electric resistance.

The free magnetic layer 311 comprises the first and second free magnetic layers 310 and 308 antiferromagnetically coupled with each other, and the magnetization direction of the entire free magnetic layer 311 changes with an external magnetic field of small magnitude, thereby increasing the sensitivity of the spin valve thin film magnetic element 301.

Particularly, the thicknesses of the first and second free magnetic layers 310 and 308 can be appropriately controlled to decrease the effective thickness of the free magnetic layer 311 so that the magnetization direction of the free magnetic layer is easily changed with an external magnetic field of small magnitude to increase the sensitivity of the spin valve element 301.

The conventional spin valve element 301 comprises the free magnetic layer 311 having a laminated structure of three layers including the first and second free magnetic layers 310 and 308, and the nonmagnetic intermediate layer 309. Therefore, the thickness of the laminate 321 is increased to cause a shunt of the sensing current. This causes the problem of decreasing conduction electrons flowing through the nonmagnetic conductive layer 305 to cause a so-called shunt loss in which, the rate of change in magnetoresistance of the spin valve element 301 is decreased.

In order to decrease the shunt loss of the spin valve element, it is effective that the free magnetic layer has a single layer structure to decrease the thickness of the laminate. In this case, there is the problem of slowing down a change in the magnetization direction of the free magnetic layer in response to an external magnetic field, thereby decreasing the sensitivity to the external magnetic field.

SUMMARY OF THE INVENTION

The present invention has been achieved in consideration of the above situation, and an object of the present invention is to provide a spin valve element permitting an increase in the sensitivity to an external magnetic field and suppression of a shunt loss to increase the rate of change in magnetoresistance. Another object of the present invention is to provide a thin film magnetic head comprising the spin valve element.

In order to achieve the objects, the present invention has the following construction.

A spin valve element of the present invention comprises an antiferromagnetic layer, a pinned magnetic layer formed in contact with the antiferromagnetic layer so that the magnetization direction thereof is pinned by an exchange coupling magnetic field with the antiferromagnetic layer, a nonmagnetic conductive layer in contact with the pinned magnetic layer, and a free magnetic layer in contact with the nonmagnetic conductive layer, wherein the free magnetic layer comprises a nonmagnetic intermediate layer, and first and second free magnetic layers with the nonmagnetic intermediate layer provided therebetween, the second free magnetic layer is formed in contact with the nonmagnetic conductive layer, the first and second free magnetic layers are antiferromagnetically coupled with each other to bring both layers into a ferrimagnetic state, and either of the first and second free magnetic layers comprises a ferromagnetic insulating film.

In the above-described spin valve element, with the first free magnetic layer comprising the ferromagnetic insulating film, the resistivity of the first free magnetic layer is increased to cause a difficulty in flowing a sensing current in the first free magnetic layer, thereby suppressing a shunt of the sensing current to decrease a shunt loss, and permitting an increase in the rate of change in magnetoresistance of the spin valve element.

Since the ferromagnetic insulating film has high resistivity, contact with another layer having low resistivity forms a potential barrier in the interface therebetween, and thus up-spin conduction electrons can be mirror-reflected to extend the mean free path of the up-spin conduction electrons, thereby further increasing the rate of change in magnetoresistance of the spin valve element.

In the spin valve element, with the second free magnetic layer comprising the ferromagnetic insulating film, the up-spin conduction electrons can be mirror-reflected by the ferromagnetic insulating film to extend the mean free path of the up-spin conduction electrons, and trap the up-spin conduction electrons near the nonmagnetic conductive layer, thereby suppressing a shunt of the sensing current. Therefore, the shunt loss can be decreased to further increase the rate of change in magnetoresistance of the spin valve element.

In the spin valve element of the present invention, the first free magnetic layer may comprises only the ferromagnetic insulating film or only a first ferromagnetic conductive film.

Particularly, the first free magnetic layer preferably comprises a laminate of the ferromagnetic insulating film and the first ferromagnetic conductive film, wherein the first ferromagnetic conductive film is formed in contact with the nonmagnetic intermediate layer, and the ferromagnetic insulating layer and the first ferromagnetic conductive film are ferromagnetically coupled with each other to cause a ferromagnetic state therebetween. In this case, the thickness s of the first ferromagnetic conductive film is preferably in the range of $0 \text{ nm} < s \leq 3.0 \text{ nm}$.

In the spin valve element, the ferromagnetic insulating film and the first ferromagnetic conductive film, which constitute the first free magnetic layer, are brought into the ferromagnetic state so that the magnetization direction of the whole first free magnetic layer can be oriented in one direction. In addition, the first and second free magnetic layers are antiferromagnetically coupled with each other to form the ferrimagnetic state, thereby increasing the sensitivity to an external magnetic field.

Furthermore, the first ferromagnetic conductive film is formed in contact with the nonmagnetic intermediate layer, and thus the first and second free magnetic layers can be securely antiferromagnetically coupled with each other to form the ferrimagnetic state, thereby increasing the sensitivity to an external magnetic field.

In this case, by setting the thickness s of the first ferromagnetic conductive film in the range of $0 \text{ nm} < s \leq 3.0 \text{ nm}$, the first and second free magnetic layers can be securely antiferromagnetically coupled with each other.

In the spin valve element of the present invention, the second free magnetic layer may comprise only the ferromagnetic insulating film or only a second ferromagnetic conductive film.

Particularly, the second free magnetic layer preferably comprises a laminate of the ferromagnetic insulating film and the second ferromagnetic conductive film, wherein the second ferromagnetic conductive film is formed in contact with the nonmagnetic intermediate layer, and the ferromagnetic insulating layer and the second ferromagnetic conductive film are ferromagnetically coupled with each other to cause the ferromagnetic state therebetween.

In the spin valve element, the ferromagnetic insulating film and the second ferromagnetic conductive film, which constitute the second free magnetic layer, are brought into the ferromagnetic state so that the magnetization direction of the whole second free magnetic layer can be oriented in one direction. In addition, the first and second free magnetic layers are antiferromagnetically coupled with each other to form the ferrimagnetic state, thereby increasing the sensitivity to an external magnetic field.

Furthermore, the second ferromagnetic conductive film is formed in contact with the nonmagnetic intermediate layer, and thus the first and second free magnetic layers can be securely antiferromagnetically coupled with each other to form the ferrimagnetic state, thereby increasing the sensitivity to an external magnetic field.

The second free magnetic layer may comprise a laminate of the ferromagnetic insulating film and a third ferromagnetic conductive film, wherein the third ferromagnetic conductive film is formed in contact with the nonmagnetic conductive layer, and the ferromagnetic insulating film and the third ferromagnetic conductive film are ferromagnetically coupled with each other to form the ferromagnetic state.

In the spin valve element, the ferromagnetic insulating film and the third ferromagnetic conductive film, which constitute the second free magnetic layer, are brought into the ferromagnetic state so that the magnetization direction of the whole second free magnetic layer can be oriented in one direction. In addition, the first and second free magnetic layers are antiferromagnetically coupled with each other to form the ferrimagnetic state, thereby increasing the sensitivity to an external magnetic field.

Furthermore, the third ferromagnetic conductive film is formed in contact with the nonmagnetic conductive layer, and thus a greater giant magnetoresistive effect can be manifested in the interface between the third ferromagnetic conductive film and the nonmagnetic conductive film, increasing the rate of change in magnetoresistance of the spin valve element.

The second free magnetic layer may comprise the ferromagnetic insulating film, and the second and third ferromagnetic conductive films with the ferromagnetic insulating film provided therebetween, which are ferromagnetically coupled with each other to form the ferromagnetic state.

In the spin valve element, the ferromagnetic insulating film and the second and third ferromagnetic conductive films, which constitute the second free magnetic layer, are brought into the ferromagnetic state so that the magnetization direction of the whole second free magnetic layer can be oriented in one direction. In addition, the first and second free magnetic layers are antiferromagnetically coupled with each other to form the ferrimagnetic state, thereby increasing the sensitivity to an external magnetic field.

Also the second ferromagnetic conductive film is formed in contact with the nonmagnetic intermediate layer, and thus the first and second free magnetic layers can be securely antiferromagnetically coupled with each other to form the ferrimagnetic state, thereby increasing the sensitivity to an external magnetic field.

Furthermore, the third ferromagnetic conductive film is formed in contact with the nonmagnetic conductive layer, and thus a greater giant magnetoresistive effect can be manifested in the interface between the third ferromagnetic conductive film and the nonmagnetic conductive film, increasing the rate of change in magnetoresistance of the spin valve element.

In the spin valve element of the present invention, the ferromagnetic insulating film is a ferromagnetic insulating oxide film or ferromagnetic insulating nitride film.

In the spin valve element of the present invention, the ferromagnetic insulating film is a ferromagnetic insulating oxide film comprising ferrite composed of Fe—O or M—Fe—O (wherein M is at least one element of Mn, Co, Ni, Ba, Sr, Y, Gd, Cu, and Zn).

As the element M, Mn and Zn, or Ni and Zn are preferably selected.

The resistivity of the ferromagnetic insulating film comprising ferrite is preferably 10 μΩ·m (1 Ω·cm) or more.

Furthermore, the saturation magnetic flux density of the ferromagnetic insulating film comprising ferrite is preferably 0.2 T or more.

The ferromagnetic insulating film comprising ferrite preferably has a composition represented by the following formula:

$Fe_xM_yO_z$ wherein M is at least one element of Mn, Co, Ni, Ba, Sr, Y, Gd, Cu, and Zn, and the composition ratios x, y and z by atomic % satisfy $20 \leq x \leq 40$, $10 \leq y \leq 20$, and $40 \leq z \leq 70$, respectively.

In the spin valve element of the present invention, the ferromagnetic insulating film is a ferromagnetic insulating oxide film comprising a fine crystal phase of bcc structure Fe having an average crystal grain diameter of 10 nm or less, and an amorphous phase containing large amounts of element T or T' and O (wherein T represents at least one element of the rare earth elements, and T' represents at least one element of Ti, Zr, Hf, V, Nb, Ta, and W), wherein the ratio of the fine crystal phase of bcc structure Fe to the entire structure is 50% or less.

The ferromagnetic insulating oxide film is preferably represented by the composition formula below, in which a fine crystal phase of bcc structure Fe having an average crystal grain diameter of 10 nm or less and an amorphous phase containing large amounts of element T and O are mixed, and the ratio of the fine crystal phase of bcc structure Fe to the entire structure is 50% or less.

Namely, the ferromagnetic insulating oxide film is represented by the composition formula $Fe_aT_bO_c$ wherein T is at least one element of the rare earth elements (La, Ce, Pr, Nd, Pm, Sm, Eu, Gd, Tb, Dy, Ho, Er, Tm, Yb, and Lu), and the composition ratios a, b and c by atomic % satisfy $50 \leq a \leq 70$, $5 \leq b \leq 30$, $10 \leq c \leq 30$, and $a+b+c=100$.

The resistivity of the ferromagnetic insulating oxide film represented by the above composition formula is preferably 4 to 10 μΩ·m (400 to 1000 μΩ·cm).

The ferromagnetic insulating oxide film is preferably represented by the composition formula below, in which a fine crystal phase of bcc structure Fe having an average crystal grain diameter of 10 nm or less and an amorphous phase containing large amounts of element T and O are mixed, and the ratio of the fine crystal phase of bcc structure Fe to the entire structure is 50% or less.

Namely, the ferromagnetic insulating oxide film is represented by the composition formula $Fe_dT'_eO_f$ wherein T' is at least one element of Ti, Zr, He, V, Nb, Ta, and W, and the composition ratios d, e and f by atomic % satisfy $45 \leq d \leq 70$, $5 \leq e \leq 30$, $10 \leq f \leq 40$, and $d+e+f=100$.

The resistivity of the ferromagnetic insulating oxide film represented by the above composition formula is preferably 4 to $2.0 \times 10^3$, $\mu\Omega \cdot m$ (400 to $2.0 \times 10^5$ $\mu\Omega \cdot cm$).

In the spin valve element of the present invention, the ferromagnetic insulating film is a ferromagnetic insulating nitride film comprising a fine crystal phase mainly composed of bcc structure Fe having an average crystal grain diameter of 10 nm or less, and an amorphous phase mainly composed of a compound of N and at least one element D selected from the group consisting of La, Ce, Pr, Nd, Pm, Sm, Eu, Gd, Tb, Dy, Ho, Er, Tm, Yb, Lu, Ti, Zr, Hf, V, Nb, Ta, and W, wherein the ratio of the amorphous phase is 50% or more of the structure.

The ferromagnetic insulating nitride film is preferably represented by the following composition formula:

$Fe_pD_qN_r$ wherein D is at least one element selected from the group consisting of La, Ce, Pr, Nd, Pm, Sm, Eu, Gd, Tb, Dy, Ho, Er, Tm, Yb, Lu, Ti, Zr, Hf, V, Nb, Ta, and W, and the composition ratios p, q and r by atomic % satisfy $60 \leq d \leq 80$, $10 \leq q \leq 15$, and $5 \leq r \leq 30$.

The resistivity of the ferromagnetic insulating nitride film represented by the above composition formula is preferably 10 $\mu\Omega \cdot m$ or more.

In the spin valve element of the present invention, the thickness u of the ferromagnetic insulating film is preferably in the range of $0.5 \, nm \leq u \leq 10 \, nm$, more preferably in the range of $1.0 \, nm \leq u \leq 3.0 \, nm$.

With the second free magnetic layer comprising the ferromagnetic insulating film, the thickness u of the ferromagnetic insulating film is set in the range of $0.5 \, nm \leq u \leq 10 \, nm$ so that the up-spin conduction electrons moving from the nonmagnetic conductive layer can be mostly mirror-reflected without passing through the ferromagnetic insulating film.

In another aspect of the present invention, a spin valve element comprises an antiferromagnetic layer, a pinned magnetic layer formed in contact with the antiferromagnetic layer so that the magnetization direction thereof is pinned by an exchange coupling magnetic field with the antiferromagnetic layer, a nonmagnetic conductive layer in contact with the pinned magnetic layer, and a free magnetic layer in contact with the nonmagnetic conductive layer, wherein the free magnetic layer comprises a nonmagnetic intermediate layer, and first and second free magnetic layers with the nonmagnetic intermediate layer provided therebetween, the second free magnetic layer is formed in contact with the nonmagnetic conductive layer, the first and second free magnetic layers are antiferromagnetically coupled with each other to bring both layers into a ferrimagnetic state, and the second free magnetic layer comprises a nonmagnetic intermediate insulating film and a pair of ferromagnetic conductive films which are antiferromagnetically coupled with each other to form a ferrimagnetic state therebetween.

In the spin valve element, the first and second free magnetic layers are brought into the ferrimagnetic state, and the pair of ferromagnetic conductive films which constitute the second free magnetic layers are brought into the ferrimagnetic state with the nonmagnetic intermediate insulating film provided therebetween. Therefore, the entire free magnetic layer can be stably brought into the ferrimagnetic state, and the up-spin conduction elections can be mirror-reflected by the interface between the nonmagnetic intermediate insulating film having high resistivity and one of the ferromagnetic conductive films to extend the mean free path of the up-spin-conduction electrons. As a result, the sensitivity to an external magnetic field can be increased, and the rate of change in magnetoresistance can be increased.

In a further aspect of the present invention, a spin valve element comprises an antiferromagnetic layer, a pinned magnetic layer formed in contact with the antiferromagnetic layer so that the magnetization direction thereof is pinned by an exchange coupling magnetic field with the antiferromagnetic layer, a nonmagnetic conductive layer in contact with the pinned magnetic layer, and a free magnetic layer in contact with the nonmagnetic conductive layer, wherein the free magnetic layer comprises a nonmagnetic intermediate insulating layer, and first and second free magnetic layers with the nonmagnetic intermediate insulating layer provided therebetween, the first and second free magnetic layers being antiferromagnetically coupled with each other to form a ferrimagnetic state therebetween.

In the spin valve element, the first and second free magnetic layers with the nonmagnetic intermediate insulating layer provided therebetween are brought into the ferrimagnetic state by antiferromagnetic coupling, and the up-spin conduction elections are mirror-reflected by the interface between the nonmagnetic intermediate insulating film having high resistivity and the second free magnetic layer to extend the mean free path of the up-spin conduction electrons. As a result, the sensitivity to an external magnetic field can be increased, and the rate of change in magnetoresistance can be increased.

BRIEF DESCRIPTION OF THE DRAWINGS

FIG. 31 is a schematic sectional view of a conventional spin valve element, as viewed from the magnetic recording medium side.

DESCRIPTION OF THE PREFERRED EMBODIMENTS

Embodiments of the present invention will be described below with reference to FIGS. 1 to 30.

In FIGS. 1 to 30, the Z direction coincides with the direction of movement of a magnetic recording medium, the Y direction coincides with the direction of a leakage magnetic field from the magnetic recording medium, and the $X_1$ direction coincides with the track width direction of a spin valve element.

First Embodiment

Figure 1:
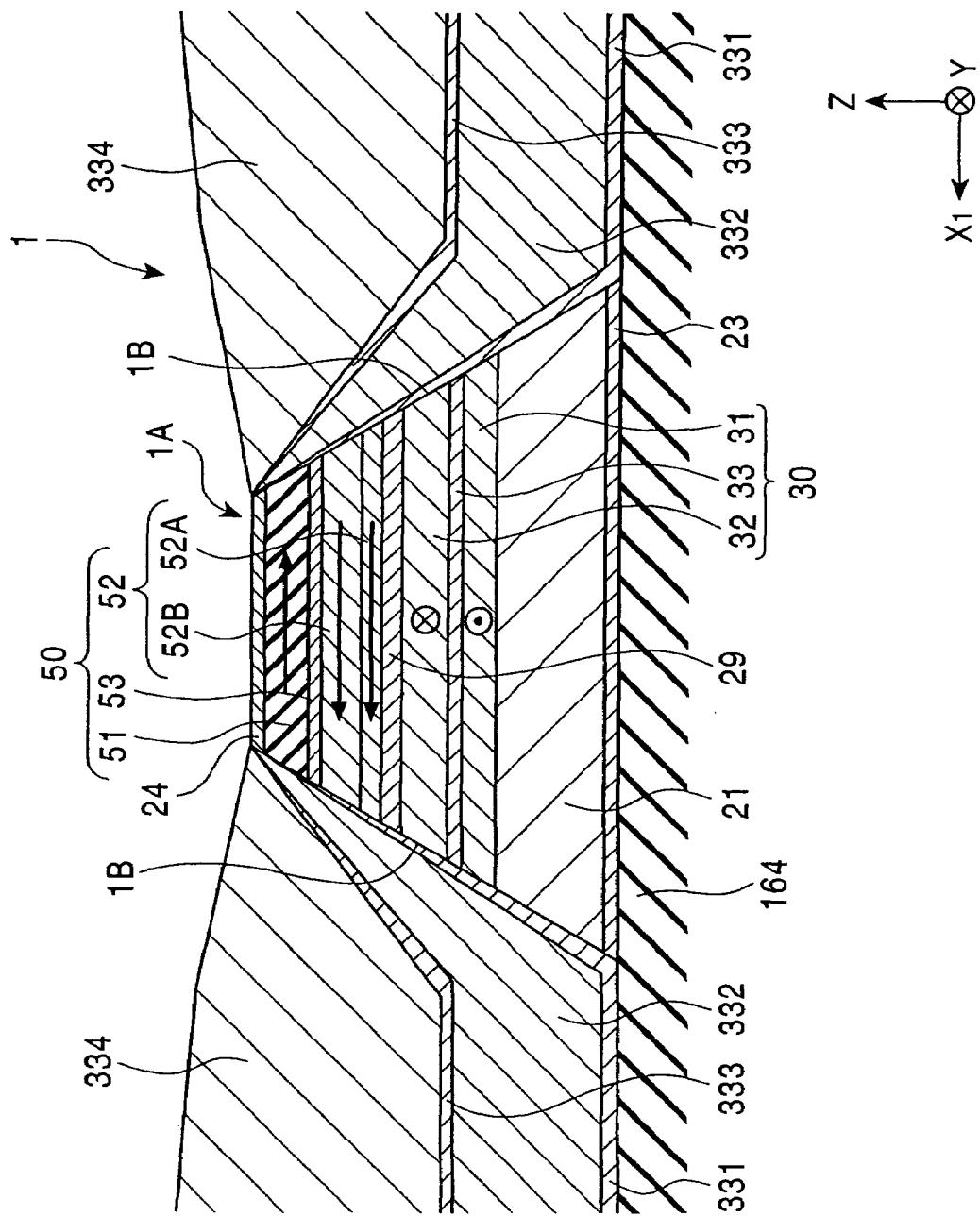
FIG. 1 is a schematic sectional view of a spin valve element according to a first embodiment of the present invention, as viewed from the magnetic recording medium side.

FIG. 1 is a schematic sectional view of a spin valve element 1 according to the first embodiment of the present invention, as viewed from the magnetic recording medium side.

Figure 2:
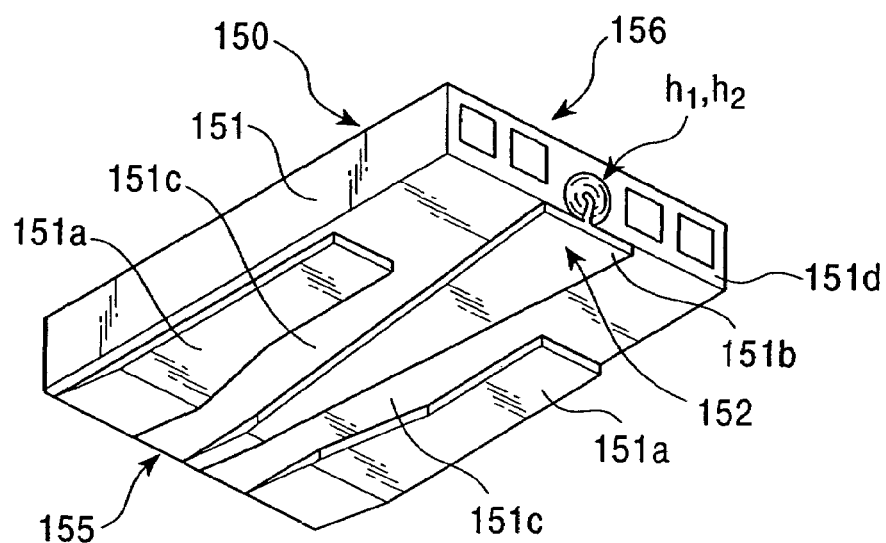
FIG. 2 is a perspective view of a floating magnetic head comprising a thin film magnetic head of the present invention.
Figure 3:
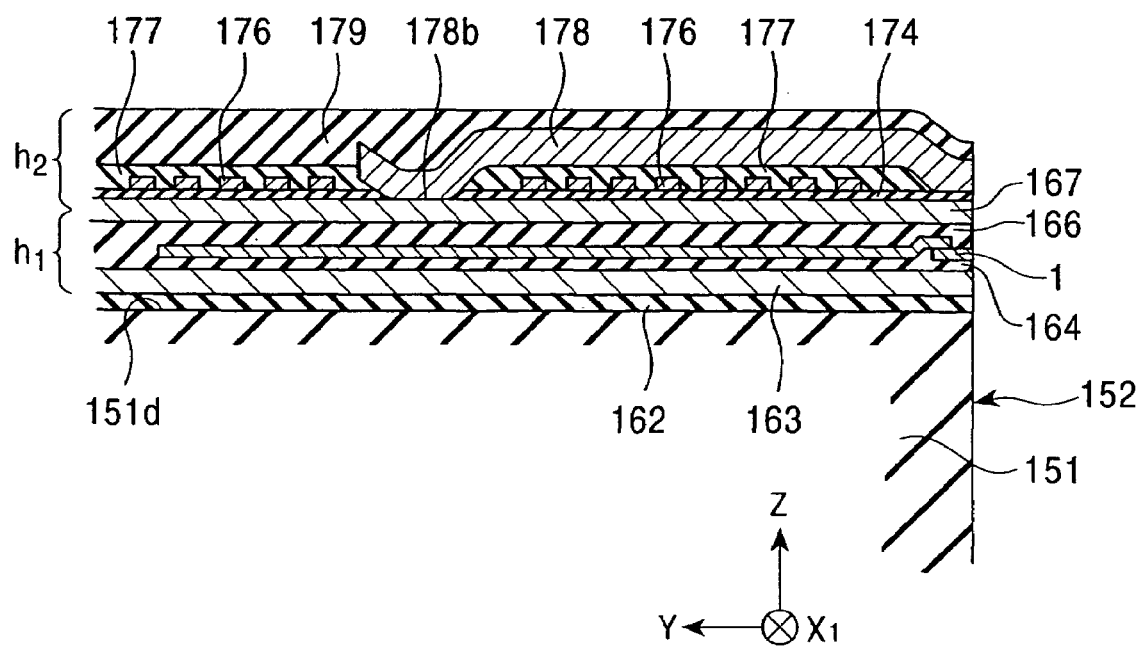
FIG. 3 is a schematic sectional view of a principal portion of the floating magnetic head shown in FIG. 2.

FIGS. 2 and 3 show a floating magnetic head 150 comprising a thin film magnetic head comprising the spin valve element 1.

The floating magnetic head 150 shown in FIG. 2 mainly comprises a slider 151, a thin film magnetic head $h_1$ according to the present invention and an inductive head $h_2$, which are provided on the end surface 151d of the slider 151. Reference numeral 155 denotes the leading side of the slider 151 on the upstream side in the movement direction of the magnetic recording medium, and reference numeral 156 denotes the trailing side. In the slider 151, rails 151a and 151b are formed in the medium-facing surface 152, and air grooves 151b are formed between the rails.

As shown in FIGS. 2 and 3, the thin film magnetic head $h_1$ of the present invention comprises an insulating layer 162 formed on the end surface 151d of the slider 151, a lower shield layer 163 formed on the insulating layer 162, a lower gap layer 164 formed on the lower shield layer 163, the spin valve element 1 of the present invention, which is formed on the lower gap layer 164 to be exposed from the medium-facing surface 152, an upper gap layer 166 formed to cover the spin valve element 1, and an upper shield layer 167 formed to cover the upper gap layer 166.

The upper shield layer 167 also serves as a lower core layer of the inductive head $h_2$, which will be described below.

The inductive head $h_2$ comprises the lower core layer (upper shield layer) 167, a gap layer 174 laminated on the lower core layer 167, a coil 176, an upper insulating layer 177 formed to cover the coil 176, and an upper core layer 178 joined to the gap layer 174 and joined to the lower core layer 167 on the coil 176 side.

The coil 176 is patterned in a spiral planar shape. The base portion 178b of the upper core layer 178 is magnetically connected to the lower core layer 167 in a substantially central portion of the coil 176.

Furthermore, a core protecting layer 179 made of alumina or the like is laminated on the upper core layer 178.

The spin valve element 1 shown in FIG. 1 is a bottom-type single spin valve thin film magnetic element in which an antiferromagnetic layer 21, a pinned magnetic layer 30, a nonmagnetic conductive layer 29, and a free magnetic layer 50 are laminated in turn.

In FIG. 1, reference numeral 164 denotes the lower gap layer made of $Al_2O_3$ or the like, and reference numeral 23 denotes an underlying layer made of Ta (tantalum) or the like and laminated on the lower gap layer 164. The antiferromagnetic layer 21 is laminated on the underlying layer 23, the pinned magnetic layer 30 is laminated on the antiferromagnetic layer 21, and the nonmagnetic conductive layer 29 made of Cu or the like is laminated on the pinned magnetic layer 30. The free magnetic layer 50 is laminated on the nonmagnetic conductive layer 29, and a capping layer 24 made of Ta or the like is laminated on the free magnetic layer 50.

In this way, the layers from the underlying layer 23 to the capping layer 24 are laminated in turn to form a laminate 1A having a substantially trapezoidal sectional shape having a width corresponding to the track width.

The free magnetic layer 50 comprises a nonmagnetic intermediate layer 53, and first and second free magnetic layers 51 and 52 antiferromagnetically coupled with each other with the nonmagnetic intermediate layer 53 provided therebetween to bring both free magnetic layers 51 and 52 into a ferrimagnetic state. The magnetization direction of the entire free magnetic layer 50 is oriented in the $X_1$ direction.

The pinned magnetic layer 30 comprises a nonmagnetic layer 33, and first and second pinned magnetic layers 31 and 32 antiferromagnetically coupled with each other with the nonmagnetic layer 33 provided therebetween to bring both pinned magnetic layers 31 and 32 into a ferrimagnetic state. The magnetization direction of the entire pinned magnetic layer 30 is pinned in the Y direction.

In the spin valve element 1, when the magnetization direction of the free magnetic layer 50, which is oriented in the $X_1$ direction, is changed by a leakage magnetic field from a recording medium such as a hard disk or the like, the electric resistance changes with the relation to magnetization of the pinned magnetic layer 30, which is pinned in the Y direction, i.e., the giant magnetoresistive effect is exhibited, so that the leakage magnetic field from the recording medium is detected by a voltage change based on the change in the electric resistance.

A pair of bias layer 332 made of, for example, a Co—Pt (cobalt-platinum) alloy are formed on both sides of the laminate 1A in the $X_1$ direction, i.e., in the track width direction. The bias layers 332 are formed to extend from the top of the lower gap layer 164 to both sides 1B of the laminate 1A. The bias layers 332 orient the magnetization direction of the free magnetic layer 50 to decrease Barkhausen noise of the free magnetic layer 50.

Reference numeral 334 denotes an electrode layer. The electrode layers 334 are laminated on the bias layers 332, for applying a sensing current to the laminate 1A.

Furthermore, bias underlying layers 331 made of, for example, a nonmagnetic metal such as Cr are provided between the bias layer 332 and the lower gap layer 164, and between the bias layers 332 and the laminate 1A.

By forming the bias layers 332 on the bias underlying layers 331 made of Cr having a body-centered crystal structure (bcc structure), the coercive force and remanence ratio of the bias layers 332 can be increased to increase the bias magnetic field necessary for bringing the second free magnetic layer 52 into a single domain state.

Furthermore, intermediate layers 333 made of a nonmagnetic metal such as Ta or Cr are provided between the bias layer 332 and the electrode layers 334.

In use of Cr for the electrode layers 334, the intermediate layers 333 made of Ta function as a diffusion barrier to a thermal process such as resist curing in a subsequent step, preventing deterioration in the magnetic properties of the bias layers 332. In use of Ta for the electrode layers 334, the intermediate layers 333 made of Cr has the effect of facilitating the deposition of body-centered structure Ta crystal having low resistance-on Cr.

As shown in FIG. 1, the free magnetic layer 50 comprises the nonmagnetic intermediate layer 53, and the first and second free magnetic layers 51 and 52 with the nonmagnetic intermediate layer 53 provided therebetween.

The first free magnetic layer 51 is provided in contact with the capping layer 24 on the side of the nonmagnetic intermediate layer 53, which is opposite to the nonmagnetic conductive layer 29 side, and the second free magnetic layer 52 is provided in contact with the nonmagnetic conductive layer 29 on the nonmagnetic conductive layer 29 side of the nonmagnetic intermediate layer 53.

The first free magnetic layer 51 comprises a ferromagnetic insulating film which is ferromagnetic and has high resistivity. Specifically, a ferromagnetic insulating oxide film or a ferromagnetic insulating nitride film can be used.

The thickness of the first free magnetic layer 51 is preferably in the range of 1 to 4 nm.

The nonmagnetic intermediate layer 53 is made of a nonmagnetic conductive material such as one of Ru, Rh, Ir, Cr, Re, and Cu, or an alloy thereof, more preferably Ru.

The second free magnetic layer 52 comprises an anti-diffusion film 52A and a ferromagnetic film 52B. The anti-diffusion film 52A comprises a ferromagnetic conductive film of Co or the like, for preventing mutual diffusion between the ferromagnetic film 52B and the nonmagnetic conductive layer 29.

Like the anti-diffusion film 52A, the ferromagnetic film 52B comprises a ferromagnetic conductive film made of, for example, any one of Co, a CoFe alloy, a NiFe alloy, a CoNi alloy, and a CoNiFe alloy, preferably a NiFe alloy.

The second free magnetic layer 52 may comprise a single layer. In this case, the second free magnetic layer 52 is preferably made of any one of Co, a CoFe alloy, a NiFe alloy, a CoNi alloy, and a CoNiFe alloy.

The thickness of the second free magnetic layer 52 is preferably in the range of 2.5 to 4.5 nm, and is more preferably larger than the first free magnetic layer 51.

The first free magnetic layer 51 comprises an insulating film such as a ferromagnetic insulating oxide film or ferromagnetic insulating nitride film, which has a resistivity of about 4 to $2.0 \times 10^3$ $\mu\Omega \cdot m$, and thus exhibits higher resistivity than the second free magnetic layer comprising ferromagnetic conductive films (the anti-diffusion film 52A and the ferromagnetic film 52B) having a resistivity of about 0.3 $\mu\Omega \cdot m$, and the nonmagnetic intermediate layer 53 having a resistivity of about 0.1 $\mu\Omega \cdot m$.

Therefore, the sensing current less flows into the first free magnetic layer 51.

Therefore, the sensing current flowing through the laminate 1A mainly flows through the nonmagnetic conductive layer 29, the pinned magnetic layer 30 and the second free magnetic layer 52, thereby suppressing a shunt of the sensing current.

The giant magnetoresistive effect of the spin valve element 1 is mainly manifested in the interfaces between the nonmagnetic conductive layer 29 and the second free magnetic layer 52 and the pinned magnetic layer 30. Namely, when the magnetization direction of the free magnetic layer 50 is changed by the external magnetic field with the sensing current applied to the laminate 1A, conduction electrons flowing through the nonmagnetic conductive layer 29 are scattered at the interfaces between the nonmagnetic conductive layer 29 and the free magnetic layer 50 and the pinned magnetic layer 30, depending upon the magnetization direction of the free magnetic layer 50. This causes a change in the mean free path of the conduction electrons, causing a change in the rate of change in magnetoresistance.

Therefore, the first free magnetic layer 51 comprises a ferromagnetic insulating film having high resistivity so as to flow the sensing current in the periphery of the second free magnetic layer 52 and the nonmagnetic conductive layer 29, thereby increasing the number of conduction electrons contributing to the giant magnetoresistive effect to increase the rate of change in magnetoresistance.

In addition, a potential barrier is formed at the interface between the first free magnetic layer 51 comprising a ferromagnetic insulating film and the nonmagnetic intermediate layer 53 comprising a nonmagnetic metal or the like due to a great difference in resistivity between both layers.

Of the conduction electrons moving in the nonmagnetic conductive layer 29 with the sensing current supplied, up-spin conduction electrons are mirror-reflected by the potential barrier while maintaining the spin direction.

The conduction electrons moving in the nonmagnetic conductive layer 29 include up-spin conduction electrons and down-spin conduction electrons which are preset in substantially stochastrically equivalent amounts. The up-spin conduction electrons quite possibly move from the pinned magnetic layer 30 and the nonmagnetic conductive layer 29 to the free magnetic layer 50 when the magnetization direction of the entire free magnetic layer 50 becomes parallel to the magnetization direction of the pinned magnetic layer 30.

The up-spin conduction electrons are reflected at the interface between the first free magnetic layer 51 and the nonmagnetic intermediate layer 53 to extend the mean free path, thereby increasing the difference between the mean free paths of the up-spin conduction electrons and the down-spin conduction electrons. Therefore, the rate of change in magnetoresistance of the spin valve element 1 can be increased.

This is described with reference to a schematic drawing of FIG. 4.

Figure 4:
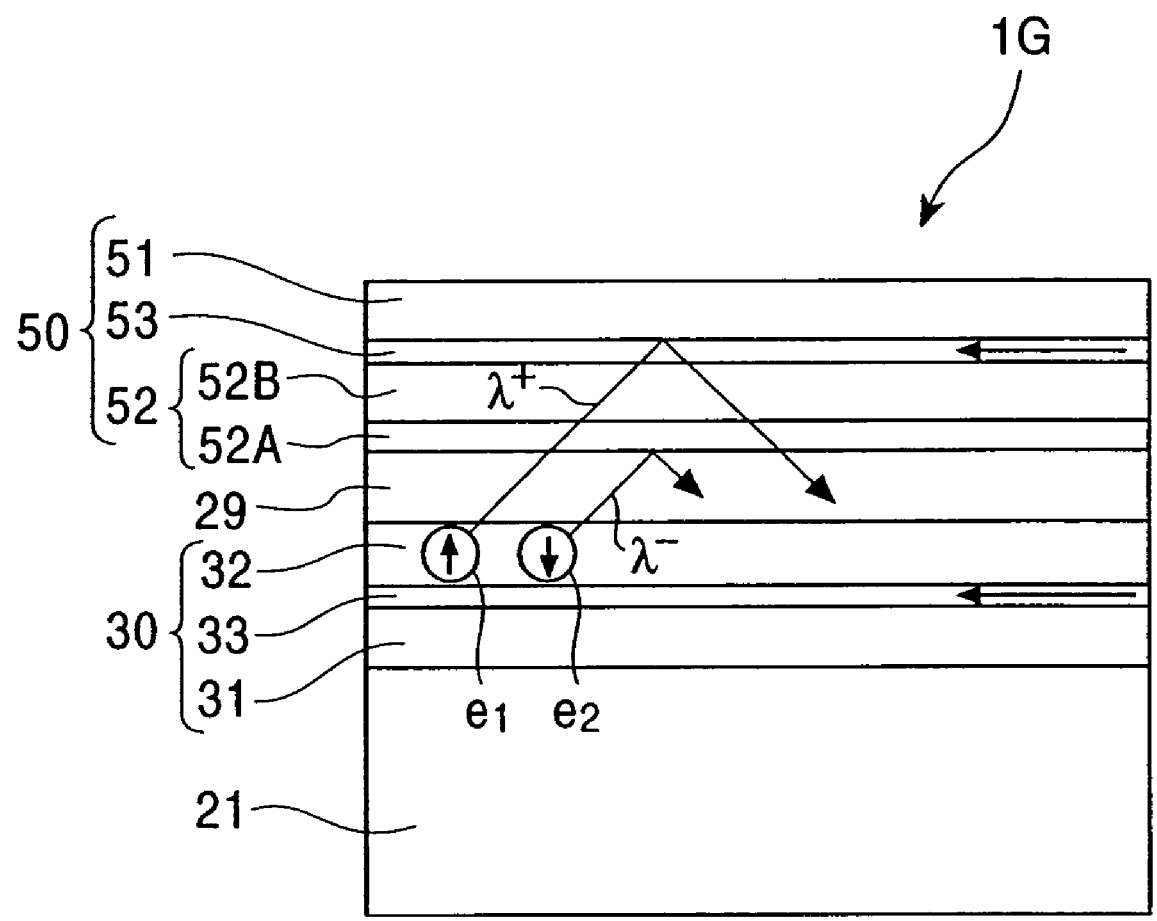
FIG. 4 is a schematic drawing illustrating the operation of the spin valve element shown in FIG. 1.

FIG. 4 shows a laminate 1G in which the antiferromagnetic layer 21, the pinned magnetic layer 30 (the first pinned magnetic layer 31, the nonmagnetic layer 33, the second pinned magnetic layer 32), the nonmagnetic conductive layer 29, the free magnetic layer 50 (the second free magnetic layer 52 (the anti-diffusion layer 52A, the ferromagnetic layer 52B), the nonmagnetic intermediate layer 53, the first free magnetic layer 51) are laminated in turn.

In FIG. 4, the magnetization direction of the free magnetic layer 50 is oriented in the leftward direction in FIG. 4 by the external magnetic field, and the magnetization direction of the pinned magnetic layer 30 is pinned in the leftward direction in FIG. 4 by an exchange coupling magnetic field with the antiferromagnetic layer 21.

When the sensing current is passed through the laminate 1G shown in FIG. 4, the conduction electrons mainly move in the nonmagnetic conductive layer 29 having low electric resistance. The conduction electrons include the two types of conduction electrons, i.e., the up-spin and down-spin conduction electrons, which are present in stochastically substantially equivalent amounts. In FIG. 4, the up-spin conduction electrons are denoted by reference character $e_1$, and the down-spin conduction electrons are denoted by reference character $e_2$.

The up-spin conduction electrons $e_1$ quite possibly move from the nonmagnetic conductive layer 29 to the nonmagnetic intermediate layer 53 through the second free magnetic layer 52 when the magnetization directions of the pinned magnetic layer 30 and the free magnetic layer 50 are made parallel to each other by the external magnetic field.

The up-spin conduction electrons $e_1$ move to the interface between the nonmagnetic intermediate layer 53 and the first free magnetic layer 52, are mirror-reflected by the first free magnetic layer 52 while maintaining the spin state, and again move in the nonmagnetic intermediate layer 53 and the second free magnetic layer 52.

In this way, the up-spin conduction electrons $e_1$ pass through the second free magnetic layer 52 and the nonmagnetic intermediate layer 53 twice to significantly extend the mean free path to $\lambda^+$.

On the other hand, the down-spin conduction electrons $e_2$ have the high probability that they are always scattered at the interface between the nonmagnetic conductive layer 29 and the free magnetic layer 50 (the second free magnetic layer 52), and are maintained in the state wherein the probability of movement to the free magnetic layer 50 remains low, and the mean free path ($\lambda^-$) remains shorter than the mean free path ($\lambda^+$) of the up-spin conduction electrons.

The mean free path ($\lambda^+$) of the up-spin conduction electrons $e_1$ becomes longer than the mean free path ($\lambda^-$) of the down-spin conduction electrons $e_2$ due to the action of the external magnetic field, increasing the difference ($\lambda^+ - \lambda^-$) between the paths to increase the rate of change in magnetoresistance of the laminate 1G.

Therefore, in the spin valve element 1 of this embodiment, the difference between the mean free path of the up-spin conduction electrons $e_1$ and the mean free path of the down-spin conduction electrons $e_2$ can be increased to significantly increase the rate of change in magnetoresistance.

The second free magnetic layer 52 is preferably formed to have a thickness slightly larger than the thickness of the first free magnetic layer 51.

Particularly, assuming that the thicknesses of the first and second free magnetic layers 51 and 52 are $t_1$ and $t_2$, the saturation magnetizations of the first and second free magnetic layers 51 and 52 are $M_1$ and $M_2$, and the magnetic thicknesses of the first and second free magnetic layers 51 and 52 are $M_1 \cdot t_1$ and $M_2 \cdot t_2$, respectively, the magnetic thicknesses preferably have the relation $M_2 \cdot t_2 > M_1 \cdot t_1$.

In this way, where the magnetic thickness of the second free magnetic layer 52 is larger than the magnetic thickness of the first free magnetic layer 51, the magnetization of the second free magnetic layer 52 is left in antiferromagnetic coupling between the first and the second free magnetic layers 51 and 52.

Therefore, as shown in FIG. 1, when the magnetization direction of the second free magnetic layer 52 is oriented in the $X_1$ direction by the bias layers 332, the magnetization direction of the first free magnetic layer 51 is oriented in the direction opposite to the $X_1$ direction to leave the magnetization of the second free magnetic layer 52. Therefore, the magnetization direction of the entire free magnetic layer 50 is oriented in the $X_1$ direction.

In this way, the first and second free magnetic layers 51 and 52 are antiferromagnetically coupled with each other so that the magnetization directions thereof are antiparallel to each other to form a synthetic ferrimagnetic state (synthetic ferrimagnetic free).

The magnetization direction of the free magnetic layer 50 put into the ferrimagnetic state can be rotated with a small external magnetic field according to the direction of the external magnetic field.

Since the magnetic thicknesses of the first and second free magnetic layers 51 and 52 have the relation $M_2 \cdot t_2 > M_1 \cdot t_1$, the spin flop magnetic field of the free magnetic layer 50 can be increased so that the free magnetic layer 50 can stably maintain the ferrimagnetic state.

The spin flop magnetic field represents the magnitude of an external magnetic field which loses the antiparallel state of the magnetization directions of two magnetic layers when applied to the two magnetic layers having antiparallel magnetization directions. Therefore, as the spin flop magnetic field of the free magnetic layer 50 increases, the ferrimagnetic state can be more stably maintained even in the external magnetic field.

The first free magnetic layer 51 comprises a ferromagnetic insulating film. Specifically, a ferromagnetic insulating oxide film or a ferromagnetic insulating nitride film can be used.

An example of the ferromagnetic insulating oxide film which constitutes the first free magnetic layer 51 comprises ferrite composed of Fe—O or M—Fe—O (wherein M is at least one element of Mn, Co, Ni, Ba, Sr, Y, Gd, Cu, and Zn). Particularly, Mn and Zn or Ni and Zn are preferably selected as element M.

The ferromagnetic insulating oxide film comprising ferrite is preferably represented by the composition formula $Fe_xM_yO_z$ wherein M is at least one element of Mn, Co, Ni, Ba, Sr, Y, Gd, Cu, and Zn, and the composition ratios x, y and z by atomic % satisfy $20 \leq x \leq 40$, $10 \leq y \leq 20$, and $40 \leq z \leq 70$, respectively.

The resistivity of the ferromagnetic insulating film comprising ferrite is preferably 10 $\mu\Omega \cdot m$ (1 $\Omega \cdot cm$) or more, and the saturation magnetic flux density thereof is 0.2 T or more.

Another example of the ferromagnetic insulating oxide which constitutes the first free magnetic layer 51 is a ferromagnetic insulating oxide film in which a fine crystal phase of bcc structure Fe having an average crystal grain diameter of 10 nm or less and an amorphous phase containing large amounts of element T or T' and O (wherein T represents at least one element of the rare earth elements, and T' represents at least one of Ti, Zr, Hf, V, Nb, Ta, and W) are mixed, and the ratio of the fine crystal phase of bcc structure Fe to the entire structure is 50% or less.

The ferromagnetic insulating oxide film is preferably represented by the composition formula below, in which a fine crystal phase of bcc structure Fe having an average crystal grain diameter of 10 nm or less and an amorphous phase containing large amounts of element T and O are mixed, and the ratio of the fine crystal phase of bcc structure Fe to the entire structure is 50% or less.

Namely, the ferromagnetic insulating oxide film is represented by the composition formula $Fe_aT_bO_c$ wherein T is at least one element of the rare earth elements (La, Ce, Pr, Nd, Pm, Sm, Eu, Gd, Tb, Dy, Ho, Er, Tm, Yb, and Lu), and the composition ratios a, b and c by atomic % satisfy $50 \leq a \leq 70$, $5 \leq b \leq 30$, $10 \leq c \leq 30$, and $a+b+c=100$.

The resistivity of the ferromagnetic insulating oxide film represented by the above composition formula can be set to about 4 to 10 $\mu\Omega \cdot m$ (400 to 1000 $\mu\Omega \cdot cm$).

Also the ferromagnetic insulating oxide film is preferably represented by the composition formula below, in which a fine crystal phase of bcc structure Fe having an average crystal grain diameter of 10 nm or less and an amorphous phase containing large amounts of element T and O are mixed, and the ratio of the fine crystal phase of bcc structure Fe to the entire structure is 50% or less.

Namely, the ferromagnetic insulating oxide film is represented by the composition formula $Fe_dT'_eO_f$ wherein T' is at least one element selected from the group consisting of Ti, Zr, He, V, Nb, Ta, and W, and the composition ratios d, e and f by atomic % satisfy $45 \leq d \leq 70$, $5 \leq e \leq 30$, $10 \leq f \leq 40$, and $d+e+f=100$.

The resistivity of the ferromagnetic insulating oxide film represented by the above composition formula can be set to 4 to $2.0 \times 10^3$ $\mu\Omega \cdot m$ (400 to $2.0 \times 10^5$ $\mu\Omega \cdot cm$).

In the ferromagnetic insulating oxide film, Fe is the main component and carries magnetism. Although the Fe amount is preferably as large as possible in order to obtain a high saturation magnetic flux density, the Fe amount of 70 atomic % or more decreases the resistivity. On the other hand, the Fe amount of less than 45 atomic % can increase the resistivity, but decreases the saturation magnetic flux density.

The rare earth element T (i.e., at least one of Sc and Y in the 3A group in the periodic table, and the lanthanoids such as La, Ce, Pr, Nd, Pm, Sm, Eu, Gd, Tb, Dy, Ho, Er, Tm, Yb, and Lu), or element T' (at least one of Ti, Zr, Hf, V, Nb, Ta, and W in the 4A group, 5A group and 6A group) is necessary for obtaining soft magnetic properties. Such an element easily combines with oxygen to form an oxide. The content of the oxide can be controlled to increase the resistivity.

Also Hf possibly functions to suppress magnetostriction.

Furthermore, the structure of the ferromagnetic insulating oxide film may entirely comprise the amorphous phase, or partly comprise the fine crystal phase of bcc structure Fe. The ferromagnetic insulating oxide film comprising the fine crystal phase having a large crystal grain diameter at a high ratio has relatively low resistivity, while the ferromagnetic insulating oxide film having a structure mostly-comprising the amorphous phase containing a large amount of oxygen has high resistivity.

An example of the ferromagnetic insulating nitride film which constitutes the first free magnetic layer 51 is a ferromagnetic insulating nitride film comprising a fine crystal phase mainly composed of bcc structure Fe having an average crystal grain diameter of 10 nm or less, and an amorphous phase mainly composed of a compound of N and at least one element D selected from the group consisting of La, Ce, Pr, Nd, Pm, Sm, Eu, Gd, Tb, Dy, Ho, Er, Tm, Yb, Lu, Ti, Zr, Hf. V, Nb, Ta, and W, wherein the ratio of the amorphous phase is at least 50% or more of the structure.

The ferromagnetic insulating nitride film is represented by the composition formula $Fe_pD_qN_r$ wherein D is at least one element selected from the group consisting of La, Ce, Pr, Nd, Pm, Sm, Eu, Gd, Tb, Dy, Ho, Er, Tm, Yb, Lu, Ti, Zr, Hf, V, Nb, Ta, and W, and the composition ratios p, q and r by atomic % satisfy $60 \leq d \leq 80$, $10 \leq q \leq 15$, and $5 \leq r \leq 30$.

The resistivity of the ferromagnetic insulating nitride film represented by the above composition formula can be set to about 4 to $2.0 \times 10^3$ $\mu\Omega \cdot m$.

In the above composition, the Fe content of 60 atomic % or less is undesirable because the saturation magnetic flux density is significantly decreased. The content of element D of 10 atomic % or less is undesirable because the amorphous phase cannot be obtained, and the N (nitrogen) content of 5 atomic % or less is undesirable because the resistivity and permeability are decreased.

The ferromagnetic insulating nitride film preferably has a structure in which the ratio of the amorphous phase is 50% or more, and fine crystal grains of body-centered structure Fe having a grain diameter of 10 nm or less and a nitride of element M or Fe are precipitated in the amorphous phase. The precipitation of Fe fine crystal grains improves the saturation magnetic flux density, and the presence of a large amount of amorphous phase increases the resistivity.

The ratio of the Fe fine crystal grains to the structure is preferably 50% or less. With a crystal grain ratio of over 50%, the permeability in the high frequency region deteriorates. The crystal grains precipitated in the structure have a grain diameter of several nm to about 30 nm, and an average grain diameter of 10 nm or less. By precipitating such fine crystal grains, the saturation magnetic flux density can be increased. The amorphous phase possibly contributes to an increase in resistivity, and thus the presence of the amorphous phase increases the resistivity.

The antiferromagnetic layer 21 is preferably made of a PtMn alloy. The PtMn alloy has excellent corrosion resistance, high blocking temperature, and high exchange coupling magnetic field, as compared with a NiMn alloy and FeMn alloy conventionally used for antiferromagnetic layers.

The antiferromagnetic layer 21 may be made of an alloy represented by X—Mn (wherein X represents one element selected from Pt, Pd, Ru, Ir, Rh, and Os), or X—Pt—Mn (wherein X' represents ate least one element selected from Pd, Cr, Ni, Ru, Ir, Rh, Os, Au, and Ag).

In the PtMn alloy or the alloy represented by the formula X—Mn, the amount of Pt or X is preferably in the range of 37 to 63 atomic %, more preferably in the range of 44 to 57 atomic %.

In the alloy represented by the formula X'—Pt—Mn, the amount of X' is preferably in the range of 37 to 63 atomic %, more preferably in the range of 44 to 57 atomic %.

By heat-treating an alloy having a composition in the above appropriate range for the antiferromagnetic layer 21 in a magnetic field, the antiferromagnetic layer 21 producing a high exchange coupling magnetic field can be obtained. Particularly, by using the PtMn alloy, the excellent antiferromagnetic layer 21 having an exchange coupling magnetic field of over $6.4 \times 10^4$ A/m, and a high block temperature of 653 K (380° C.) at which the exchange coupling magnetic field is lost can be obtained.

The pinned magnetic layer 30 comprises the nonmagnetic layer 33, and the first and second pinned magnetic layers 31 and 32 with the nonmagnetic layer 33 provided therebetween. The first pinned magnetic layer 31 is provided in contact with the antiferromagnetic layer 21 on the antiferromagnetic layer 21 side of the nonmagnetic layer 33, and the second pinned magnetic layer 32 is provided in contact with the nonmagnetic conductive layer 29 on the nonmagnetic conductive layer 29 side of the nonmagnetic layer 33.

An exchange coupling magnetic field (exchange anisotropic magnetic field) occurs in the interface between the first pinned magnetic layer 31 and the antiferromagnetic layer 21 to pin the magnetization direction of the first pinned magnetic layer 31 in the direction opposite to the Y direction.

The thickness of the first pinned magnetic layer 31 is preferably slightly different from the thickness of the second pinned magnetic layer 32. In FIG. 2, the thickness of the second pinned magnetic layer 32 is larger than that of the first pinned magnetic layer 31.

The magnetization direction of the first pinned magnetic layer 31 is pinned in the direction opposite to the Y direction by the exchange coupling magnetic field with the antiferromagnetic layer 21, and the magnetization direction of the second pinned magnetic layer 32 is pinned in the Y direction by antiferromagnetic coupling with the first pinned magnetic layer 31.

Since the magnetization directions of the first and second pinned magnetic layers 31 and 32 are antiparallel to each other, the magnetic moments of the first and second pinned magnetic layers 31 and 32 are canceled by each other. However, the thickness of the second pinned magnetic layer 32 is slightly larger, and thus the spontaneous magnetization of the pinned magnetic layer 30 is slightly left to form the ferrimagnetic state. The spontaneous magnetization is further amplified by the exchange coupling magnetic field with the antiferromagnetic layer 21 to pin the magnetization direction of the entire pinned magnetic layer 30 in the Y direction.

As a result, the magnetization direction of the free magnetic layer 50 crosses the magnetization direction of the pinned magnetic layer 30.

Both the first and second pinned magnetic layers 31 and 32 are made of a ferromagnetic material, for example, such as a NiFe alloy, Co, a CoNiFe alloy, a CoFe alloy, a CoNi alloy, or the like, preferably Co. The first and second pinned-magnetic layers 31 and 32 are preferably made of the same material.

The nonmagnetic layer 33 is preferably made of a nonmagnetic material, for example, one of Ru, Rh, Ir, Cr, Re, and Cu, or an alloy thereof, more preferably Ru.

The nonmagnetic conductive layer 29 is a layer for preventing magnetic coupling between the pinned magnetic layer 30 and the free magnetic layer 50, in which the sensing current mainly flows. The nonmagnetic conductive layer 29 is preferably made of a nonmagnetic material having conductivity, for example, Cu, Cr, Au, Ag or the like, more preferably Cu.

The spin valve element 1 is manufactured, for example, as described below.

Figure 5:
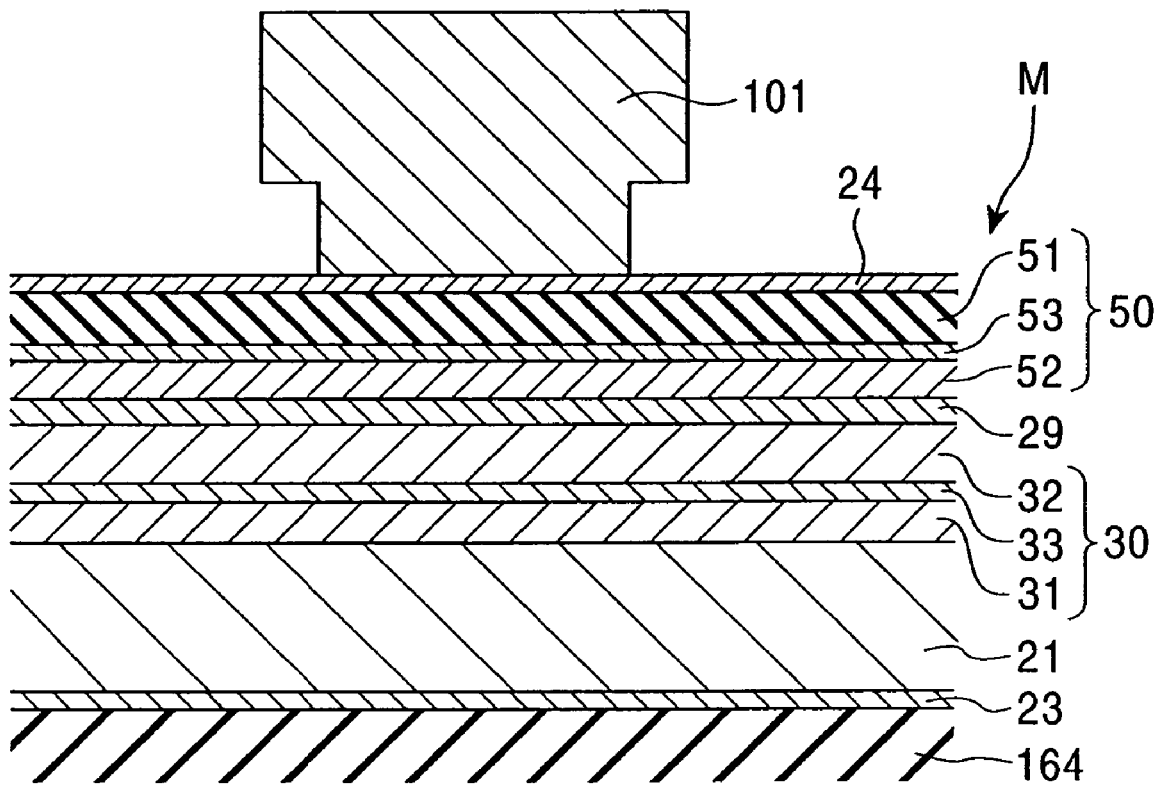
FIG. 5 is a schematic drawing illustrating a step of the method of manufacturing the spin valve element of the first embodiment of the present invention.

First, as shown in FIG. 5, the underlying layer 23, the antiferromagnetic layer 21, the pinned magnetic layer 30 (the first pinned magnetic layer 31, the nonmagnetic layer 33, and the second pinned magnetic layer 32), the nonmagnetic conductive layer 29, the free magnetic layer 50 (the second free magnetic layer 52, the nonmagnetic intermediate layer 53, and the first free magnetic layer 51), and the capping layer 24 are successively deposited by means of sputtering, vapor deposition, or the like to form a layered film M. Then, a liftoff resist 101 is formed on the layered film M.

In forming a ferromagnetic insulating oxide film which constitutes the first free magnetic layer 51, an oxygen atmosphere is preferably formed as the deposition atmosphere, while in forming a ferromagnetic insulating nitride film, a nitrogen atmosphere is preferably formed as the deposition atmosphere.

Figure 6:
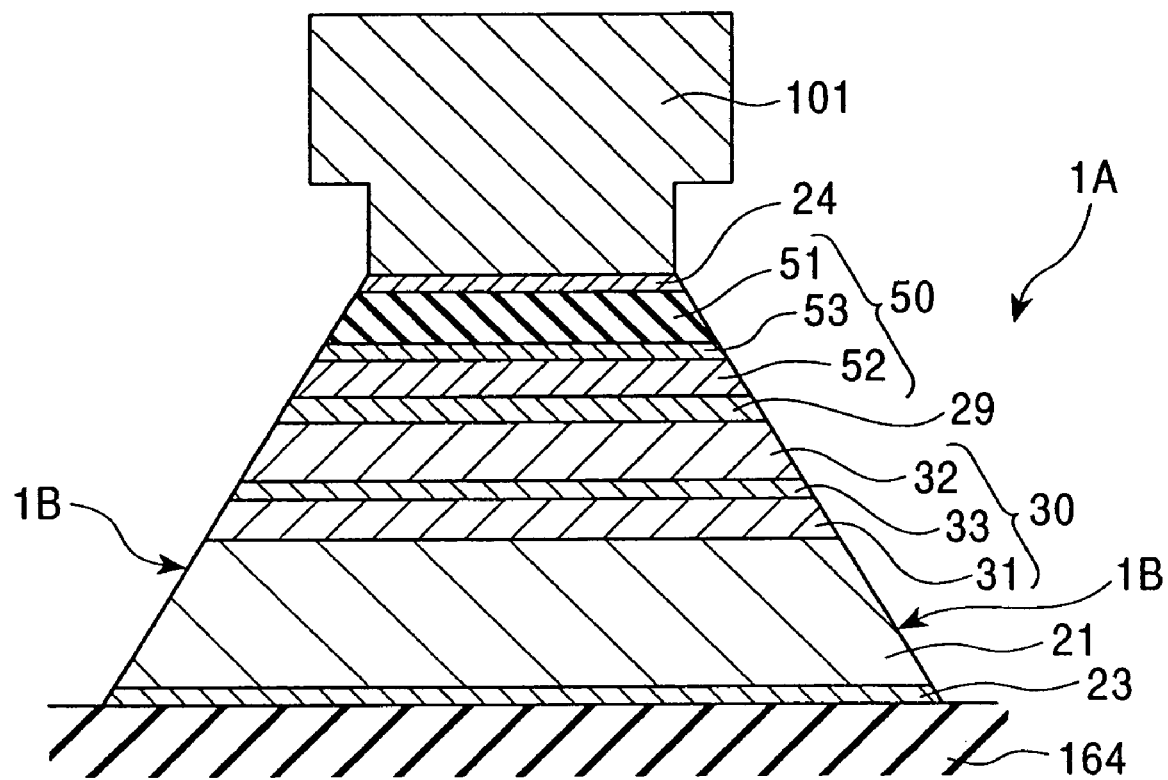
FIG. 6 is a schematic drawing illustrating a step of the method of manufacturing the spin valve element of the first embodiment of the present invention.

Next, as shown in FIG. 6, the portions not covered with the liftoff resist 101 are removed by ion milling to form the laminate 1A having an isosceles trapezoidal shape having the inclined side surfaces 1B.

Figure 7:
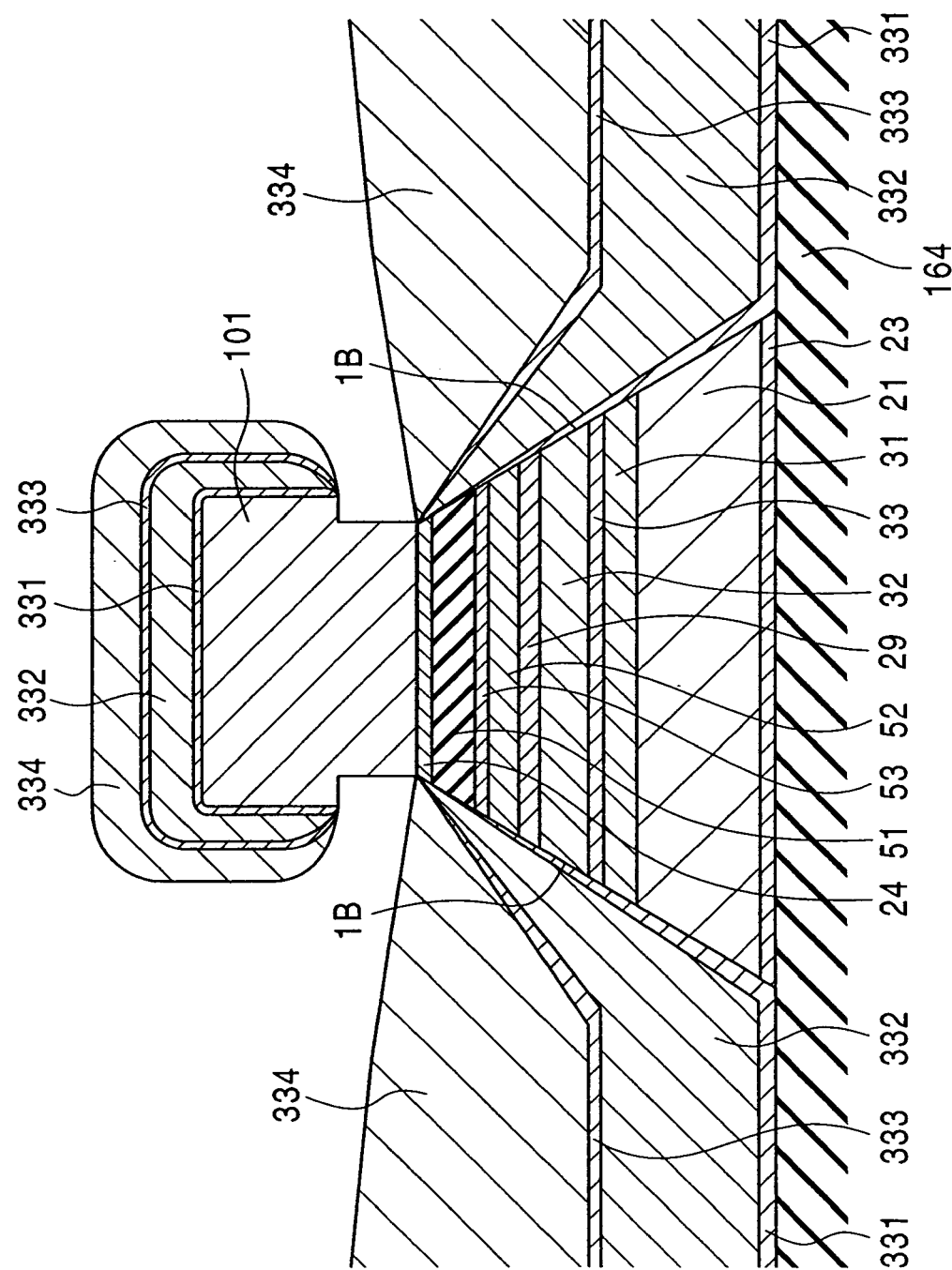
FIG. 7 is a schematic drawing illustrating a step of the method of manufacturing the spin valve element of the first embodiment of the present invention.

Next, as shown in FIG. 7, the bias underlying layers 331, the bias layers 332, the intermediate layers 333 and the electrode layers 334 are successively laminated on the liftoff resist 101 and both sides of the laminate 1A.

Figure 8:
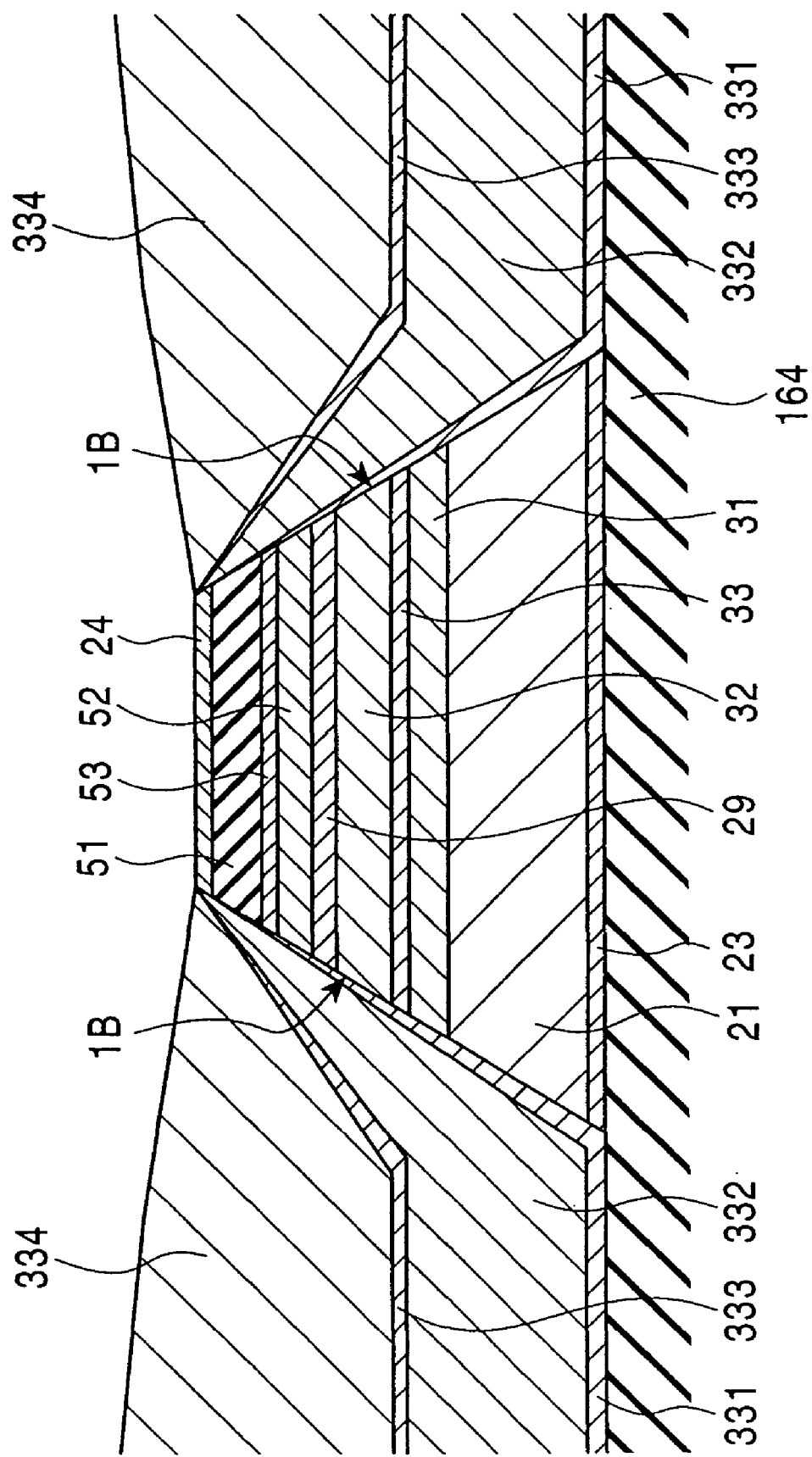
FIG. 8 is a schematic drawing illustrating a step of the method of manufacturing the spin valve element of the first embodiment of the present invention.

Finally, as shown in FIG. 8, the liftoff resist 101 is removed to obtain the spin valve element 1.

In the spin valve element 1, the first free magnetic layer 51 comprises the ferromagnetic insulating film, and thus the resistivity of the first free magnetic layer 51 is higher than the second free magnetic layer 52 and the nonmagnetic intermediate layer 53, thereby suppressing a shunt of the sensing current. Therefore, the shunt loss can be decreased to increase the rate of change in magnetoresistance.

Furthermore, the potential barrier is formed at the interface between the first free magnetic layer 51 comprising the ferromagnetic insulating film, and the nonmagnetic intermediate layer 53 comprising a nonmagnetic metal or the like so that the up-spin conduction electrons are mirror-reflected by the potential barrier while maintaining the spin direction. Therefore, the mean free path of the up-spin electrons can be extended to increase the difference between the mean free paths of the up-spin and down-spin conduction electrons, increasing the rate of change in magnetoresistance of the spin valve element 1.

Since the first and second free magnetic layers 51 and 52 which constitute the free magnetic layer 50 are brought into the ferrimagnetic state, the magnetization direction of the free magnetic layer 50 can be changed with a small external magnetic field, thereby increasing the sensitivity of the spin valve element 1 to the external magnetic field.

Therefore, in the spin valve element 1, the rate of change in magnetoresistance can be significantly increased due to a reduction in shunt loss and the effect of mirror-reflecting the up-spin conduction electrons, and the particular effect of increasing the sensitivity to the external magnetic field by providing the free magnetic layer in the ferrimagnetic state can be obtained.

Second Embodiment

A second embodiment of the present invention will be described with reference to the drawings.

Figure 9:
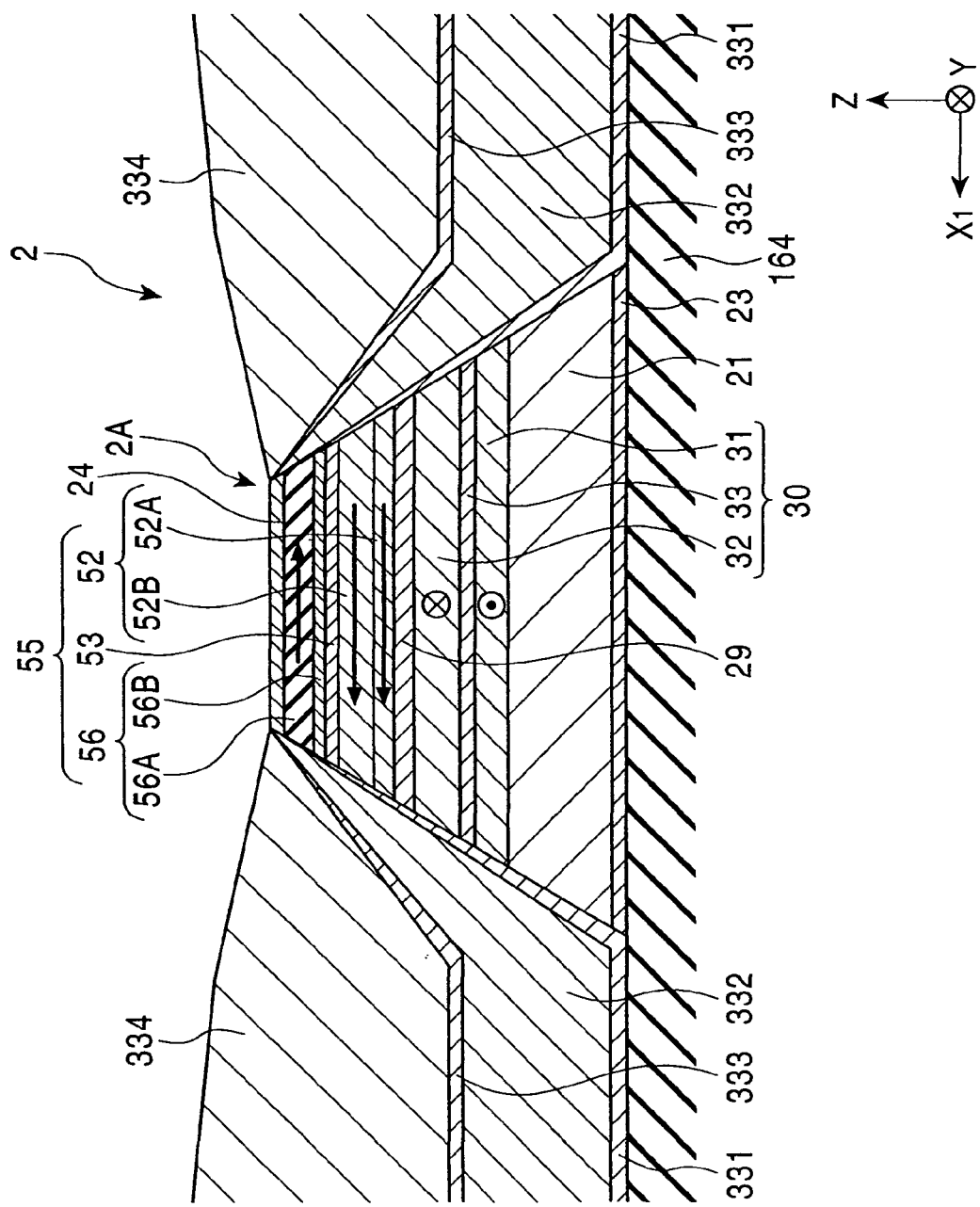
FIG. 9 is a schematic sectional view of a spin valve element according to a second embodiment of the present invention, as viewed from the magnetic recording medium side.

FIG. 9 is a schematic sectional view of a spin valve element 2 according to the second embodiment of the present invention, as viewed from the magnetic recording medium side.

Like the spin valve element 1 of the first embodiment, the spin valve element 2 shown in FIG. 9 is a bottom-type single spin valve element in which an antiferromagnetic layer 21, a pinned magnetic layer 30, a nonmagnetic conductive layer 29, and a free magnetic layer 55 are laminated in turn.

In FIG. 9, reference numeral 164 denotes a lower gap layer, and reference numeral 23 denotes an underlying layer laminated on the lower gap layer 164. The antiferromagnetic layer 21, the pinned magnetic layer 30, the nonmagnetic conductive layer 29, the free magnetic layer 55, and a capping layer 24 are laminated in turn on the underlying layer 23.

In this way, the layers from the underlying layer 23 to the capping layer 24 are laminated in turn to form a laminate 2A having a substantially trapezoidal sectional shape having a width corresponding to the track width.

The spin valve element 2 is different from the spin valve element 1 in that the first free magnetic layer 56 comprises a lamination of a first ferromagnetic insulating film 56A and a first ferromagnetic conductive film 56B.

The antiferromagnetic layer 21, the nonmagnetic conductive layer 29, the pinned magnetic layer 30, the bias underlying layers 331, the bias layers 332, the intermediate layers 333, and the electrode layers 334 shown in FIG. 9 have the same constructions and are made of the same materials as the antiferromagnetic layer, the nonmagnetic conductive layer, the pinned magnetic layer, the bias underlying layers, the bias layers, the intermediate layers, and the electrode layers of the first embodiment. Therefore, description of these layers is omitted.

The free magnetic layer 55 comprises a nonmagnetic intermediate layer 53, and first and second free magnetic layers 56 and 52 antiferromagnetically coupled with each other with the nonmagnetic intermediate layer 53 provided therebetween to bring both free magnetic layers 56 and 52 into the ferrimagnetic state.

Namely, the first free magnetic layer 56 comprises a lamination of the first ferromagnetic insulating film 56A and the firs ferromagnetic conductive film 56B, the first ferromagnetic conductive film 56B being provided in contact with the nonmagnetic intermediate layer 53. In addition, the first ferromagnetic insulating film 56A and the first ferromagnetic conductive film 56B are ferromagnetically coupled with each other to bring both films in a ferromagnetic state.

The thickness of the first ferromagnetic insulating film 56A is in the range of 1 nm to 4 nm, and the thickness s of the first ferromagnetic conductive film 56B is in the range of 0 nm<s≦3.0 nm.

The thickness of the second free magnetic layer 52 is in the range of 2.5 nm to 4.5 nm, and is larger than the first free magnetic layer 56.

The first ferromagnetic insulating film 56A is equivalent to the ferromagnetic insulating film which constitutes the first free magnetic layer of the first embodiment, and comprises an insulating film having a resistivity of about 4 to $2.0 \times 10^3$ μΩ·m.

The first ferromagnetic conductive film 56B comprises a ferromagnetic film having a resistivity of about 0.3 μΩ·m, and made of, for example, any one of Co, a CoFe alloy, a NiFe alloy, a CoNi alloy, and a CoNiFe alloy.

The nonmagnetic intermediate layer 53 and the second free magnetic layer 52 have the same constructions and are made of the same materials as the nonmagnetic intermediate layer and the second free magnetic layer of the first embodiment.

Therefore, the first ferromagnetic insulating film 56A which constitutes the first free magnetic layer 56 exhibits higher resistivity than the second free magnetic layer 52 comprising ferromagnetic conductive films (the anti-diffusion film 52A and the ferromagnetic film 52B), and the nonmagnetic intermediate film 53, and thus the sensing current less flows in the first free magnetic layer 56.

Therefore, the sensing current flowing through the laminate 2A mainly flows through the nonmagnetic conductive layer 29, the pinned magnetic layer 30 and the second free magnetic layer 52, thereby suppressing a shunt of the sensing current.

The sensing current is caused to flow through the periphery of the second free magnetic layer 52 and the nonmagnetic conductive layer 29 to increase the number of conduction electrons contributing to the giant magnetoresistance, thereby increasing the rate of change in magnetoresistance.

Since the first ferromagnetic insulating film 56A and the first ferromagnetic conductive film 56B are ferromagnetically coupled with each other to bring both films in the ferromagnetic state, the magnetization direction of the entire first free magnetic layer 56 can be oriented in one direction. Namely, in FIG. 9, when the magnetization direction of the second free magnetic layer 52 is oriented in the $X_1$ direction by the bias layers 332, the magnetization direction of the entire first free magnetic layer 56 is oriented in the direction opposite to the $X_1$ direction. The magnetization of the second free magnetic layer 52 remains to orient the magnetization direction of the entire free magnetic layer 56 in the $X_1$ direction.

Therefore, the first and second free magnetic layers 56 and 52 are antiferromagnetically coupled with each other so that the magnetization directions are antiparallel to each other to bring both layers in a synthetic ferrimagnetic state (synthetic ferrimagnetic free).

Even with a small external magnetic field applied, the magnetization direction of the free magnetic layer 55 put into the ferrimagnetic state can thus be rotated according to the direction of the external magnetic field.

Furthermore, since the first ferromagnetic conductive film 56B is provided in contact with the nonmagnetic intermediate layer 53, the first and second free magnetic layers 56 and 52 can be securely antiferromagnetically coupled with each other to increase the sensitivity to the external magnetic field.

In this case, by setting the thickness s of the first ferromagnetic conductive film 56B in the range of 0 nm<s≦3.0 nm, the first and second free magnetic layers 56 and 52 can be securely antiferromagnetically coupled with each other. With the first ferromagnetic conductive film 56B having a thickness of over 3.0 nm, the rate of change in resistance undesirably decreases, while with the first ferromagnetic conductive film 56B having at thickness of 0 nm, antiferromagnetic coupling force between the first and second free magnetic layer 56 and 52 undesirably weakens.

In addition, a potential barrier is formed at the interface between the first free ferromagnetic insulating film 56A and the first ferromagnetic conductive film 56B due to a great difference in resistivity between both films. Of the conduction electrons moving in the nonmagnetic conductive layer 29, up-spin conduction electrons are mirror-reflected by the potential barrier while maintaining the spin direction.

The up-spin conduction electrons are mirror-reflected at the interface between the first ferromagnetic insulating film 56A and the first ferromagnetic conductive film 56B to extend the mean free path. Like in the first embodiment, therefore, the difference between the mean free paths of the up-spin conduction electrons and the down-spin conduction electrons can be increased to increase the rate of change in magnetoresistance of the spin valve element 2.

This is described with reference to a schematic drawing of FIG. 10.

Figure 10:
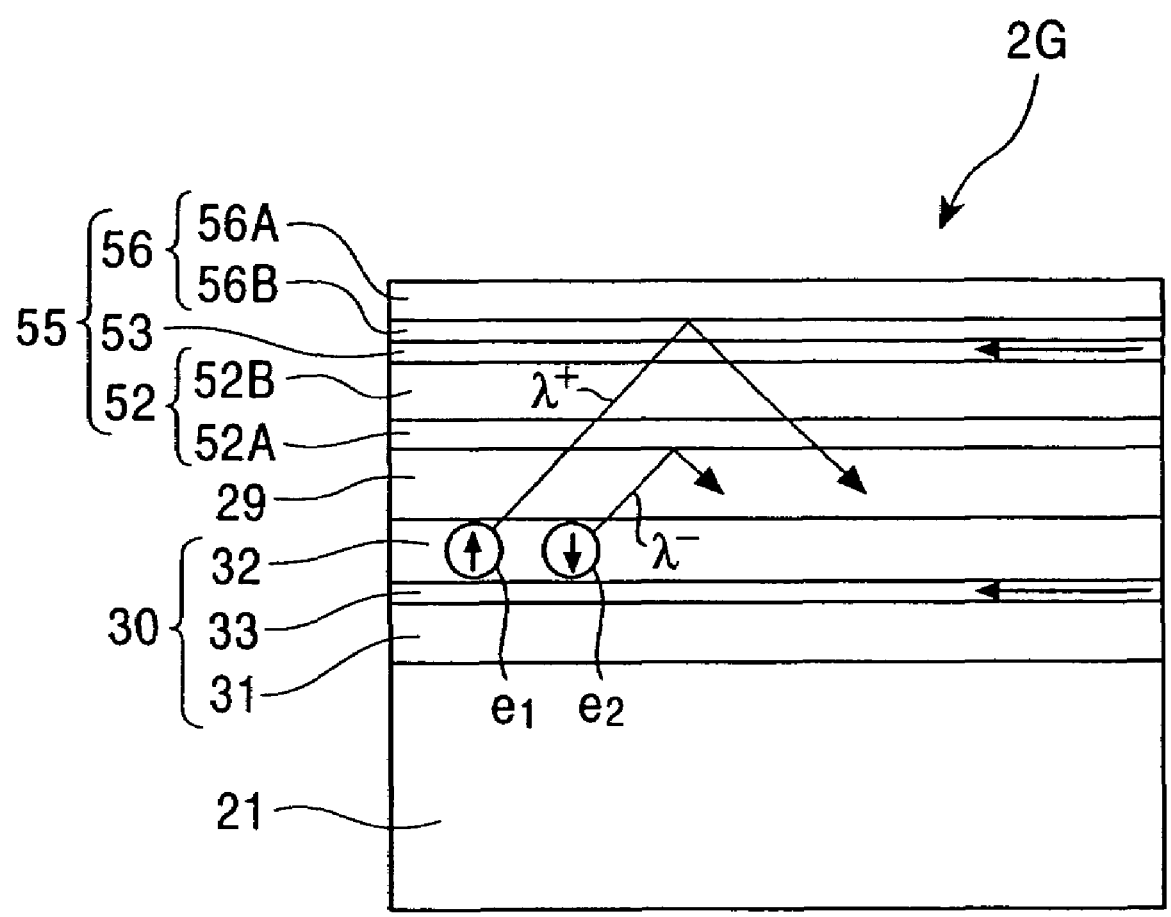
FIG. 10 is a schematic drawing illustrating the operation of the spin valve element shown in FIG. 9.

FIG. 10 shows a laminate 2G in which the antiferromagnetic layer 21, the pinned magnetic layer 30 (the first pinned magnetic layer 31, the nonmagnetic layer 33, the second pinned magnetic layer 32), the nonmagnetic conductive layer 29, the free magnetic layer 55 (the second free magnetic layer 52 (the anti-diffusion layer 52A, the ferromagnetic layer 52B), the nonmagnetic intermediate layer 53, the first free magnetic layer 56 (the first ferromagnetic conductive film 56B and the first ferromagnetic insulating film 56A)) are laminated in turn.

In FIG. 10, the magnetization direction of the free magnetic layer 55 is oriented in the leftward direction in FIG. 10 by the external magnetic field, and the magnetization direction of the pinned magnetic layer 30 is pinned in the leftward direction in FIG. 10 by an exchange coupling magnetic field with the antiferromagnetic layer 21.

When the sensing current is passed through the laminate 2G shown in FIG. 10, the conduction electrons mainly move in the nonmagnetic conductive layer 29 having low electric resistance. In FIG. 10, the up-spin conduction electrons are denoted by reference character $e_1$, and the down-spin conduction electrons are denoted by reference character $e_2$.

The up-spin conduction electrons $e_1$ quite possibly move from the nonmagnetic conductive layer 29 to the first free magnetic layer 56 through the second free magnetic layer 52 and the nonmagnetic intermediate layer 53 when the magnetization directions of the pinned magnetic layer 30 and the free magnetic layer 55 are made parallel by the external magnetic field.

The up-spin conduction electrons $e_1$ move to the interface between the first ferromagnetic conductive film 56B and the first ferromagnetic insulating film 56A, are mirror-reflected by the first ferromagnetic insulating film 56A which forms the potential barrier while maintaining the spin state, and again move in the nonmagnetic intermediate layer 53 and the second free magnetic layer 52.

In this way, the up-spin conduction electrons $e_1$ pass through the second free magnetic layer 52, the nonmagnetic intermediate layer 53 and the first ferromagnetic conductive film 56B twice to significantly extend the mean free path to $\lambda^+$.

On the other hand, the down-spin conduction electrons $e_2$ have the high probability that they are always scattered at the interface between the nonmagnetic conductive layer 29 and the second free magnetic layer 52, and are maintained in the state wherein the probability of movement to the free magnetic layer 55 remains low, and the mean free path ($\lambda^-$) remains shorter than the mean free path ($\lambda^+$) of the up-spin conduction electrons.

The mean free path ($\lambda^+$) of the up-spin conduction electrons $e_1$ becomes longer than the mean free path ($\lambda^-$) of the down-spin conduction electrons $e_2$ due to the action of the external magnetic field, increasing the difference ($\lambda^+-\lambda^-$) between the paths to increase the rate of change in magnetoresistance of the laminate 2G.

Therefore, in the spin valve element 2 of this embodiment, the difference between the mean free path of the up-spin conduction electrons $e_1$ and the mean free path of the down-spin conduction electrons $e_2$ can be increased to significantly increase the rate of change in magnetoresistance of the spin valve element 2.

The spin valve element 2 is manufactured by substantially the same method as the spin valve element 1 of the first embodiment except that the first free magnetic layer 56 comprises the first ferromagnetic insulating film 56A and the first ferromagnetic conductive film 56B.

The spin valve element 2 exhibits not only substantially the same effect as the spin valve element 1 of the first embodiment, but also the following effect.

In the spin valve element 2, the first ferromagnetic conductive film 56B is provided between the first ferromagnetic insulating film 56A and the nonmagnetic intermediate layer 53, and thus the first and second free magnetic layers 56 and 52 can be securely antiferromagnetically coupled with each other to bring both layers into the stable ferrimagnetic state, thereby increasing the sensitivity to the external magnetic field.

Third Embodiment

A third embodiment of the present invention will be described with reference to the drawings.

Figure 11:
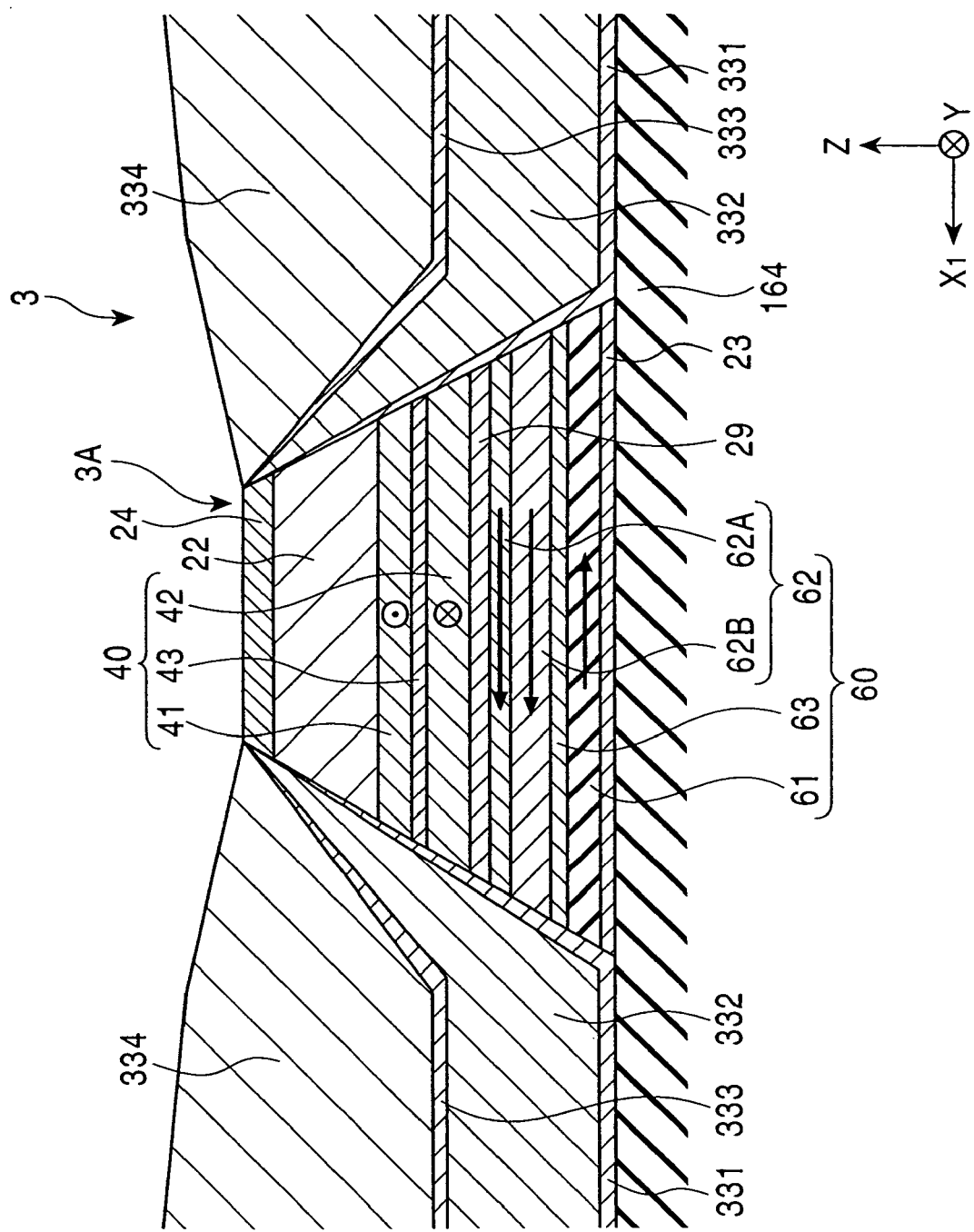
FIG. 11 is a schematic sectional view of a spin valve element according to a third embodiment of the present invention, as viewed from the magnetic recording medium side.

FIG. 11 is a schematic sectional view of a spin valve element 3 according to the third embodiment of the present invention, as viewed from the magnetic recording medium side.

Like the spin valve element 1 of the first embodiment, the spin valve element 3 shown in FIG. 11 is provided on a thin film magnetic head h, to constitute a floating magnetic head.

The spin valve element 3 is a top-type single spin valve element in which a free magnetic layer 60, a nonmagnetic conductive layer 29, a pinned magnetic layer 40, and an antiferromagnetic layer 22 are laminated in turn.

In FIG. 11, reference numeral 164 denotes a lower gap layer, and reference numeral 23 denotes an underlying layer. The free magnetic layer 60, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 3A having a substantially trapezoidal sectional shape having a width corresponding to the track width.

The antiferromagnetic layer 22, the nonmagnetic conductive layer 29, the pinned magnetic layer 40 (a nonmagnetic layer 43 and first and second pinned magnetic layers 41 and 42), the bias underlying layers 331, the bias layers 332, the intermediate layers 333, and the electrode layers 334 shown in FIG. 11 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the first embodiment. Therefore, description of these layers is omitted.

As shown in FIG. 11, the free magnetic layer 60 comprises a nonmagnetic intermediate layer 63, and first and second free magnetic layers 61 and 62 with the nonmagnetic intermediate layer 63 provided therebetween.

The first free magnetic layer 61 is provided in contact with the underlying layer 23 on the side of the nonmagnetic intermediate layer 63 opposite to the nonmagnetic conductive layer side, while the second free magnetic layer 62 is provided in contact with the nonmagnetic intermediate layer 29 on the nonmagnetic conductive layer 29 side of the nonmagnetic intermediate layer 63.

In FIG. 11, the magnetization direction of the second free magnetic layer 62 is oriented in the $X_1$ direction by the bias layers 332, and thus the magnetization direction of the first free magnetic layer 61 is oriented in the direction opposite to the $X_1$ direction. The magnetization of the second free magnetic layer 62 remains to orient the magnetization direction of the entire free magnetic layer 60 in the $X_1$ direction.

In this way, the first and second free magnetic layers 61 and 62 are antiferromagnetically coupled with each other so that the magnetization directions are antiparallel to each other to bring both layers into the synthetic ferrimagnetic state (synthetic ferrimagnetic free).

Even with a small external magnetic field applied, the magnetization direction of the free magnetic layer 60 put into the ferrimagnetic state can be rotated according to the direction of the external magnetic field.

The first free magnetic layer 61 comprises a ferromagnetic insulating film made of the same material as the first free magnetic layer of the first embodiment, which is ferromagnetic and has high resistivity. The thickness of the first free magnetic layer 61 is preferably in the range of 1 to 4 nm.

The nonmagnetic intermediate layer 63 is made of the same material as the nonmagnetic intermediate layer of the first embodiment.

The second free magnetic layer 62 comprises an anti-diffusion film 62A and a ferromagnetic film 62B which are made of the same materials as the anti-diffusion film and the ferromagnetic film of the second free magnetic layer of the first embodiment. The second free magnetic layer 62 may comprise a single layer of a ferromagnetic conductive film.

The first free magnetic layer 61 exhibits higher resistivity than the second free magnetic layer 62 comprising ferromagnetic conductive films (the anti-diffusion film 62A and the ferromagnetic film 62B), and the nonmagnetic intermediate film 63, and thus the sensing current less flows in the first free magnetic layer 61.

Therefore, the sensing current flowing through the laminate 3A mainly flows through the nonmagnetic conductive layer 29, the pinned magnetic layer 40 and the second free magnetic layer 62, thereby suppressing a shunt of the sensing current.

The sensing current is caused to flow through the periphery of the second free magnetic layer 62 and the nonmagnetic conductive layer 29 to increase the number of conduction electrons contributing to the giant magnetoresistance, thereby increasing the rate of change in magnetoresistance.

In addition, a potential barrier is formed at the interface between the first free magnetic layer 61 and the nonmagnetic intermediate layer 63 due to a great difference in resistivity between both layers. Of the conduction electrons moving in the nonmagnetic conductive layer 29, up-spin conduction electrons are mirror-reflected by the potential barrier while maintaining the spin direction.

The up-spin conduction electrons are mirror-reflected at the interface between the first free magnetic layer 61 and the nonmagnetic intermediate layer 63 to extend the mean free path. Like in the first embodiment, therefore, the difference between the mean free paths of the up-spin conduction electrons and the down-spin conduction electrons can be increased to increase the rate of change in magnetoresistance of the spin valve element 3.

The antiferromagnetic layer 22 is equivalent to the antiferromagnetic layer of the first embodiment except that the composition ratio is slightly different from the first embodiment.

Namely, the antiferromagnetic layer 22 is made of a PtMn alloy, or an alloy represented by X—Mn (wherein X represents one element selected from Pt, Pd, Ru, Ir, Rh, and Os), or X—Pt—Mn (wherein X' represents ate least one element selected from Pd, Cr, Ni, Ru, Ir, Rh, Os, Au, and Ag).

In the PtMn alloy or the alloy represented by the formula X—Mn, the amount of Pt or X is preferably in the range of 37 to 63 atomic %, more preferably in the range of 47 to 57 atomic %. In the alloy represented by the formula X'—Pt—Mn, the amount of X' is preferably in the range of 37 to 63 atomic %, more preferably in the range of 47 to 57 atomic %.

The spin valve element 3 is manufactured by substantially the same method as the spin valve element 1 of the first embodiment except that the underlying layer 23, the free magnetic layer 60, the nonmagnetic conductive layer 29, the pinned magnetic layer 40, the antiferromagnetic layer 22, and the capping layer 24 are laminated in turn to form a multilayer film.

The spin valve element 3 exhibits substantially the same effect as the spin valve element 1 of the first embodiment.

Fourth Embodiment

A fourth embodiment of the present invention will be described with reference to the drawings.

Figure 12:
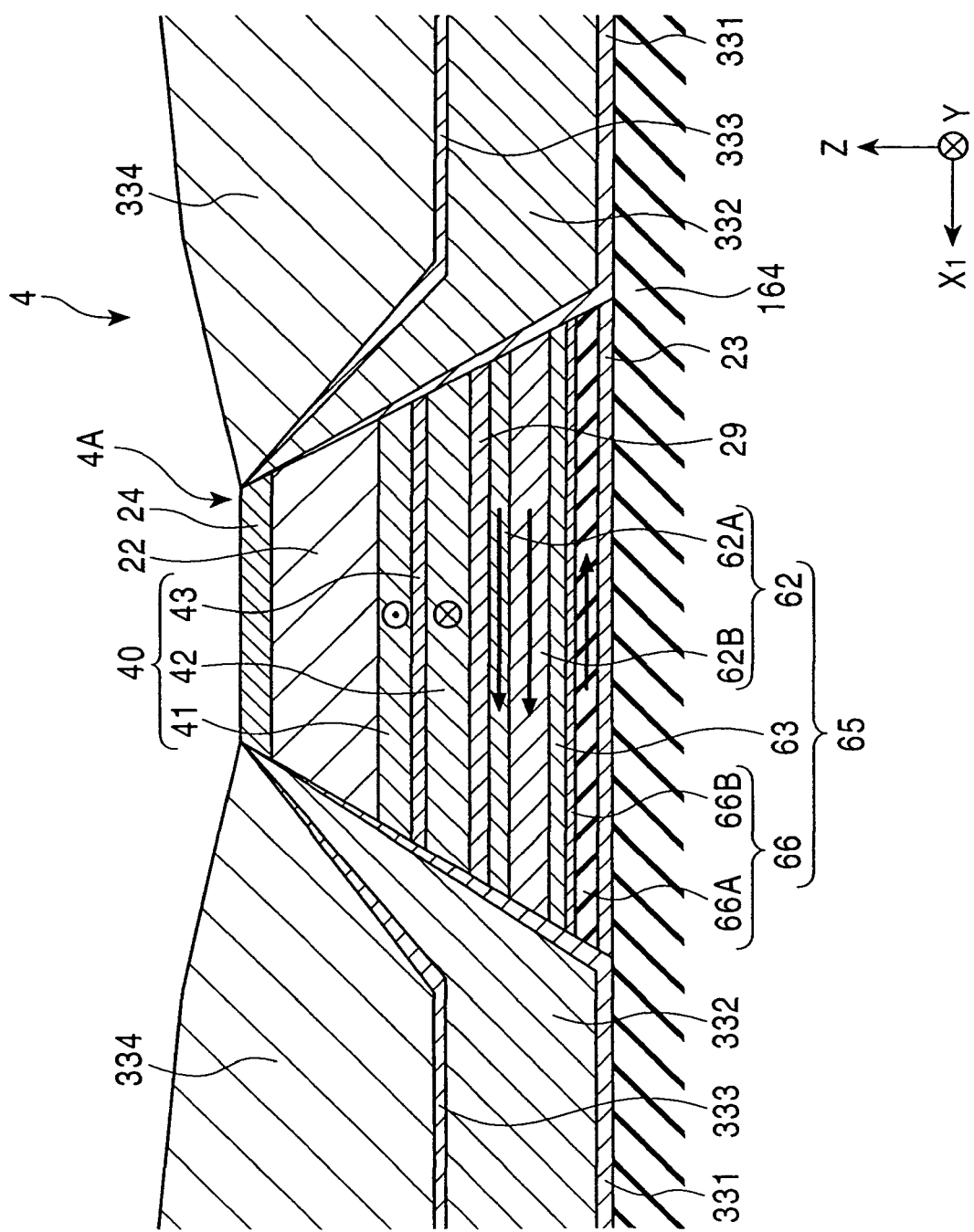
FIG. 12 is a schematic sectional view of a spin valve element according to a fourth embodiment of the present invention, as viewed from the magnetic recording medium side.

FIG. 12 is a schematic sectional view of a spin valve element 4 according to the fourth embodiment of the present invention, as viewed from the magnetic recording medium side.

The spin valve element 4 is a top-type single spin valve element in which a free magnetic layer 65, a nonmagnetic conductive layer 29, a pinned magnetic layer 40, and an antiferromagnetic layer 22 are laminated in turn.

In FIG. 11, reference numeral 164 denotes a lower gap layer, and reference numeral 23 denotes an underlying layer. The free magnetic layer 65, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 4A having a substantially trapezoidal sectional shape having a width corresponding to the track width.

The antiferromagnetic layer 22, the nonmagnetic conductive layer 29, the pinned magnetic layer 40 (a nonmagnetic layer 43 and first and second pinned magnetic layers 41 and 42), the bias underlying layers 331, the bias layers 332, the intermediate layers 333, and the electrode layers 334 shown in FIG. 12 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the first embodiment. Therefore, description of these layers is omitted.

The free magnetic layer 65 comprises a nonmagnetic intermediate layer 63, and first and second free magnetic layers 66 and 62 antiferromagnetically coupled with each other with the nonmagnetic intermediate layer 63 provided therebetween to bring both layers into a ferrimagnetic state.

The spin valve element 4 is different from the spin valve element 3 of the third embodiment in that the first free magnetic layer 66 comprises a lamination of a first ferromagnetic insulating film 66A and a first ferromagnetic conductive film 66B.

The first free magnetic layer 66 comprises a lamination of the first ferromagnetic insulating film 66A and the first ferromagnetic conductive film 66B, the first ferromagnetic conductive film 66B being provided in contact with the nonmagnetic intermediate layer 63. In addition, the first ferromagnetic insulating film 66A and the first ferromagnetic conductive film 66B are ferromagnetically coupled with each other to bring both films in a ferromagnetic state.

The thickness of the first ferromagnetic insulating film 66A is in the range of 1 nm to 4 nm, and the thickness s of the first ferromagnetic conductive film 66B is in the range of $0 \text{ nm} < s \leq 3.0$ nm.

The first ferromagnetic insulating film 66A is equivalent to the first ferromagnetic insulating film of the second embodiment, and comprises an insulating film having a resistivity of about 4 to $2.0 \times 10^3$ $\mu\Omega \cdot m$.

The first ferromagnetic conductive film 66B is made of the same material as the first ferromagnetic conductive film of the second embodiment, which is ferromagnetic and has a resistivity of as low as about 0.3 $\mu\Omega \cdot m$.

The nonmagnetic intermediate layer 63 and the second free magnetic layer 62 have the same constructions and are made of the same materials as the nonmagnetic intermediate layer and the second free magnetic layer of the third embodiment.

The thickness of the second free magnetic layer 62 is in the range of 2.5 nm to 4.5 nm, and is larger than the first free magnetic layer 66.

Therefore, the first free magnetic layer exhibits higher resistivity than the second free magnetic layer 62 comprising ferromagnetic conductive films (the anti-diffusion film 62A and the ferromagnetic film 62B), and the nonmagnetic intermediate film 63, and thus the sensing current less flows in the first free magnetic layer 66.

Therefore, the sensing current flowing through the laminate 4A mainly flows through the nonmagnetic conductive layer 29, the pinned magnetic layer 40 and the second free magnetic layer 62, thereby suppressing a shunt of the sensing current.

The sensing current is caused to flow through the periphery of the second free magnetic layer 62 and the nonmagnetic conductive layer 29 to increase the number of conduction electrons contributing to the giant magnetoresistance, thereby increasing the rate of change in magnetoresistance.

Since the first ferromagnetic insulating film 66A and the first ferromagnetic conductive film 66B are ferromagnetically coupled with each other to bring both films in the ferromagnetic state, the magnetization direction of the entire first free magnetic layer 66 can be oriented in one direction. Namely, in FIG. 12, when the magnetization direction of the second free magnetic layer 62 is oriented in the $X_1$ direction by the bias layers 332, the magnetization direction of the entire first free magnetic layer 66 is oriented in the direction opposite to the $X_1$ direction. The magnetization of the second free magnetic layer 62 remains to orient the magnetization direction of the entire free magnetic layer 66 in the $X_1$ direction to form the ferrimagnetic state.

Even with a small external magnetic field applied, the magnetization direction of the free magnetic layer 65 put into the ferrimagnetic state can thus be rotated according to the direction of the external magnetic field.

Furthermore, since the first ferromagnetic conductive film 66B is provided between the first ferromagnetic insulating film 66A and the nonmagnetic intermediate layer 63, the first and second free magnetic layers 66 and 62 can be securely antiferromagnetically coupled with each other to bring both layers into the ferrimagnetic state, thereby increasing the sensitivity to the external magnetic field.

In this case, by setting the thickness s of the first ferromagnetic conductive film 66B in the range of $0 \text{ nm} < s \leq 3.0$ nm, the first and second free magnetic layers 66 and 62 can be securely antiferromagnetically coupled with each other.

In addition, a potential barrier is formed at the interface between the first free ferromagnetic insulating film 66A and the first ferromagnetic conductive film 66B due to a great difference in resistivity between both films. Of the conduction electrons moving in the nonmagnetic conductive layer 29, up-spin conduction electrons are mirror-reflected by the potential barrier while maintaining the spin direction.

The up-spin conduction electrons are mirror-reflected at the interface between the first ferromagnetic insulating film 66A and the first ferromagnetic conductive film 66B to extend the mean free path. Like in the first embodiment, therefore, the difference between the mean free paths of the up-spin conduction electrons and the down-spin conduction electrons can be increased to increase the rate of change in magnetoresistance of the spin valve element 4.

The spin valve element 4 is manufactured by substantially the same-method as the spin valve element 2 of the second embodiment except that the underlying layer 23, the free magnetic layer 65, the nonmagnetic conductive layer 29, the pinned magnetic layer 40, the antiferromagnetic layer 22, and the capping layer 24 are laminated in turn to form a multilayer film.

The spin valve element 4 exhibits substantially the same effect as the spin valve element 2 of the second embodiment.

Fifth Embodiment

A fifth embodiment of the present invention will be described with reference to the drawings.

Figure 13:
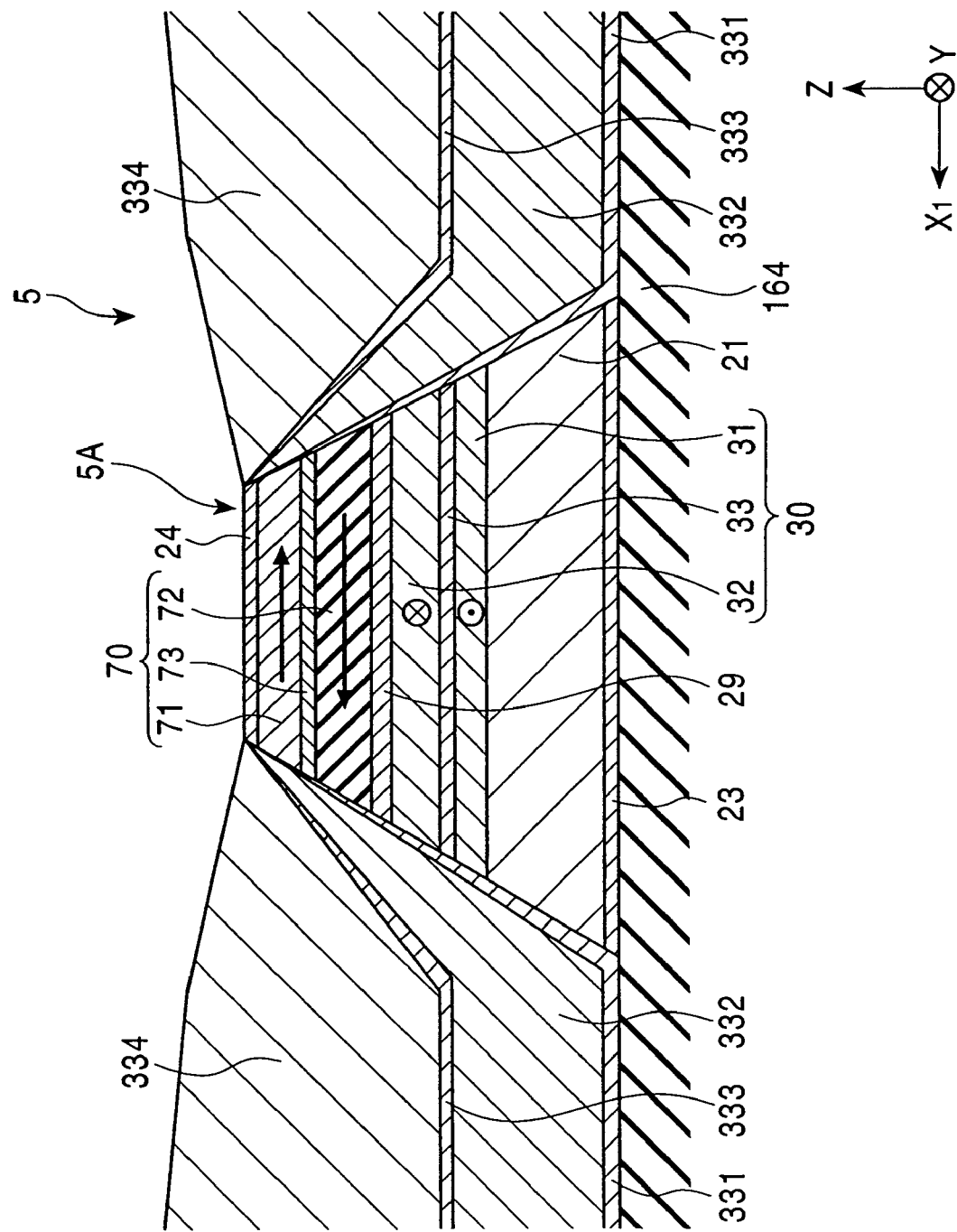
FIG. 13 is a schematic sectional view of a spin valve element according to a fifth embodiment of the present invention, as viewed from the magnetic recording medium side.

FIG. 13 is a schematic sectional view of a spin valve element 5 according to the fifth embodiment of the present invention, as viewed from the magnetic recording medium side.

The spin valve element 5 shown in FIG. 13 is a bottom-type single spin valve element in which an antiferromagnetic layer 21, a pinned magnetic layer 30, a nonmagnetic conductive layer 29, and a free magnetic layer 70 are laminated in turn.

In FIG. 13, reference numeral 164 denotes a lower gap layer, and reference numeral 23 denotes an underlying layer. The antiferromagnetic layer 21, the pinned magnetic layer 30, the nonmagnetic conductive layer 29, the free magnetic layer 70, and a capping layer 24 are laminated in turn on the underlying layer 23.

In this way, the layers from the underlying layer 23 to the capping layer 24 are laminated in turn to form a laminate 5A having a substantially trapezoidal sectional shape having a width corresponding to the track width.

The antiferromagnetic layer 21, the nonmagnetic conductive layer 29, the pinned magnetic layer 30 (the nonmagnetic layer 33 and first and second pinned magnetic layers 31 and 32), the bias underlying layers 331, the bias layers 332, the intermediate layers 333, and the electrode layers 334 shown in FIG. 13 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the first or second embodiment. Therefore, description of these layers is omitted.

The free magnetic layer 70 comprises a nonmagnetic intermediate layer 73, and first and second free magnetic layers 71 and 72 antiferromagnetically coupled with each other with the nonmagnetic intermediate layer 73 provided therebetween to bring both free magnetic layers 71 and 72 into a ferrimagnetic state.

The first free magnetic layer 71 comprises a ferromagnetic conductive film made of, for example, any one of Co, a CoFe alloy, a NiFe alloy, a CoNi alloy, and a CoNiFe alloy, preferably a NiFe alloy.

The thickness of the first free magnetic layer 71 is preferably in the range of 0.5 to 4 nm.

The nonmagnetic intermediate layer 73 is preferably made of a nonmagnetic conductive material such as one of Ru, Rh, Ir, Cr, Re, and Cu, or an alloy thereof, more preferably Ru.

The second free magnetic layer 72 comprises a ferromagnetic insulating film which is ferromagnetic and has high resistivity. Examples of such a ferromagnetic insulating film include a ferromagnetic insulating oxide film and a ferromagnetic insulating nitride film. The ferromagnetic insulating oxide film or ferromagnetic insulating nitride film is the same as the ferromagnetic insulating oxide film or ferromagnetic insulating nitride film which constitutes the first free magnetic layer of the spin valve element of the first embodiment.

The thickness of the second free magnetic layer 72 is preferably in the range of 1.5 nm to 4.5 nm, and is more preferably larger than the first free magnetic layer 71.

The second free magnetic layer 72 is ferromagnetic, and is thus ferromagnetically coupled with the first free magnetic layer 71 with the nonmagnetic intermediate layer 73 provided therebetween.

Therefore, when the magnetization direction of the second free magnetic layer 72 is oriented in the $X_1$ direction by the bias layers 332, the magnetization direction of the entire first free magnetic layer 71 is oriented in the direction opposite to the $X_1$ direction. The magnetization of the second free magnetic layer 72 remains to orient the magnetization direction of the entire free magnetic layer 70 in the $X_1$ direction.

Therefore, the first and second free magnetic layers 71 and 72 are antiferromagnetically coupled with each other so that the magnetization directions are antiparallel to each other to bring both layers in a synthetic ferrimagnetic state (synthetic ferrimagnetic free).

Even with a small external magnetic field applied, the magnetization direction of the free magnetic layer 70 put into the ferrimagnetic state can thus be rotated according to the direction of the external magnetic field.

In addition, the second free magnetic layer 72 comprises the ferromagnetic insulating oxide film or ferromagnetic insulating nitride film having a resistivity of 4 to $2.0 \times 10^3$ $\mu\Omega \cdot m$, and thus exhibits higher resistivity than the first free magnetic layer 71, the nonmagnetic intermediate layer 73 or the nonmagnetic conductive layer 29. Particularly, a potential barrier is formed at the interface between the second free magnetic layer 72 and the nonmagnetic conductive layer 29 due to a great difference in resistivity between both layers.

Of the conduction electrons moving in the nonmagnetic conductive layer 29, up-spin conduction electrons are mirror-reflected by the potential barrier while maintaining the spin direction, and down-spin conduction electrons are scattered without maintaining the spin direction. The second free magnetic layer 72 comprising the ferromagnetic insulating oxide film mirror-reflects only the up-spin conduction electrons.

The up-spin conduction electrons are mirror-reflected by the second free magnetic layer 72 to extend the mean free path. Like in the first embodiment, therefore, the difference between the mean free paths of the up-spin conduction electrons and the down-spin conduction electrons can be increased to increase the rate of change in magnetoresistance of the spin valve element 5.

This is described with reference to a schematic drawing of FIG. 14.

Figure 14:
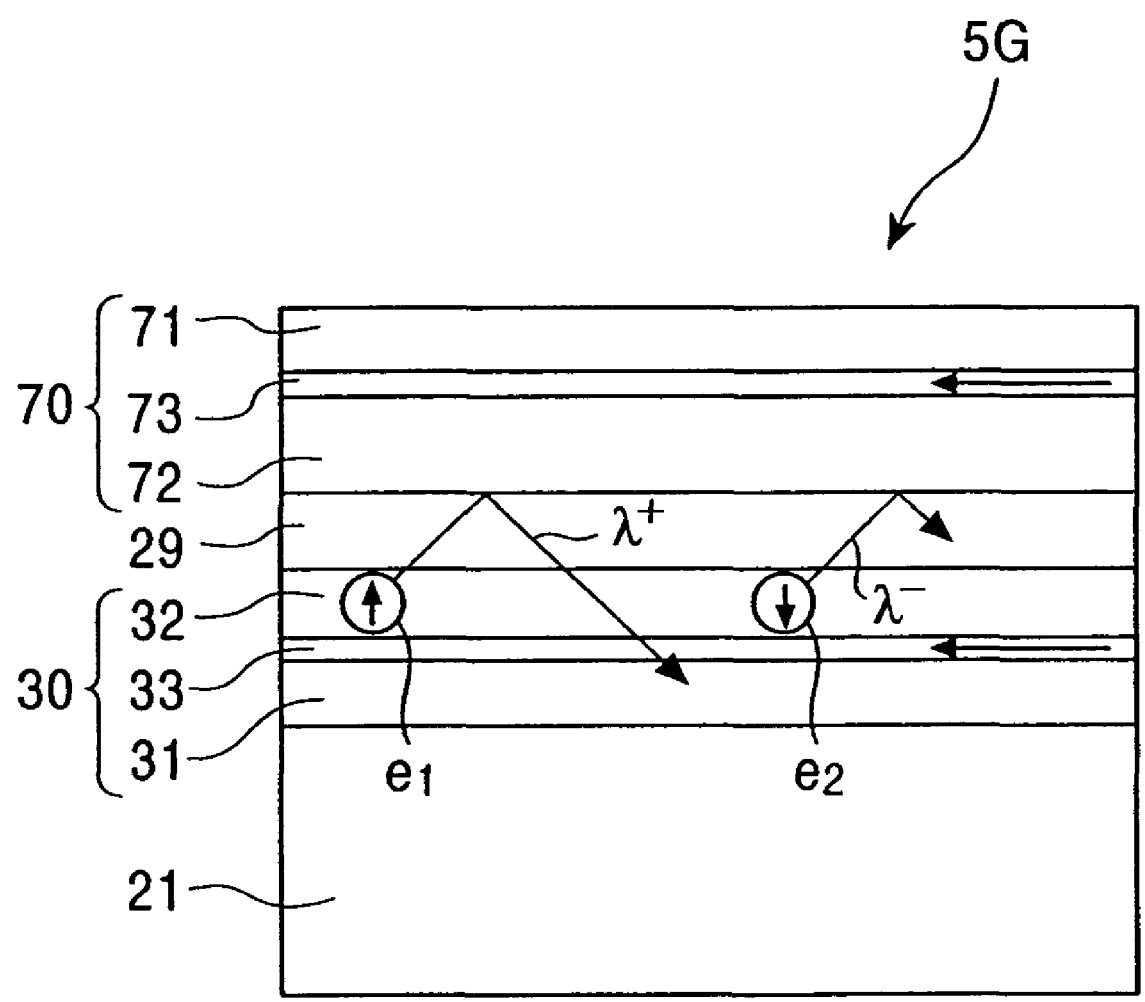
FIG. 14 is a schematic drawing illustrating the operation of the spin valve element shown in FIG. 13.

FIG. 14 shows a laminate 5G in which the antiferromagnetic layer 21, the pinned magnetic layer 30 (the first pinned magnetic layer 31, the nonmagnetic layer 33, the second pinned magnetic layer 32), the nonmagnetic conductive layer 29, and the free magnetic layer 70 (the second free magnetic layer 72, the nonmagnetic intermediate layer 73, the first free magnetic layer 71) are laminated in turn.

In FIG. 14, the magnetization direction of the free magnetic layer 70 is oriented in the leftward direction in FIG. 14 by the external magnetic field, and the magnetization direction of the pinned magnetic layer 30 is pinned in the leftward direction in FIG. 14 by an exchange coupling magnetic field with the antiferromagnetic layer 21.

When the sensing current is passed through the laminate 5G shown in FIG. 14, the conduction electrons mainly move in the nonmagnetic conductive layer 29 having low electric resistance. In FIG. 14, the up-spin conduction electrons are denoted by reference character $e_1$, and the down-spin conduction electrons are denoted by reference character $e_2$.

The up-spin conduction electrons $e_1$ quite possibly move from the pinned magnetic layer 30 to the second free magnetic layer 72 through the nonmagnetic conductive layer 29 when the magnetization directions of the pinned magnetic layer 30 and the free magnetic layer 70 are made parallel by the external magnetic field.

The up-spin conduction electrons $e_1$ are mirror-reflected by the interface between the nonmagnetic conductive layer 29 and the second free magnetic layer 72 while maintaining the spin state, and again move in the nonmagnetic conductive layer 29 and the pinned magnetic layer 30.

In this way, the up-spin conduction electrons $e_1$ pass through the nonmagnetic conductive layer 29 and the second free magnetic layer 72 twice each to significantly extend the mean free path to $\lambda^+$.

On the other hand, the down-spin conduction electrons $e_2$ have the high probability that they are always scattered at the interface between the nonmagnetic conductive layer 29 and the second free magnetic layer 72, and the mean free path is cut off at the time the down-spin conduction electrons $e_2$ are scattered by the second free magnetic layer 72. Therefore, the mean free path ($\lambda^-$) of the down-spin conduction electrons $e_2$ remains shorter than the mean free path ($\lambda^+$) of the up-spin conduction electrons $e_1$.

The mean free path ($\lambda^+$) of the up-spin conduction electrons $e_1$ becomes longer than the mean free path ($\lambda^-$) of the down-spin conduction electrons $e_2$ due to the action of the external magnetic field, increasing the difference ($\lambda^+-\lambda^-$) between the paths to increase the rate of change in magnetoresistance of the laminate 5G.

Therefore, in the spin valve element 5 of this embodiment, the difference between the mean free path of the up-spin conduction electrons $e_1$ and the mean free path of the down-spin conduction electrons $e_2$ can be increased to significantly increase the rate of change in magnetoresistance of the spin valve element 5.

The spin valve element 5 is manufactured by substantially the same method as the spin valve element 1 of the first embodiment except that the second free magnetic layer 72 comprises the ferromagnetic insulating film, and the first free magnetic-layer 71 comprises the ferromagnetic conductive film.

In the spin valve element 5, the second free magnetic layer 72 comprises the ferromagnetic insulating film, and thus up-spin conduction electrons can be mirror-reflected by the second free magnetic layer 72 to extend the mean free path of the up-spin conduction electrons. Therefore, the difference between the mean free paths of the up-spin and down-spin conduction electrons can be increased to increase the rate of change in magnetoresistance of the spin valve element 5.

Also, the up-spin conduction electrons are mirror-reflected by the second free magnetic layer 72 so that the up-spin conduction electrons 72 can be trapped near the nonmagnetic conductive layer 29. Therefore, a shunt of the sensing current can be suppressed to decrease the shunt loss, and increase the rate of change in magnetoresistance of the spin valve element 5.

Furthermore, the second free magnetic layer 72 comprises the ferromagnetic insulating film and exhibit ferromagnetism, and can thus be antiferromagnetically coupled with the first free magnetic layer 71 to form the ferrimagnetic state. Therefore, the magnetization direction of the free magnetic layer 70 can be changed with a small external magnetic field, thereby increasing the sensitivity to the external magnetic field.

Therefore, the spin valve element 5 has the particular effect of significantly increasing the rate of change in magnetoresistance by the effect of mirror-reflecting up-spin conduction electrons, and increasing the sensitivity to the external magnetic field by providing the free magnetic layer in the ferrimagnetic state.

Sixth Embodiment

A sixth embodiment of the present invention will be described with reference to the drawings.

Figure 15:
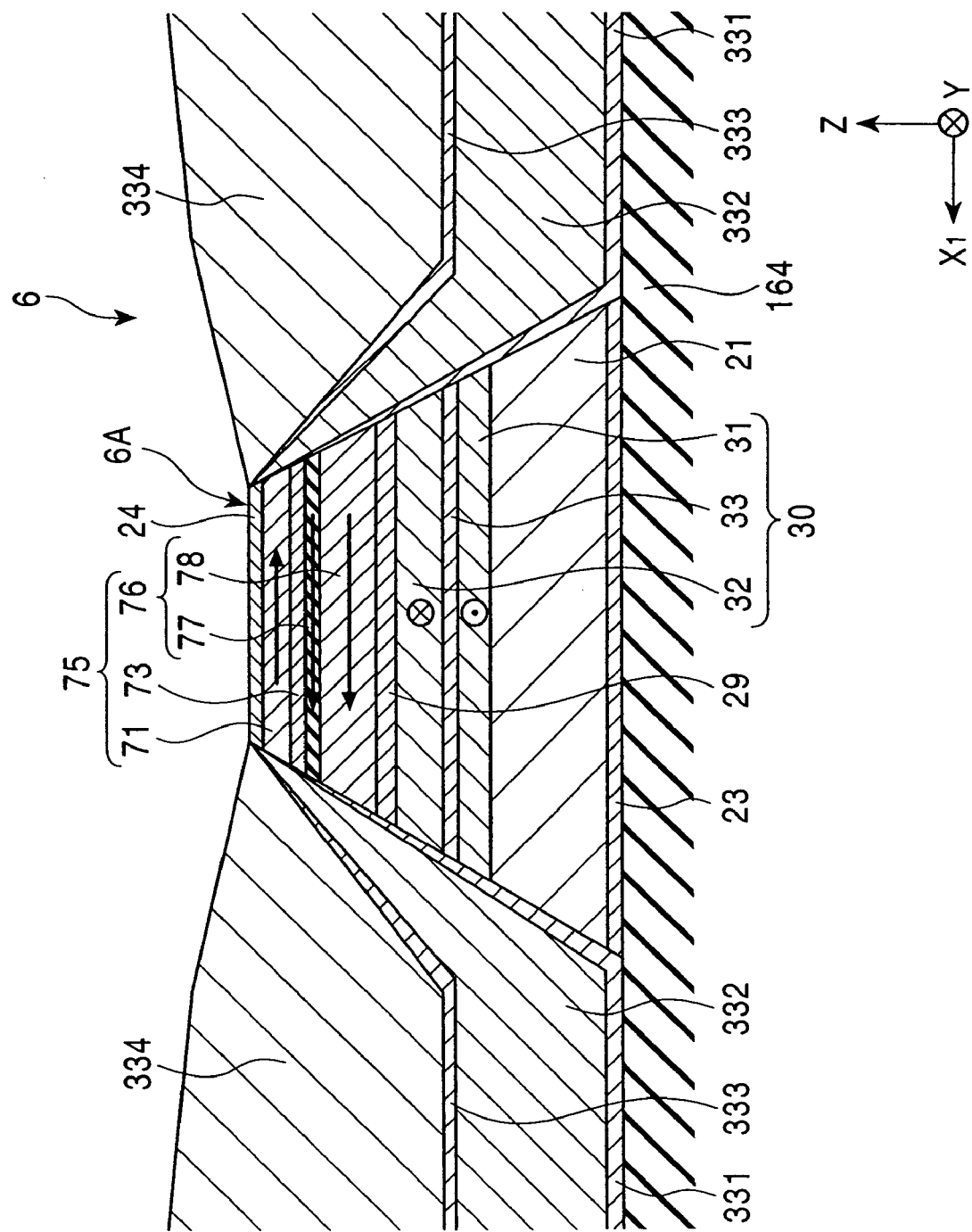
FIG. 15 is a schematic sectional view of a spin valve element according to a sixth embodiment of the present invention, as viewed from the magnetic recording medium side.

FIG. 15 is a schematic sectional view of a spin valve element 6 according to the sixth embodiment of the present invention, as viewed from the magnetic recording medium side.

The spin valve element 6 shown in FIG. 15 is a bottom-type single spin valve element in which an antiferromagnetic layer 21, a pinned magnetic layer 30, a nonmagnetic conductive layer 29, and a free magnetic layer 75 are laminated in turn.

In FIG. 15, reference numeral 164 denotes a lower gap layer, and reference numeral 23 denotes an underlying layer. The antiferromagnetic layer 21, the pinned magnetic layer 30, the nonmagnetic conductive layer 29, the free magnetic layer 75, and a capping layer 24 are laminated in turn on the underlying layer 23.

In this way, the layers from the underlying layer 23 to the capping layer 24 are laminated in turn to form a laminate 6A having a substantially trapezoidal sectional shape having a width corresponding to the track width.

The antiferromagnetic layer 21, the nonmagnetic conductive layer 29, the pinned magnetic layer 30 (the nonmagnetic layer 33 and first and second pinned magnetic layers 31 and 32), the bias underlying layers 331, the bias layers 332, the intermediate layers 333, and the electrode layers 334 shown in FIG. 15 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the first or second embodiment. Therefore, description of these layers is omitted.

The free magnetic layer 75 comprises a nonmagnetic intermediate layer 73, and first and second free magnetic layers 71 and 76 antiferromagnetically coupled with each other with the nonmagnetic intermediate layer 73 provided therebetween to bring both free magnetic layers 71 and 76 into a ferrimagnetic state.

The first free magnetic layer 71 and the nonmagnetic intermediate layer 73 have the same constructions and are made of the same materials as the first free magnetic layer and the nonmagnetic intermediate layer of the fifth embodiment.

The second free magnetic layer 76 comprises a second ferromagnetic insulating film 77 and a third ferromagnetic conductive film 78. The second ferromagnetic insulating film 77 is provided in contact with the nonmagnetic intermediate layer 73, and the third ferromagnetic conductive film 78 is provided in contact with the nonmagnetic conductive layer 29. The second ferromagnetic insulating film 77 and the third ferromagnetic conductive film 78 are ferromagnetically coupled with each other to be put into the ferromagnetic state.

The second ferromagnetic insulating film 77 is ferromagnetic and has high resistivity. Examples of such a ferromagnetic insulating film include a ferromagnetic insulating oxide film and a ferromagnetic insulating nitride film, which are the same as the ferromagnetic insulating oxide film or ferromagnetic insulating nitride film which forms the first free magnetic layer of the spin valve element of the first embodiment.

The third ferromagnetic conductive film 78 is ferromagnetic and has low resistivity, and is made of, for example, any one of Co, a CoFe alloy, a NiFe alloy, a CoNi alloy, and a CoNiFe alloy, preferably a NiFe alloy.

The thickness of the second ferromagnetic insulating film 77 is preferably in the range of 0.5 to 10 nm, more preferably in the range of 1 to 10 nm. The thickness of the third ferromagnetic conductive film 78 is preferably in the range of 1.5 to 4.5 nm.

The total thickness u of the second free magnetic layer 76 is preferably in the range of 2.0 to 14.5 nm, more preferably larger than the first free magnetic layer 71.

By setting the thickness u of the second ferromagnetic insulating film 77 in the range of 0.5 nm≦u 10≦nm, the up-spin conduction electrons moving from the nonmagnetic conductive layer 29 can be mostly mirror-reflected without passing through the second ferromagnetic insulating film 77.

Also, the second ferromagnetic insulating film 77 and the third ferromagnetic conductive film 78 are ferromagnetically coupled with each other to be put into the ferromagnetic state so that the magnetization direction of the entire second free magnetic layer 76 can be oriented in one direction. Namely, in FIG. 15, when the magnetization direction of the second free magnetic layer 76 is oriented in the $X_1$ direction by the bias layers 332, the magnetization direction of the entire first free magnetic layer 71 is oriented in the direction opposite to the $X_1$ direction. The magnetization of the second free magnetic layer 76 remains to orient the magnetization direction of the entire free magnetic layer 75 in the $X_1$ direction.

Therefore, the first and second free magnetic layers 71 and 76 are antiferromagnetically coupled with each other so that the magnetization directions are antiparallel to each other to bring both layers in the synthetic ferrimagnetic state (synthetic ferrimagnetic free).

Even with a small external magnetic field applied, the magnetization direction of the free magnetic layer 75 put into the ferrimagnetic state can thus be rotated according to the direction of the external magnetic field.

In addition, the second ferromagnetic insulating film constituting the second free magnetic layer 76 comprises the ferromagnetic insulating oxide film or ferromagnetic insulating nitride film having a resistivity of 4 to 2.0×10³ μΩ·m, and thus exhibits higher resistivity than the third ferromagnetic conductive film 78. Therefore, a potential barrier is formed at the interface between the second ferromagnetic insulating film 77 and the third ferromagnetic conductive film 78.

Of the conduction electrons moving in the nonmagnetic conductive layer 29, up-spin conduction electrons are mirror-reflected by the potential barrier while maintaining the spin direction.

The up-spin conduction electrons are mirror-reflected by the second ferromagnetic insulating film 77 to extend the mean free path. Like in the first embodiment, therefore, the difference between the mean free paths of the up-spin conduction electrons and the down-spin conduction electrons can be increased to increase the rate of change in magnetoresistance of the spin valve element 6.

This is described with reference to a schematic drawing of FIG. 16.

Figure 16:
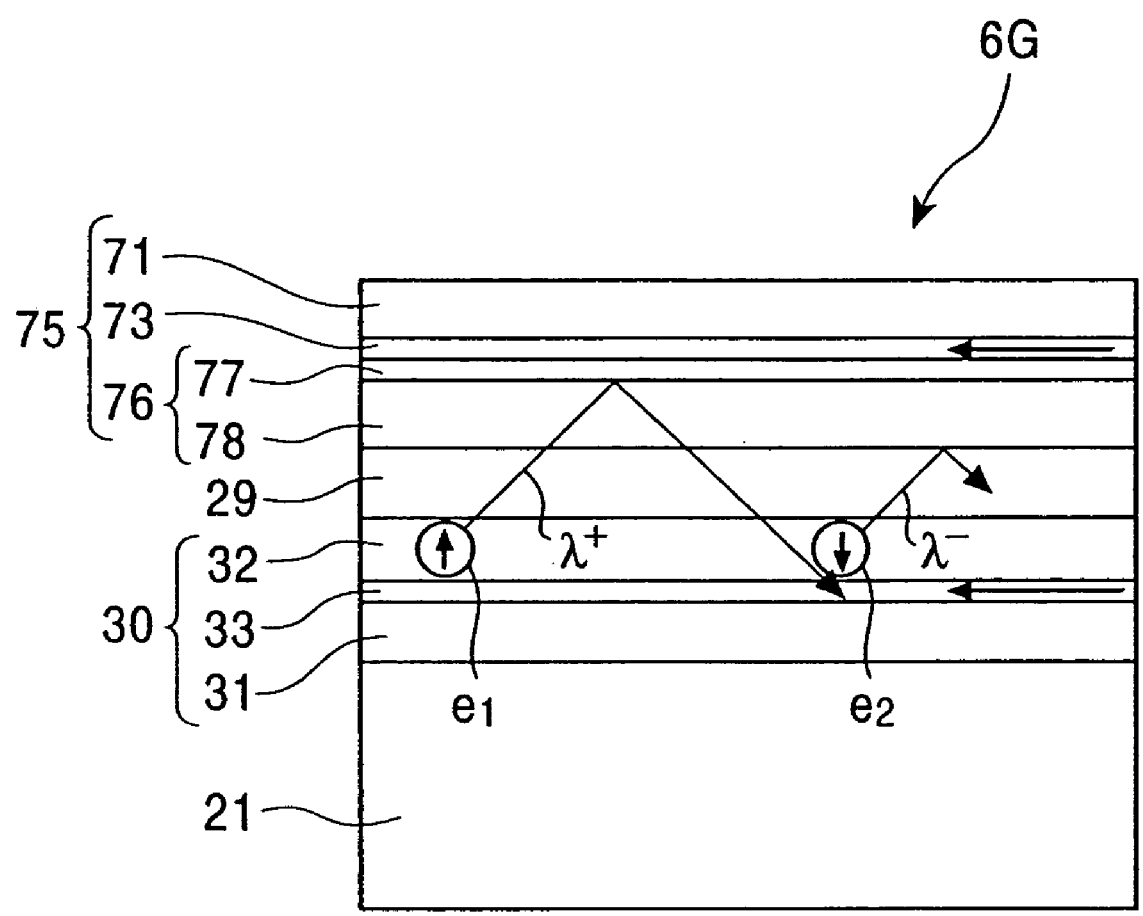
FIG. 16 is a schematic drawing illustrating the operation of the spin valve element shown in FIG. 15.

FIG. 16 shows a laminate 6G in which the antiferromagnetic layer 21, the pinned magnetic layer 30 (the first pinned magnetic layer 31, the nonmagnetic layer 33, the second pinned magnetic layer 32), the nonmagnetic conductive layer 29, the second free magnetic layer 76 (the third ferromagnetic conductive film 78 and the second ferromagnetic insulating film 77), the nonmagnetic intermediate layer 73, and the first free magnetic layer 71 are laminated in turn.

In FIG. 16, the magnetization direction of the free magnetic layer 75 is oriented in the leftward direction in FIG. 16 by the external magnetic field, and the magnetization direction of the pinned magnetic layer 30 is pinned in the leftward direction in FIG. 16 by an exchange coupling magnetic field with the antiferromagnetic layer 21.

When the sensing current is passed through the laminate 6G shown in FIG. 16, the conduction electrons mainly move in the nonmagnetic conductive layer 29 having low electric resistance. In FIG. 16, the up-spin conduction electrons are denoted by reference character $e_1$, and the down-spin conduction electrons are denoted by reference character $e_2$.

The up-spin conduction electrons $e_1$ quite possibly move from the pinned magnetic layer 30 to the second ferromagnetic insulating oxide film 77 through the nonmagnetic conductive layer 29 when the magnetization directions of the pinned magnetic layer 30 and the free magnetic layer 75 are made parallel by the external magnetic field.

The up-spin conduction electrons $e_1$ are mirror-reflected by the interface between the second ferromagnetic insulating film 77 and the third ferromagnetic conductive film 78 while maintaining the spin state, and again move in the third ferromagnetic conductive film 78, the nonmagnetic conductive layer 29 and the pinned magnetic layer 30.

In this way, the up-spin conduction electrons $e_1$ pass through the third ferromagnetic conductive film 78, the nonmagnetic conductive layer 29 and the pinned magnetic layer 30 twice each to significantly extend the mean free path to $\lambda^+$.

On the other hand, the down-spin conduction electrons $e_2$ have the high probability that they are always scattered at the interface between the nonmagnetic conductive layer 29 and the second free magnetic layer 76, and the mean free path is cut off at the time the down-spin conduction electrons $e_2$ are scattered by the second free magnetic layer 76. Therefore, the mean free path ($\lambda^-$) of the down-spin conduction electrons $e_2$ remains shorter than the mean free path ($\lambda^+$) of the up-spin conduction electrons $e_1$.

The mean free path ($\lambda^+$) of the up-spin conduction electrons $e_1$ becomes longer than the mean free path ($\lambda^-$) of the down-spin conduction electrons $e_2$ due to the action of the external magnetic field, increasing the difference ($\lambda^+-\lambda^-$) between the paths to increase the rate of change in magnetoresistance of the laminate 6G.

Therefore, in the spin valve element 6 of this embodiment, the difference between the mean free path of the up-spin conduction electrons $e_1$ and the mean free path of the down-spin conduction electrons $e_2$ can be increased to significantly increase the rate of change in magnetoresistance of the spin valve element 6.

Furthermore, since the third ferromagnetic conductive film 78 is provided in contact with the nonmagnetic conductive layer 29, the greater giant magnetoresistive effect can be manifested at the interface between the third ferromagnetic conductive film 78 and the nonmagnetic conductive layer 29.

The spin valve element 6 is manufactured by substantially the same method as the spin valve element 1 of the first embodiment except that the second free magnetic layer 76 comprises the second ferromagnetic insulating film 77 and the third ferromagnetic conductive film 78, and the first free magnetic layer 71 comprises the ferromagnetic conductive film.

In the spin valve element 6, the second free magnetic layer 76 comprises the second ferromagnetic insulating film 77 and the third ferromagnetic conductive film 78, and thus up-spin conduction electrons can be mirror-reflected by the second ferromagnetic insulating film 77 to extend the mean free path of the up-spin conduction electrons. Therefore, the difference between the mean free paths of the up-spin and down-spin conduction electrons can be increased to increase the rate of change in magnetoresistance of the spin valve element 6.

Also, the up-spin conduction electrons are mirror-reflected by the second ferromagnetic insulating film 77 so that the up-spin conduction electrons 72 can be trapped near the nonmagnetic conductive layer 29. Therefore, a shunt of the sensing current can be suppressed to decrease the shunt loss, and increase the rate of change in magnetoresistance of the spin valve element 6.

In addition, since the third ferromagnetic conductive film 78 is provided in contact with the nonmagnetic conductive layer 29, the greater giant magnetoresistive effect can be manifested at the interface between the third ferromagnetic conductive film 78 and the nonmagnetic conductive layer 29, thereby further increasing the rate of change in magnetoresistance of the spin valve element 6.

Furthermore, the second ferromagnetic insulating film 77 and the third ferromagnetic conductive film 78 are ferromagnetically coupled with each other to form the ferromagnetic state. Therefore, the second free magnetic layer 76 and the first free magnetic layer 71 are antiferromagnetically to bring both layers into the ferrimagnetic state. As a result, the magnetization direction of the free magnetic layer 75 can be changed with a small external magnetic field, thereby increasing the sensitivity of the spin valve element 6 to the external magnetic field.

Therefore, the spin valve element 6 has the particular effect of significantly increasing the rate of change in magnetoresistance by the effect of mirror-reflecting up-spin conduction electrons, and increasing the sensitivity to the external magnetic field by providing the free magnetic layer in the ferrimagnetic state.

Seventh Embodiment

A seventh embodiment of the present invention will be described with reference to the drawings.

Figure 17:
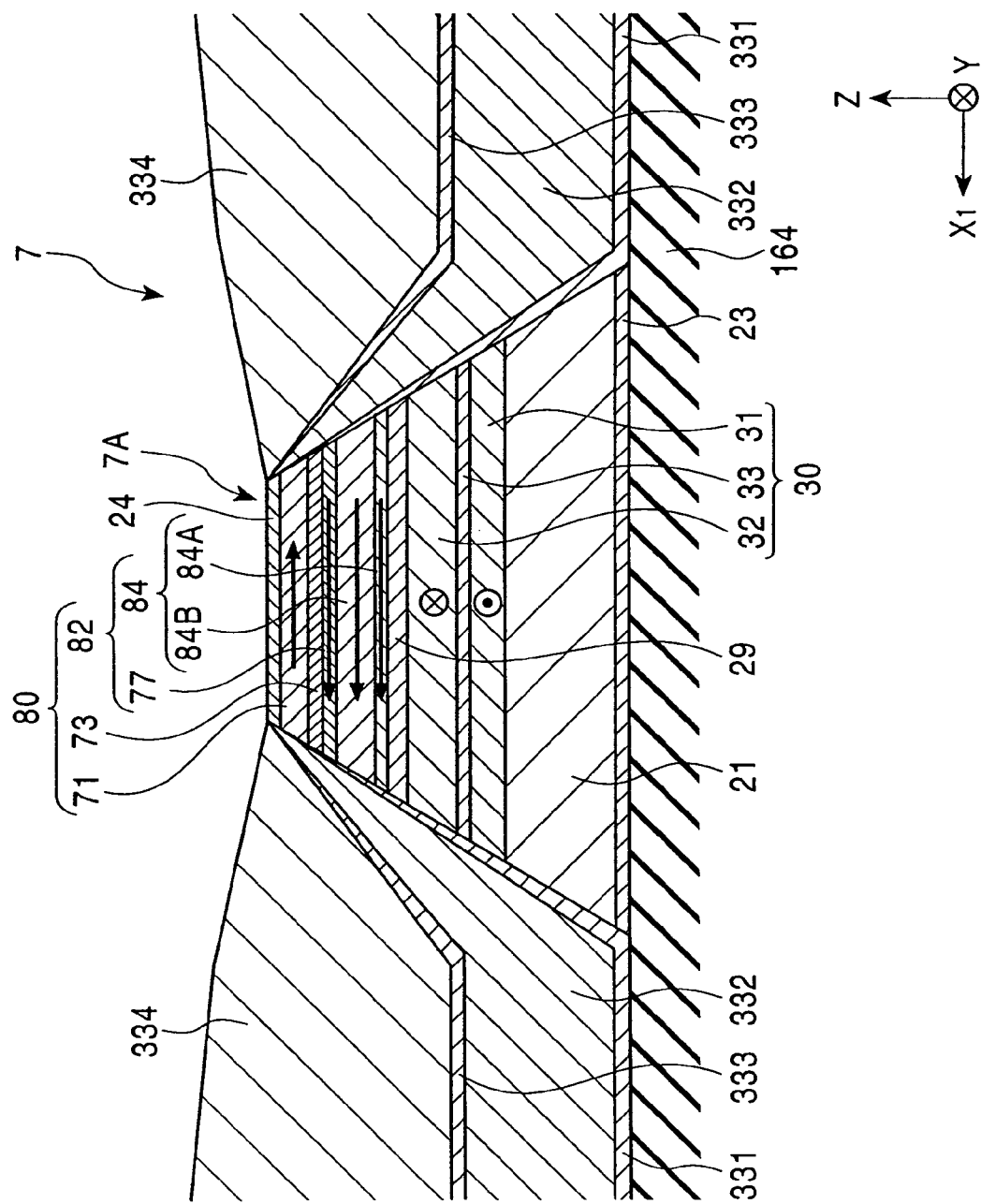
FIG. 17 is a schematic sectional view of a spin valve element according to a seventh embodiment of the present invention, as viewed from the magnetic recording medium side.

FIG. 17 is a schematic sectional view of a spin valve element 7 according to the seventh embodiment of the present invention, as viewed from the magnetic recording medium side.

The spin valve element 7 shown in FIG. 17 is a bottom-type single spin valve element in which an antiferromagnetic layer 21, a pinned magnetic layer 30, a nonmagnetic conductive layer 29, and a free magnetic layer 80 are laminated in turn.

In FIG. 17, reference numeral 164 denotes a lower gap layer, and reference numeral 23 denotes an underlying layer. The antiferromagnetic layer 21, the pinned magnetic layer 30, the nonmagnetic conductive layer 29, the free magnetic layer 80, and a capping layer 24 are laminated in turn on the underlying layer 23.

In this way, the layers from the underlying layer 23 to the capping layer 24 are laminated in turn to form a laminate 7A having a substantially trapezoidal sectional shape having a width corresponding to the track width.

The free magnetic layer 80 comprises a nonmagnetic intermediate layer 73, and first and second free magnetic layers 71 and 82 antiferromagnetically coupled with each other with the nonmagnetic intermediate layer 73 provided therebetween.

The second free magnetic layer 82 comprises a second ferromagnetic insulating film 77 and a third ferromagnetic conductive film 84.

The antiferromagnetic layer 21, the first free magnetic layer 71, the nonmagnetic intermediate layer 73, the nonmagnetic conductive layer 29, the pinned magnetic layer 30 (the nonmagnetic layer 33 and first and second pinned magnetic layers 31 and 32), the bias underlying layers 331, the bias layers 332, the intermediate layers 333, and the electrode layers 334 shown in FIG. 17 have the same constructions and are made of the same materials as the antiferromagnetic layer, the first free magnetic layer, the nonmagnetic intermediate layer, the nonmagnetic conductive layer, the pinned magnetic layer (the nonmagnetic layer and first and second pinned magnetic layers), the bias underlying layers, the bias layers, the intermediate layers, and the electrode layers of the first, second, fifth or sixth embodiment. Therefore, description of these layers is omitted.

The spin valve element 7 is different from the spin valve element 6 of the sixth embodiment in that the third ferromagnetic conductive film 84 which constitutes the second free magnetic layer 82 comprises an anti-diffusion film 84A and a ferromagnetic film 84B.

Namely, the third ferromagnetic conductive film 84 comprises the anti-diffusion film 84A and the ferromagnetic film 84B which are formed in contact with the nonmagnetic conductive layer 29 and the second ferromagnetic insulating film 77, respectively.

The anti-diffusion film 84A comprises a ferromagnetic conductive film of Co or the like, and prevents mutual diffusion between the ferromagnetic film 84B and the nonmagnetic conductive layer 29.

Like the anti-diffusion film 84A, the ferromagnetic film 84B comprises a ferromagnetic conductive film, and is made of, for example, any one of Co, a CoFe alloy, a NiFe alloy, a CoNi alloy, and a CoNiFe alloy, preferably a NiFe alloy.

The thickness of the anti-diffusion film 84A is preferably in the range of 0.1 to 1.5 nm, and the thickness of the ferromagnetic film 84B is preferably in the range of 1.4 to 4.5 nm.

The total thickness of the second free magnetic layer 82 is preferably in the range of 1.5 to 6.0 nm, and more preferably larger than the first free magnetic layer 71.

Also the anti-diffusion film 84A, the ferromagnetic film 84B and the second ferromagnetic insulating film 77 are ferromagnetically coupled with each other to be put into the ferromagnetic state so that the magnetization direction of the entire second free magnetic layer 82 can be oriented in one direction. Namely, in FIG. 17, when the magnetization direction of the second free magnetic layer 82 is oriented in the $X_1$ direction by the bias layers 332, the magnetization direction of the entire first free magnetic layer 71 is oriented in the direction opposite to the $X_1$ direction. The magnetization of the second free magnetic layer 82 remains to orient the magnetization direction of the entire free magnetic layer 80 in the $X_1$ direction to form the ferrimagnetic state.

The spin valve element 7 is manufactured by substantially the same method as the spin valve element 6 of the sixth embodiment except that the third ferromagnetic conductive film 84 comprises the anti-diffusion film 84A and the ferromagnetic film 84B.

The spin valve element 7 exhibits not only the same effect as the spin valve element 6 of the sixth embodiment, but also the following effect.

In the spin valve element 7, the third ferromagnetic conductive film 84 comprises the anti-diffusion film 84A and the ferromagnetic film 84B to prevent mutual diffusion between the ferromagnetic film 84B and the nonmagnetic conductive layer 29. Therefore, the greater giant magnetoresistive effect can be manifested at the interface between the nonmagnetic conductive layer 29 and the anti-diffusion film 84A, thereby increasing the rate of change in magnetoresistance.

Eighth Embodiment

An eighth embodiment of the present invention will be described with reference to the drawings.

Figure 18:
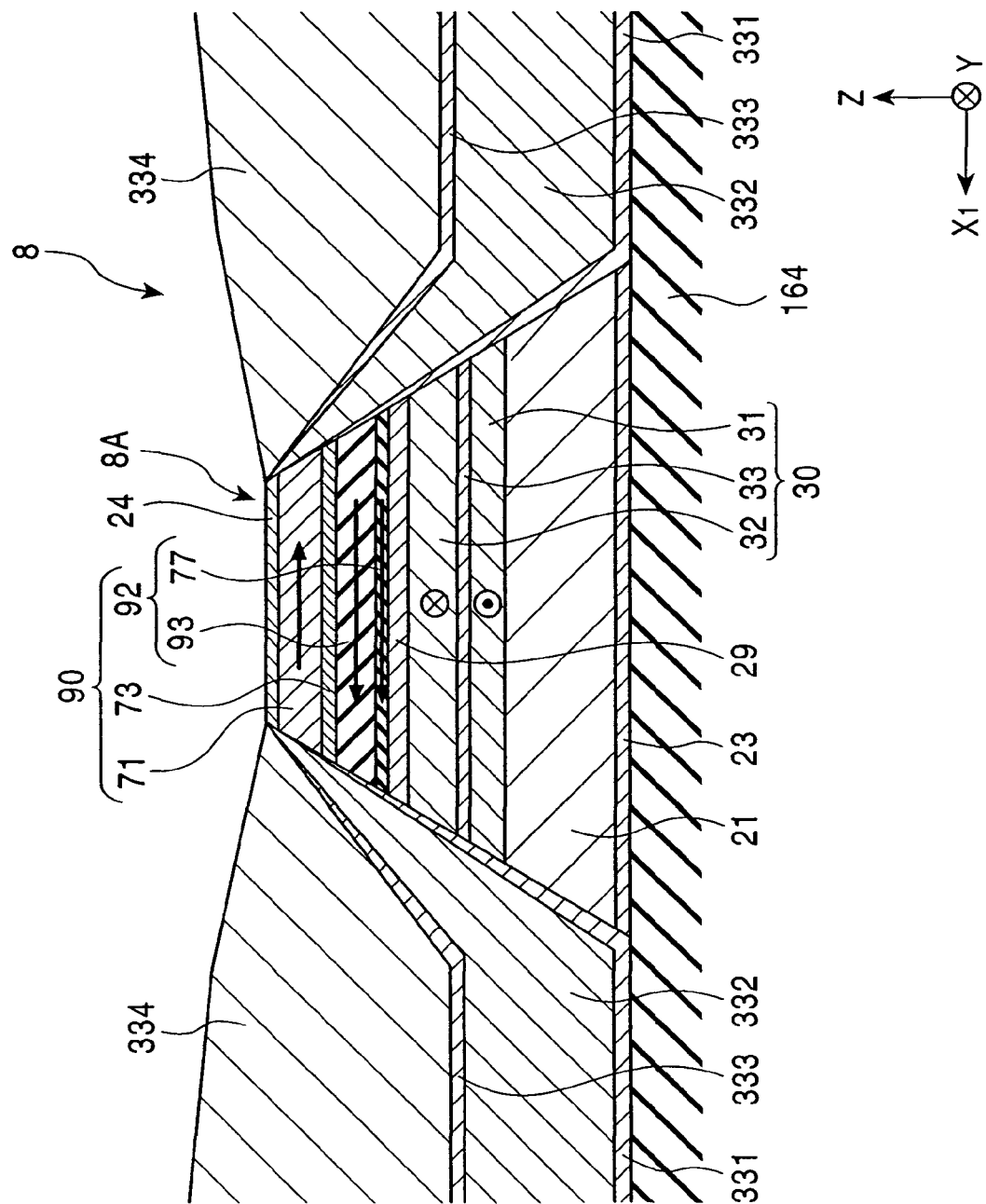
FIG. 18 is a schematic sectional view of a spin valve element according to an eighth embodiment of the present invention, as viewed from the magnetic recording medium side.

FIG. 18 is a schematic sectional view of a spin valve element 8 according to the eighth embodiment of the present invention, as viewed from the magnetic recording medium side.

The spin valve element 8 shown in FIG. 18 is a bottom-type single spin valve element in which an antiferromagnetic layer 21, a pinned magnetic layer 30, a nonmagnetic conductive layer 29, and a free magnetic layer 90 are laminated in turn.

In FIG. 18, reference numeral 164 denotes a lower gap layer, and reference numeral 23 denotes an underlying layer. The antiferromagnetic layer 21, the pinned magnetic layer 30, the nonmagnetic conductive layer 29, the free magnetic layer 90, and a capping layer 24 are laminated in turn on the underlying layer 23.

In this way, the layers from the underlying layer 23 to the capping layer 24 are laminated in turn to form a laminate 8A having a substantially trapezoidal sectional shape having a width corresponding to the track width.

The free magnetic layer 90 comprises a nonmagnetic intermediate layer 73, and first and second free magnetic layers 71 and 92 antiferromagnetically coupled with each other with the nonmagnetic intermediate layer 73 provided therebetween.

The antiferromagnetic layer 21, the first free magnetic layer 71, the nonmagnetic intermediate layer 73, the nonmagnetic conductive layer 29, the pinned magnetic layer 30 (the nonmagnetic layer 33 and first and second pinned magnetic layers 31 and 32), the bias underlying layers 331, the bias layers 332, the intermediate layers 333, and the electrode layers 334 shown in FIG. 18 have the same constructions and are made of the same materials as the antiferromagnetic layer, the first free magnetic layer, the nonmagnetic intermediate layer, the nonmagnetic conductive layer, the pinned magnetic layer (the nonmagnetic layer and first and second pinned magnetic layers), the bias underlying layers, the bias layers, the intermediate layers, and the electrode layers of the first, second, fifth or sixth embodiment. Therefore, description of these layers is omitted.

The spin valve element 8 is different from the spin valve element 6 of the sixth embodiment in that the second free magnetic layer 92 comprises two layers including a second ferromagnetic conductive film 93 and a second ferromagnetic insulting film 77.

Namely, the second free magnetic layer 92 comprises the second ferromagnetic conductive film 93 and the second ferromagnetic insulating film 77 which are formed in contact with the nonmagnetic intermediate layer 73 and the nonmagnetic conductive layer 29, respectively, and which are ferromagnetically coupled with each other to form the ferromagnetic state.

The second ferromagnetic insulating film 77 is ferromagnetic and has high resistivity. Examples of the ferromagnetic insulating film include a ferromagnetic insulating oxide film and a ferromagnetic insulating nitride film. The ferromagnetic insulating oxide film or ferromagnetic insulating nitride film is the same as the ferromagnetic insulating oxide film or ferromagnetic insulating nitride film which constitutes the first free magnetic layer of the spin valve element of the first embodiment.

The second ferromagnetic conductive film 93 is ferromagnetic and has low resistivity, and is made of, for example, any one of Co, a CoFe alloy, a NiFe alloy, a CoNi alloy, and a CoNiFe alloy.

The thickness of the second ferromagnetic conductive film 93 is preferably in the range of 1.5 to 4.5 nm, and the thickness u of the second ferromagnetic insulating film 77 is preferably in the range of 0.5 to 10 nm, and more preferably in the range of 1 to 10 nm.

The total thickness of the second free magnetic layer 92 is preferably in the range of 2.0 to 14.5 nm, and more preferably larger than the first free magnetic layer 71.

By setting the thickness u of the second ferromagnetic insulating film 77 in the range of 0.5 nm≦u≦10 nm, the up-spin conduction electrons moving from the nonmagnetic conductive layer 29 can be mostly mirror-reflected by the second ferromagnetic insulating film 77 without passing through the second ferromagnetic insulating film 77.

Also the second ferromagnetic insulating film 77 and the second ferromagnetic conductive film 93 are ferromagnetically coupled with each other to be put into the ferromagnetic state so that the magnetization direction of the entire second free magnetic layer 92 can be oriented in one direction. Namely, in FIG. 18, when the magnetization direction of the second free magnetic layer 92 is oriented in the $X_1$ direction by the bias layers 332, the magnetization direction of the entire first free magnetic layer 71 is oriented in the direction opposite to the $X_1$ direction. The magnetization of the second free magnetic layer 92 remains to orient the magnetization direction of the entire free magnetic layer 90 in the $X_1$ direction.

Therefore, the first and second free magnetic layers 71 and 92 are antiferromagnetically coupled with each other so that the magnetization directions are antiparallel to each other to bring both layers in a synthetic ferrimagnetic state (synthetic ferrimagnetic free).

Even with a small external magnetic field applied, the magnetization direction of the free magnetic layer 90 put into the ferrimagnetic state can thus be rotated according to the direction of the external magnetic field.

In addition, the second ferromagnetic insulating film 77 comprises the ferromagnetic insulating oxide film or ferromagnetic insulating nitride film having a resistivity of 4 to $2.0 \times 10^3$ μΩ·m, and thus exhibits higher resistivity than the nonmagnetic conductive layer 29 having a resistivity of about 0.3 μΩ·m. Therefore, a potential barrier is formed at the interface between the second ferromagnetic insulating film 77 and the nonmagnetic conductive layer 29.

Of the conduction electrons moving in the nonmagnetic conductive layer 29, up-spin conduction electrons are mirror-reflected by the potential barrier while maintaining the spin direction.

The up-spin conduction electrons are mirror-reflected by the second ferromagnetic insulating film 77 to extend the mean free path. Like in the first embodiment, therefore, the difference between the mean free paths of the up-spin conduction electrons and the down-spin conduction electrons can be increased to increase the rate of change in magnetoresistance of the spin valve element 8.

The spin valve element 8 is manufactured by substantially the same method as the spin valve element 6 of the sixth embodiment except that the second free magnetic layer 92 comprises the second ferromagnetic insulating film 77 and the second ferromagnetic conductive film 93.

The spin valve element 8 exhibits not only the same effect as the spin valve element 6 of the sixth embodiment, but also the following effect.

In the spin valve element 8, the second ferromagnetic conductive film 93 is formed in contact with the nonmagnetic intermediate layer 73, and thus the first and second free magnetic layers 71 and 92 can be securely antiferromagnetically coupled with each other to bring both layers into the ferrimagnetic state. Therefore, the sensitivity to the external magnetic field can be further increased.

Ninth Embodiment

A ninth embodiment of the present invention will be described with reference to the drawings.

Figure 19:
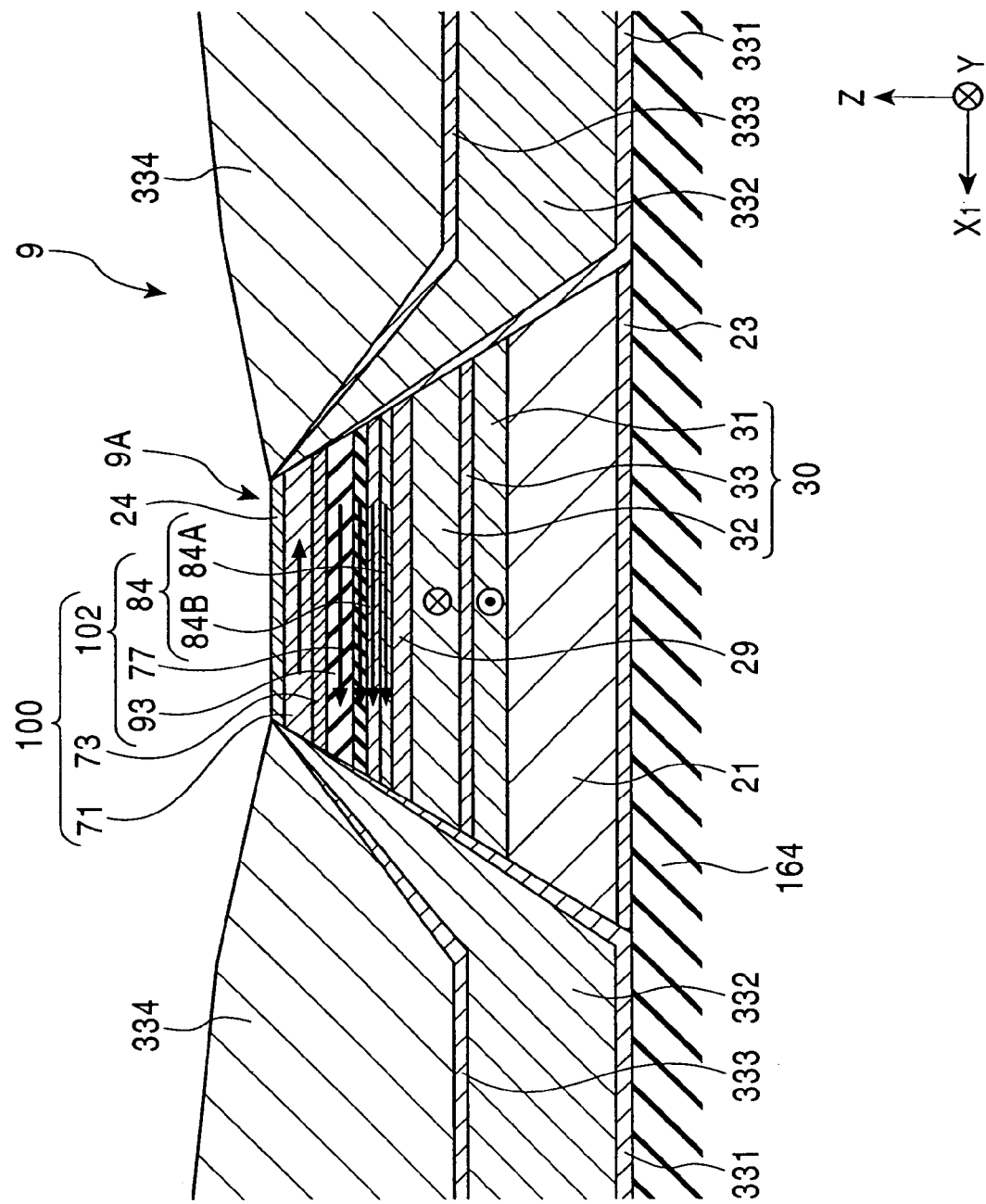
FIG. 19 is a schematic sectional view of a spin valve element according to a ninth embodiment of the present invention, as viewed from the magnetic recording medium side.

FIG. 19 is a schematic sectional view of a spin valve element 9 according to the ninth embodiment of the present invention, as viewed from the magnetic recording medium side.

The spin valve element 9 shown in FIG. 19 is a bottom-type single spin valve element in which an antiferromagnetic layer 21, a pinned magnetic layer 30, a nonmagnetic conductive layer 29, and a free magnetic layer 100 are laminated in turn.

In FIG. 19, reference numeral 164 denotes a lower gap layer, and reference numeral 23 denotes an underlying layer. The antiferromagnetic layer 21, the pinned magnetic layer 30, the nonmagnetic conductive layer 29, the free magnetic layer 100, and a capping layer 24 are laminated in turn on the underlying layer 23.

In this way, the layers from the underlying layer 23 to the capping layer 24 are laminated in turn to form a laminate 9A having a substantially trapezoidal sectional shape having a width corresponding to the track width.

The free magnetic layer 100 comprises a nonmagnetic intermediate layer 73, and first and second free magnetic layers 71 and 102 antiferromagnetically coupled with each other with the nonmagnetic intermediate layer 73 provided therebetween.

The antiferromagnetic layer 21, the first free magnetic layer 71, the nonmagnetic intermediate layer 73, the non-magnetic conductive layer 29, the pinned magnetic layer 30 (the nonmagnetic layer 33 and first and second pinned magnetic layers 31 and 32), the bias underlying layers 331, the bias layers 332, the intermediate layers 333, and the electrode layers 334 shown in FIG. 19 have the same constructions and are made of the same materials as the antiferromagnetic layer, the first free magnetic layer, the nonmagnetic intermediate layer, the nonmagnetic conductive layer, the pinned magnetic layer (the nonmagnetic layer and first and second pinned magnetic layers), the bias underlying layers, the bias layers, the intermediate layers, and the electrode layers of the first, second, fifth or sixth embodiment. Therefore, description of these layers is omitted.

The spin valve element 9 is different from the spin valve element 6 of the sixth embodiment in that the second free magnetic layer 102 comprises a second ferromagnetic conductive film 93, a second ferromagnetic insulting film 77, and a third ferromagnetic conductive film 84, and in that the third ferromagnetic conductive film 84 comprises an anti-diffusion film 84A and a ferromagnetic film 84B.

Namely, the second free magnetic layer 102 comprises the second ferromagnetic conductive film 93, the second ferromagnetic insulating film 77, and the third ferromagnetic conductive film 84. The second and third ferromagnetic conductive films 93 and 84 are formed in contact with the nonmagnetic intermediate layer 73 and the nonmagnetic conductive layer 29, respectively. The second ferromagnetic insulating film 77 is held between the second and third ferromagnetic conductive films 93 and 84, and the second ferromagnetic insulating film 77 and the second and third ferromagnetic conductive films 93 an 84 are ferromagnetically coupled with each other to form the ferromagnetic state.

Like the second ferromagnetic conductive film of the eighth embodiment, the second ferromagnetic conductive film 93 is ferromagnetic and has low resistivity, and is made of, for example, any one of Co, a CoFe alloy, a NiFe alloy, a CoNi alloy, and a CoNiFe alloy.

The second ferromagnetic insulating film 77 is ferromagnetic and has high resistivity. Examples of the ferromagnetic insulating film include a ferromagnetic insulating oxide film and a ferromagnetic insulating nitride film. The ferromagnetic insulating oxide film or ferromagnetic insulating nitride film is the same as the ferromagnetic insulating oxide film or ferromagnetic insulating nitride film which constitutes the first free magnetic layer of the spin valve element of the first embodiment.

Like the third ferromagnetic conductive film of the seventh embodiment, the third ferromagnetic conductive film 84 comprises an anti-diffusion film 84A and a ferromagnetic film 84B, which are ferromagnetic and have low resistivity. The anti-diffusion film 84A and a ferromagnetic film 84B are formed in contact with the nonmagnetic conductive layer 29 and the second ferromagnetic insulating film 77, respectively, and are ferromagnetically coupled with each other to bring both films into the ferromagnetic state.

The anti-diffusion film 84A comprises a ferromagnetic conductive film of Co or the like, and prevents mutual diffusion between the ferromagnetic film 84B and the nonmagnetic conductive layer 29.

The ferromagnetic film 84B comprises a ferromagnetic conductive film made of, for example, any one of Co, a CoFe alloy, a NiFe alloy, a CoNi alloy, and a CoNiFe alloy, preferably a NiFe alloy.

Like the third ferromagnetic conductive film of the sixth embodiment, the third ferromagnetic conductive film 84 may comprise a single ferromagnetic conductive film made of any one of Co, a CoFe alloy, a NiFe alloy, a CoNi alloy, and a CoNiFe alloy.

The thickness of the second ferromagnetic conductive film 93 is preferably in the range of 0.5 to 2.0 nm, and the thickness u of the second ferromagnetic insulating film 77 is preferably in the range of 0.5 to 10 nm, and more preferably in-the range of 1 to 10 nm.

The thickness of the anti-diffusion film 84A is preferably in the range of 0.1 to 1.5 nm, the thickness of the ferromagnetic film 84B is preferably in the range of 1.4 to 4.5 nm, and the thickness of the third ferromagnetic conductive film 84 is preferably in the range of 1.5 to 6.0 nm.

The total thickness of the second free magnetic layer 102 is preferably in the range of 2.5 to 18.0 nm, and more preferably larger than the first free magnetic layer 71.

By setting the thickness u of the second ferromagnetic insulating film 77 in the range of 0.5 nm≦u≦10 nm, the up-spin conduction electrons moving from the nonmagnetic conductive layer 29 can be mostly mirror-reflected by the second ferromagnetic insulating film 77 without passing through the second ferromagnetic insulating film 77.

Also the second ferromagnetic insulating film 77 and the second and third ferromagnetic conductive films 93 and 84 are ferromagnetically coupled with each other to be put into the ferromagnetic state so that the magnetization direction of the entire second free magnetic layer 102 can be oriented in one direction. Namely, in FIG. 19, when the magnetization direction of the second free magnetic layer 102 is oriented in the $X_1$ direction by the bias layers 332, the magnetization direction of the first free magnetic layer 71 is oriented in the direction opposite to the $X_1$ direction. The magnetization of the second free magnetic layer 102 remains to orient the magnetization direction of the entire free magnetic layer 100 in the $X_1$ direction.

Therefore, the first and second free magnetic layers 71 and 102 are antiferromagnetically coupled with each other so that the magnetization directions are antiparallel to each other to bring both layers in a synthetic ferrimagnetic state (synthetic ferrimagnetic free).

Even with a small external magnetic field applied, the magnetization direction of the free magnetic layer 100 put into the ferrimagnetic state can thus be rotated according to the direction of the external magnetic field.

In addition, the second ferromagnetic insulating film 77 comprises a ferromagnetic insulating oxide film or ferromagnetic insulating nitride film having a resistivity of 4 to $2.0 \times 10^3$ μΩ·m, and thus exhibits higher resistivity than the third ferromagnetic conductive film 84. Therefore, a potential barrier is formed at the interface between the second ferromagnetic insulating film 77 and the third nonmagnetic conductive film 84.

Of the conduction electrons moving in the nonmagnetic conductive layer 29, up-spin conduction electrons are mirror-reflected by the potential barrier while maintaining the spin direction.

The up-spin conduction electrons are mirror-reflected by the second ferromagnetic insulating film 77 to extend the mean free path. Like in the first embodiment, therefore, the difference between the mean free paths of the up-spin conduction electrons and the down-spin conduction electrons can be increased to increase the rate of change in magnetoresistance of the spin valve element 9.

The spin valve element 9 is manufactured by substantially the same method as the spin valve element 6 of the sixth embodiment except that the second free magnetic layer 102 comprises the second ferromagnetic insulating film 77 and the second and third ferromagnetic conductive films 93 and 84, and that the third ferromagnetic conductive film 84 comprises the anti-diffusion film 84A and the ferromagnetic film 84B.

The spin valve element 9 exhibits not only the same effect as the spin valve element 6 of the sixth embodiment, but also the following effect.

In the spin valve element 9, the second ferromagnetic conductive film 93 is formed in contact with the nonmagnetic intermediate layer 73, and thus the first and second free magnetic layers 71 and 102 can be securely antiferromagnetically coupled with each other to bring both layers into the ferrimagnetic state. Therefore, the sensitivity to the external magnetic field can be further increased.

Also the third ferromagnetic conductive film 84 is formed in contact with the nonmagnetic conductive layer 29, and thus the greater giant magnetoresistive effect can be manifested at the interface between the third ferromagnetic conductive film 84 and the nonmagnetic conductive layer 29, thereby further increasing the rate of change in magnetoresistance.

Furthermore, the third ferromagnetic conductive film 84 comprises the anti-diffusion film 84A and the ferromagnetic film 84B to prevent mutual diffusion between the ferromagnetic film 84B and the nonmagnetic conductive layer 29. Therefore, the greater giant magnetoresistive effect can be manifested at the interface between the nonmagnetic conductive layer 29 and the anti-diffusion film 84A, thereby increasing the rate of change in magnetoresistance.

Tenth Embodiment

A tenth embodiment of the present invention will be described with reference to the drawings.

Figure 20:
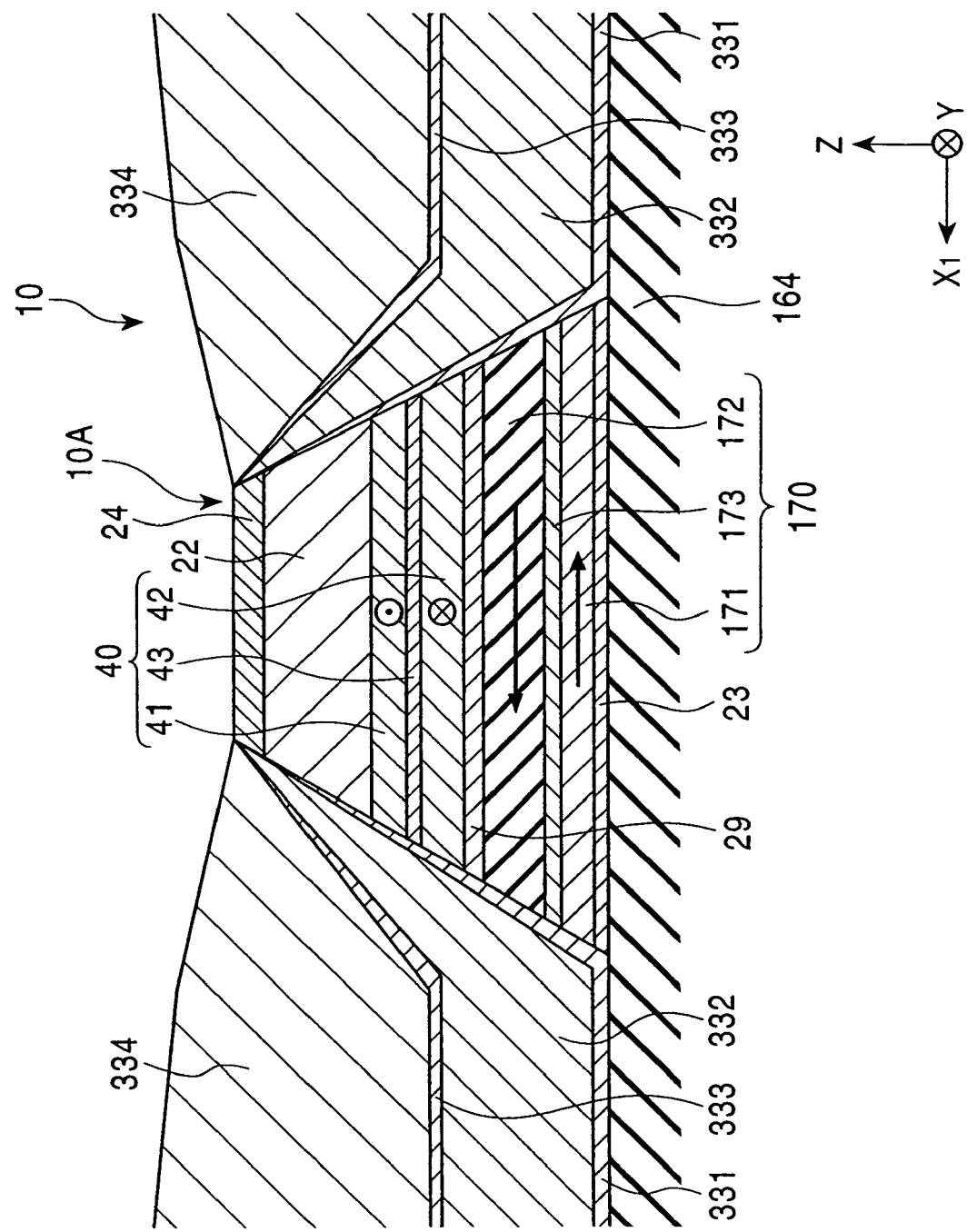
FIG. 20 is a schematic sectional view of a spin valve element according to a tenth embodiment of the present invention, as viewed from the magnetic recording medium side.

FIG. 20 is a schematic sectional view of a spin valve element 10 according to the tenth embodiment of the present invention, as viewed from the magnetic recording medium side.

The spin valve element 10 shown in FIG. 20 is a top-type single spin valve element in which a free magnetic layer 170, a nonmagnetic conductive layer 29, a pinned magnetic layer 40, and an antiferromagnetic layer 22 are laminated in turn.

In FIG. 20, reference numeral 164 denotes a lower gap layer, and reference numeral 23 denotes an underlying layer. The free magnetic layer 170, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 10A having a substantially trapezoidal sectional shape having a width corresponding to the track width.

The antiferromagnetic layer 22, the nonmagnetic conductive layer 29, the pinned magnetic layer 40 (the nonmagnetic layer 43 and first and second pinned magnetic layers 41 and 42), the bias underlying layers 331, the bias layers 332, the intermediate layers 333, and the electrode layers 334 shown in FIG. 20 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the third or fourth embodiment. Therefore, description of these layers is omitted.

The free magnetic layer 170 comprises a nonmagnetic intermediate layer 173, and first and second free magnetic layers 171 and 172 antiferromagnetically coupled with each other with the nonmagnetic intermediate layer 173 provided therebetween to bring both layers in the ferrimagnetic state.

The first free magnetic layer 171 comprises a ferromagnetic conductive film made of, for example, any one of Co, a CoFe alloy, a NiFe alloy, a CoNi alloy, and a CoNiFe alloy, preferably a NiFe alloy.

The thickness of the first free magnetic layer 171 is preferably in the range of 0.5 to 3.5 nm.

The nonmagnetic intermediate layer 173 is preferably made of a nonmagnetic conductive material of one of Ru, Rh, Ir, Cr, Re and Cu, or an alloy thereof, more preferably Ru.

The second free magnetic layer 172 comprises a ferromagnetic insulating film which is ferromagnetic and has high resistivity. Examples of the ferromagnetic insulating film include a ferromagnetic insulating oxide film and a ferromagnetic insulating nitride film. The ferromagnetic insulating oxide film or ferromagnetic insulating nitride film is the same as the ferromagnetic insulating oxide film or ferromagnetic insulating nitride film which constitutes the first free magnetic layer of the spin valve element of the first embodiment.

The thickness of the second free magnetic layer 172 is preferably in the range of 1.5 to 4.5 nm, and more preferably larger than the first free magnetic layer 171.

The second free magnetic layer 172 is ferromagnetic, and is thus ferromagnetically coupled with the first free magnetic layer 171 with the nonmagnetic intermediate layer 173 provided therebetween.

Therefore, when the magnetization direction of the second free magnetic layer 172 is oriented in the $X_1$ direction by the bias layers 332, the magnetization direction of the first free magnetic layer 171 is oriented in the direction opposite to the $X_1$ direction. The magnetization of the second free magnetic layer 172 remains to orient the magnetization direction of the entire free magnetic layer 170 in the $X_1$ direction.

Therefore, the first and second free magnetic layers 171 and 172 are antiferromagnetically coupled with each other so that the magnetization directions are antiparallel to each other to bring both layers in a synthetic ferrimagnetic state (synthetic ferrimagnetic free).

Even with a small external magnetic field applied, the magnetization direction of the free magnetic layer 170 put into the ferrimagnetic state can thus be rotated according to the direction of the external magnetic field.

In addition, the second free magnetic layer 172 comprises a ferromagnetic insulating oxide film or ferromagnetic insulating nitride film having a resistivity of 4 to $2.0 \times 10^3$ μΩ·m, and thus exhibits higher resistivity than the first free magnetic layer 171, the nonmagnetic intermediate layer 173 or the nonmagnetic conductive layer 29. Therefore, a potential barrier is formed at the interface between the second free magnetic layer 172 and the nonmagnetic conductive layer 29 due to a large difference in resistivity between the second free magnetic layer 172 and the nonmagnetic conductive layer 29.

Of the conduction electrons moving in the nonmagnetic conductive layer 29, up-spin conduction electrons are mirror-reflected by the potential barrier while maintaining the spin direction, while the down-spin conduction electrons are scattered without maintaining the spin direction. Therefore, the second free magnetic layer 172 comprising the ferromagnetic insulating oxide film mirror-reflects only the up-spin conduction electrons.

The up-spin conduction electrons are mirror-reflected by the second free magnetic layer 172 to extend the mean free path.

Namely, the up-spin conduction electrons quite possibly move from the pinned magnetic layer 40 to the second free magnetic layer 172 through the nonmagnetic conductive layer 29 when the magnetization directions of the pinned magnetic layer 40 and the free magnetic layer 170 are made parallel by the external magnetic field.

The up-spin conduction electrons are mirror-reflected at the interface between the second free magnetic layer 172 and the nonmagnetic conductive layer 29 while maintaining the spin state, and again move through the nonmagnetic conductive layer 29 and the pinned magnetic layer 40.

In this way, the up-spin conduction electrons move through the nonmagnetic conductive layer 29 and the pinned magnetic layer 40 twice each to significantly extend the mean free path.

On the other hand, the down-spin conduction electrons have the high probability that they are always scattered at the interface between the nonmagnetic conductive layer 29 and the second free magnetic layer 172, and the mean free path is cut off at the time the down-spin conduction electrons are scattered by the second free magnetic layer 172. Therefore, the mean free path of the down-spin conduction electrons remains shorter than the mean free path of the up-spin conduction electrons.

In this way, in the spin valve element 10 of this embodiment, the difference between the mean free paths of the up-spin conduction electrons and the down-spin conduction electrons is increased by the mirror-reflecting effect, thereby significantly improving the rate of change in magnetoresistance of the spin valve element 10.

The spin valve element 10 is manufactured by substantially the same method as the spin valve element 3 of the third embodiment except that the second free magnetic layer 172 comprises the ferromagnetic insulating film, and the first free magnetic layer 171 comprises the ferromagnetic conductive film.

The spin valve element 9 exhibits substantially the same effect as the spin valve element 5 of the fifth embodiment.

Eleventh Embodiment

An eleventh embodiment of the present invention will be described with reference to the drawings.

Figure 21:
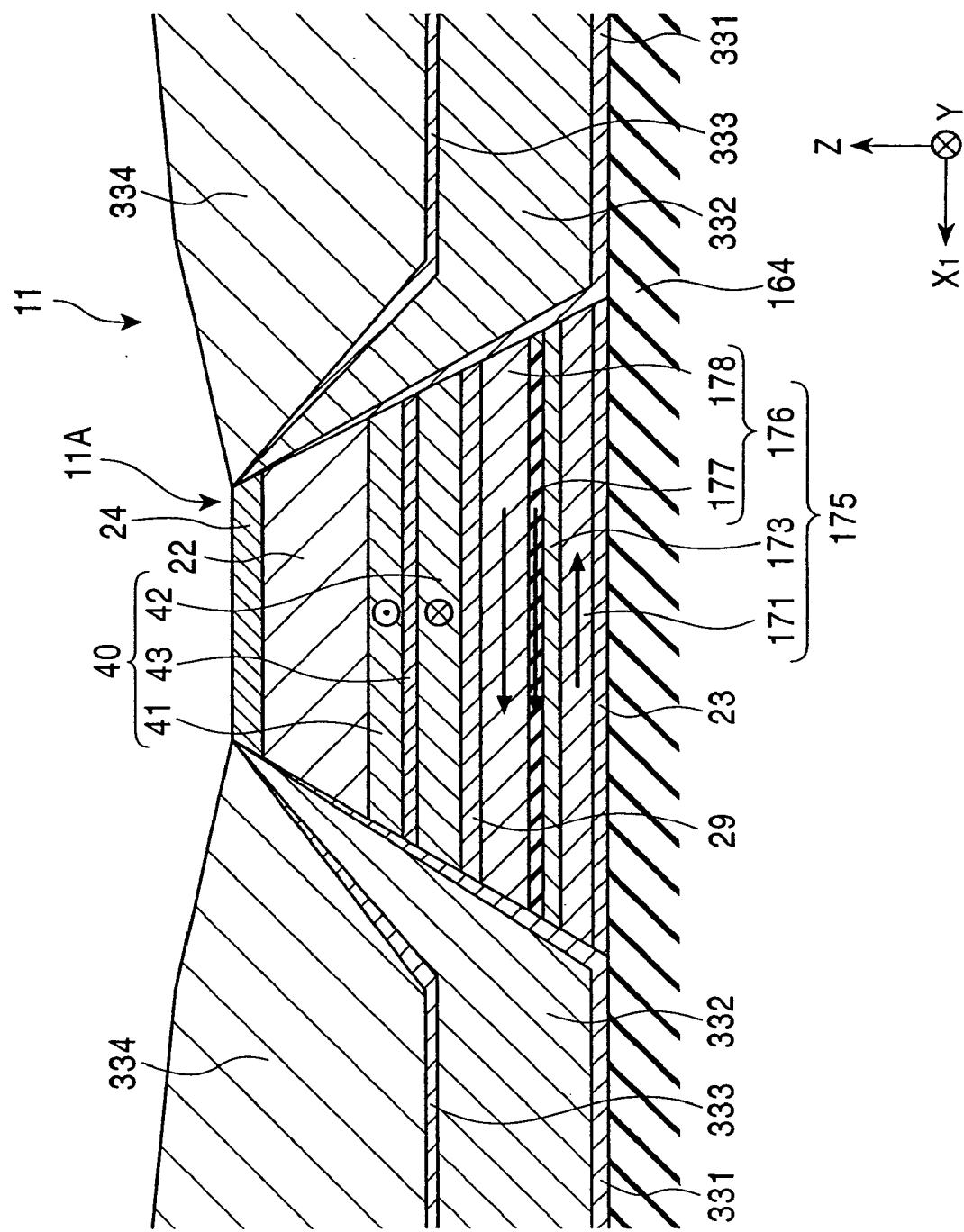
FIG. 21 is a schematic sectional view of a spin valve element according to an eleventh embodiment of the present invention, as viewed from the magnetic recording medium side.

FIG. 21 is a schematic sectional view of a spin valve element 11 according to the eleventh embodiment of the present invention, as viewed from the magnetic recording medium side.

The spin valve element 11 shown in FIG. 21 is a top-type single spin valve element in which a free magnetic layer 175, a nonmagnetic conductive layer 29, a pinned magnetic layer 40, and an antiferromagnetic layer 22 are laminated in turn.

In FIG. 20, reference numeral 164 denotes a lower gap layer, and reference numeral 23 denotes an underlying layer. The free magnetic layer 175, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 11A having a substantially trapezoidal sectional shape having a width corresponding to the track width.

The antiferromagnetic layer 22, the nonmagnetic conductive layer 29, the pinned magnetic layer 40 (the nonmagnetic layer 43 and first and second pinned magnetic layers 41 and 42), the bias underlying layers 331, the bias layers 332, the intermediate layers 333, and the electrode layers 334 shown in FIG. 20 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the third or fourth embodiment. Therefore, description of these layers is omitted.

The free magnetic layer 175 comprises a nonmagnetic intermediate layer 173, and first and second free magnetic layers 171 and 176 antiferromagnetically coupled with each other with the nonmagnetic intermediate layer 173 provided therebetween to bring both layers in the ferrimagnetic state.

The first free magnetic layer 171 and the nonmagnetic intermediate layer 173 have the same constructions and are made of the same materials as the first free magnetic layer and the nonmagnetic intermediate layer of the tenth embodiment.

The second free magnetic layer 176 comprises a lamination of a second ferromagnetic insulating film 177 and a third ferromagnetic conductive film 178. The second ferromagnetic insulating film 177 and the third ferromagnetic conductive film 178 are formed in contact with the nonmagnetic intermediate layer 173 and the nonmagnetic conductive layer 29, respectively. The second ferromagnetic insulating film 177 and the third ferromagnetic conductive film 178 are ferromagnetically coupled with each other to bring both films into the ferromagnetic state.

The second ferromagnetic insulating film 177 is ferromagnetic and has high resistivity. Examples of the ferromagnetic insulating film include a ferromagnetic insulating oxide film and a ferromagnetic insulating nitride film. The ferromagnetic insulating film is the same as the ferromagnetic insulating oxide film or ferromagnetic insulating nitride film, which constitutes the first free magnetic layer of the spin valve element of the first embodiment.

The third ferromagnetic conductive film is ferromagnetic, has low resistivity, and is made of, for example, any one of Co, a CoFe alloy, a NiFe alloy, a CoNi alloy, and a CoNiFe alloy.

The thickness u of the second ferromagnetic insulating film 177 is preferably in the range of 0.5 to 10 nm, more preferably in the range of 1 to 10 nm. The thickness of the third ferromagnetic conductive film 178 is preferably in the range of 1.5 to 4.5 nm.

The thickness of the second free magnetic layer 176 is preferably in the range of 2.0 to 14.5 nm, and more preferably larger than the first free magnetic layer 171.

By setting the thickness u of the second ferromagnetic insulating film 177 in the range of 0.5 nm $\leq$ u $\leq$ 10 nm, the up-spin conduction electrons moving from the nonmagnetic conductive layer 29 can be mostly mirror-reflected by the second ferromagnetic insulating film 177 without passing through the second ferromagnetic insulating film 177.

The second ferromagnetic insulating film 177 and the third ferromagnetic conductive film 178 are ferromagnetically coupled with each other to bring both films into the ferromagnetic state, and thus the magnetization direction of the second free magnetic layer 176 can be oriented in one direction. Namely, in FIG. 21, when the magnetization direction of the second free magnetic layer 176 is oriented in the $X_1$ direction by the bias layers 332, the magnetization direction of the entire first free magnetic layer 171 is oriented in the direction opposite to the $X_1$ direction. The magnetization of the second free magnetic layer 176 remains to orient the magnetization direction of the entire free magnetic layer 175 in the $X_1$ direction.

Therefore, the first and second free magnetic layers 171 and 176 are antiferromagnetically coupled with each other so that the magnetization directions are antiparallel to each other to bring both layers in a synthetic ferrimagnetic state (synthetic ferrimagnetic free).

Even with a small external magnetic field applied, the magnetization direction of the free magnetic layer 175 put into the ferrimagnetic state can thus be rotated according to the direction of the external magnetic field.

In addition, the second ferromagnetic insulating film 177 which constitutes the second free magnetic layer 176 comprises a ferromagnetic insulating oxide film or ferromagnetic insulating nitride film having a resistivity of 4 to $2.0 \times 10^3$ $\mu\Omega \cdot m$, and thus exhibits higher resistivity than the third ferromagnetic conductive film 178. Therefore, a potential barrier is formed at the interface between the second ferromagnetic insulating film 177 and the third ferromagnetic conductive film 178.

Of the conduction electrons moving in the nonmagnetic conductive layer 29, up-spin conduction electrons are mirror-reflected by the potential barrier while maintaining the spin direction.

The up-spin conduction electrons are mirror-reflected by the second ferromagnetic insulating film 177 to extend the mean free path.

Namely, the up-spin conduction electrons quite possibly move from the pinned magnetic layer 40 to the second ferromagnetic insulating oxide film 177 through the nonmagnetic conductive layer 29 when the magnetization directions of the pinned magnetic layer 40 and the free magnetic layer 175 are made parallel by the external magnetic field.

The up-spin conduction electrons are mirror-reflected at the interface between the second ferromagnetic insulating film 177 and the third ferromagnetic conductive film 178 while maintaining the spin state, and again move through the third ferromagnetic conductive film 178, the nonmagnetic conductive layer 29 and the pinned magnetic layer 40.

In this way, the up-spin conduction electrons move through the nonmagnetic conductive layer 29 and the pinned magnetic layer 40 twice each to significantly extend the mean free path.

In this way, like in the first embodiment, in the spin valve element 11 of this embodiment, the difference between the mean free paths of the up-spin conduction electrons and the down-spin conduction electrons is increased by the mirror-reflecting effect, thereby significantly improving the rate of change in magnetoresistance of the spin valve element 11.

Also the third ferromagnetic conductive film 178 is formed in contact with the nonmagnetic conductive layer 29, and thus the greater giant magnetoresistive effect can be manifested at the interface between the third ferromagnetic conductive film 178 and the nonmagnetic conductive layer 29.

The spin valve element 11 is manufactured by substantially the same method as the spin valve element 3 of the third embodiment except that the second free magnetic layer 176 comprises the second ferromagnetic insulating film 177 and the second ferromagnetic conductive film 178, and the first free magnetic layer 171 comprises the ferromagnetic conductive film.

The spin valve element 11 exhibits substantially the same effect as the spin valve element 6 of the sixth embodiment.

Twelfth Embodiment

A twelfth embodiment of the present invention will be described with reference to the drawings.

Figure 22:
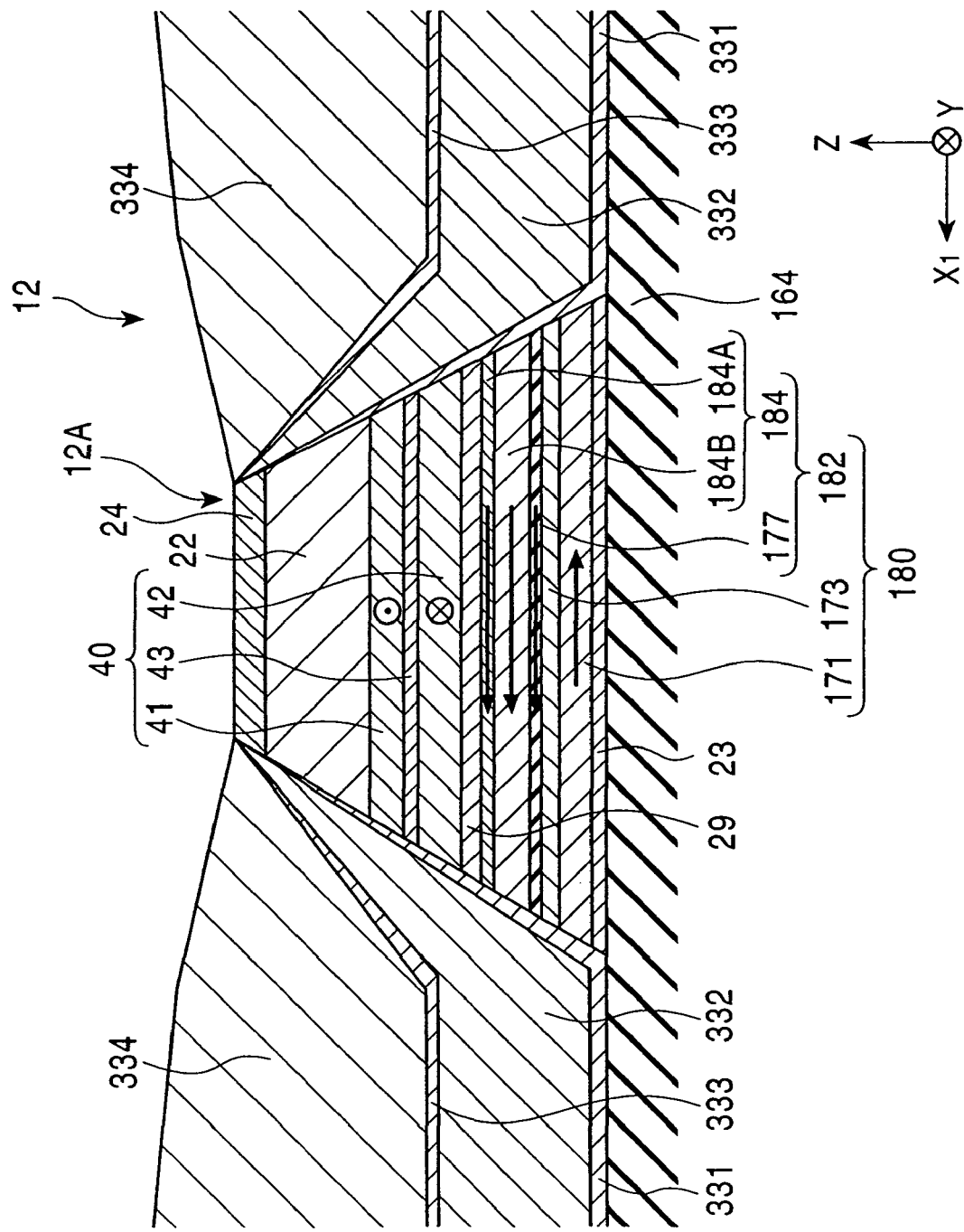
FIG. 22 is a schematic sectional view of a spin valve element according to a twelfth embodiment of the present invention, as viewed from the magnetic recording medium side.

FIG. 22 is a schematic sectional view of a spin valve element 12 according to the twelfth embodiment of the present invention, as viewed from the magnetic recording medium side.

The spin valve element 12 shown in FIG. 22 is a top-type single spin valve element in which a free magnetic layer 180, a nonmagnetic conductive layer 29, a pinned magnetic layer 40, and an antiferromagnetic layer 22 are laminated in turn.

In FIG. 22, reference numeral 164 denotes a lower gap layer, and reference numeral 23 denotes an underlying layer.

The free magnetic layer 180, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 12A having a substantially trapezoidal sectional shape having a width corresponding to the track width.

The free magnetic layer 180 comprises a nonmagnetic intermediate layer 173, and first and second free magnetic layers 171 and 182 antiferromagnetically coupled with each other with the nonmagnetic intermediate layer 173 provided therebetween.

The second free magnetic layer 182 comprises a second ferromagnetic insulating film 177 and a third ferromagnetic conductive film 184.

The antiferromagnetic layer 22, the first free magnetic layer 171, the nonmagnetic intermediate layer 173, the nonmagnetic conductive layer 29, the pinned magnetic layer 40 (the nonmagnetic layer 43 and first and second pinned magnetic layers 41 and 42), the bias underlying layers 331, the bias layers 332, the intermediate layers 333, and the electrode layers 334 shown in FIG. 22 have the same constructions and are made of the same materials as the antiferromagnetic layer, the first free magnetic layer, the nonmagnetic intermediate layer, the nonmagnetic conductive layer, the pinned magnetic layer (the nonmagnetic layer and first and second pinned magnetic layers), the bias underlying layers, the bias layers, the intermediate layers, and the electrode layers of the second or third embodiment. Therefore, description of these layers is omitted.

The spin valve element 12 is different from the spin valve element 11 of the eleventh embodiment only in that the third ferromagnetic conductive film 184 constituting the second free magnetic layer 182 comprises an anti-diffusion film 184A and a ferromagnetic film 184B.

Namely, the third ferromagnetic conductive film 184 comprises the anti-diffusion film 184A and the ferromagnetic film 184B which are formed in contact with the nonmagnetic conductive layer 29 and the second ferromagnetic insulating film 177, respectively.

The anti-diffusion film 184A comprises a ferromagnetic conductive film of Co or the like, and prevents mutual diffusion between the ferromagnetic film 184B and the nonmagnetic conductive layer 29.

Like the anti-diffusion film 184A, the ferromagnetic film 184B comprises a ferromagnetic conductive film made of, for example, any one of Co, a CoFe alloy, a NiFe alloy, a CoNi alloy, and a CoNiFe alloy, preferably a NiFe alloy.

The thickness of the anti-diffusion film 184A is preferably in the range of 0.1 to 1.5 nm, and the thickness of the ferromagnetic film 184B is preferably in the range of 1.4 to 4.5 nm.

The thickness of the entire second free magnetic layer 182 is preferably in the range of 1.5 to 6.0 nm, and more preferably larger than the first free magnetic layer 171.

The anti-diffusion film 184A, the ferromagnetic film 184B and the second ferromagnetic insulating film 177 are ferromagnetically coupled with each other to bring the films into the ferromagnetic state, and thus the magnetization direction of the second free magnetic layer 182 can be oriented in one direction. Namely, in FIG. 22, when the magnetization direction of the second free magnetic layer 182 is oriented in the $X_1$ direction by the bias layers 332, the magnetization direction of the entire first free magnetic layer 171 is oriented in the direction opposite to the $X_1$ direction. The magnetization of the second free magnetic layer 182 remains to orient the magnetization direction of the entire free magnetic layer 180 in the $X_1$ direction to form the ferrimagnetic state.

The spin valve element 12 is manufactured by substantially the same method as the spin valve element 11 of the eleventh embodiment except that the third ferromagnetic conductive film 184 comprises the anti-diffusion film 184A and the ferromagnetic film 184B.

The spin valve element 12 exhibits substantially the same effect as the spin valve element 7 of the seventh embodiment.

Thirteenth Embodiment

A thirteenth embodiment of the present invention will be described with reference to the drawings.

Figure 23:
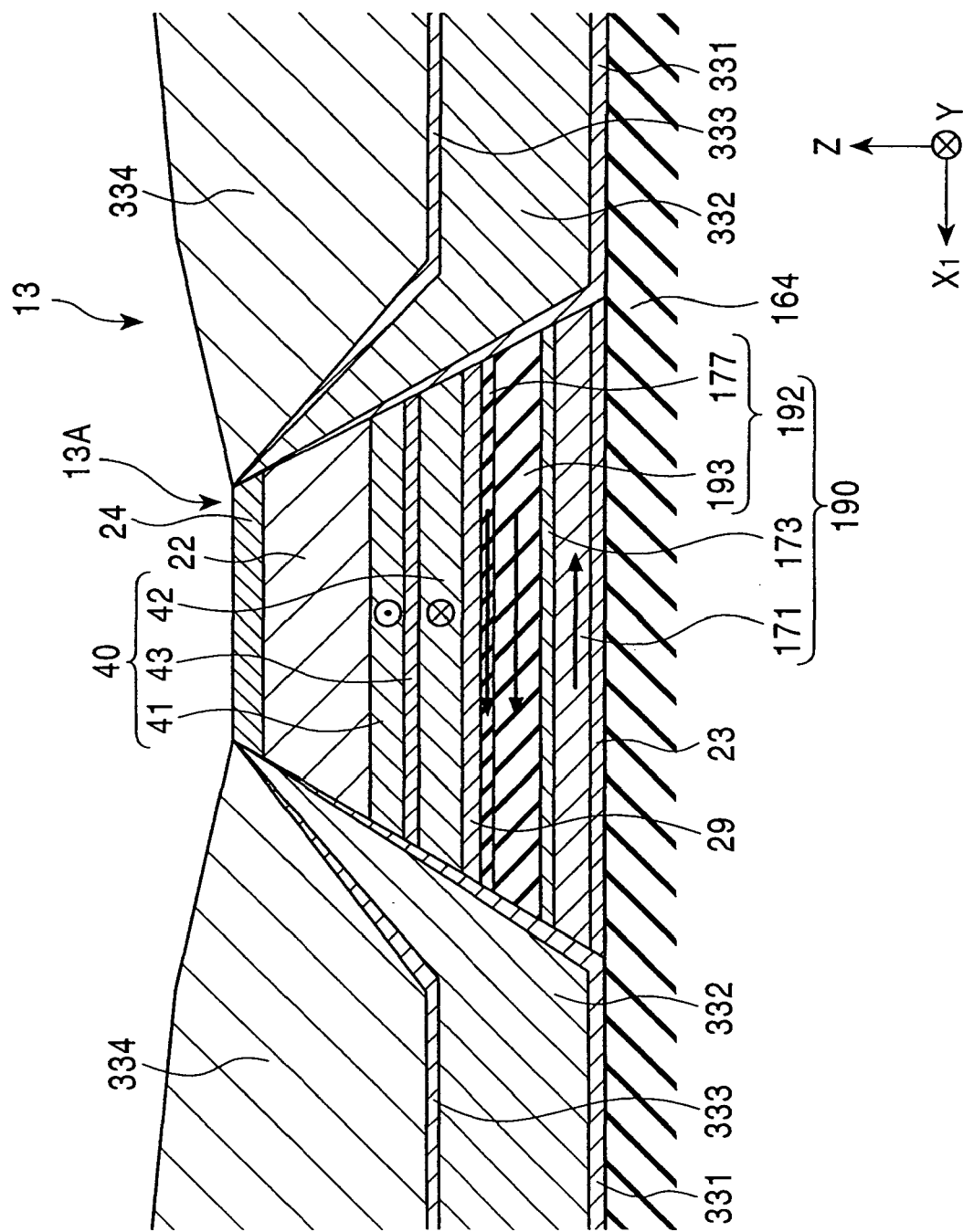
FIG. 23 is a schematic sectional view of a spin valve element according to a thirteenth embodiment of the present invention, as viewed from the magnetic recording medium side.

FIG. 23 is a schematic sectional view of a spin valve element 13 according to the thirteenth embodiment of the present invention, as viewed from the magnetic recording medium side.

The spin valve element 13 shown in FIG. 23 is a top-type single spin valve element in which a free magnetic layer 190, a nonmagnetic conductive layer 29, a pinned magnetic layer 40, and an antiferromagnetic layer 22 are laminated in turn.

In FIG. 23, reference numeral 164 denotes a lower gap layer, and reference numeral 23 denotes an underlying layer. The free magnetic layer 190, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 13A having a substantially trapezoidal sectional shape having a width corresponding to the track width.

The free magnetic layer 190 comprises a nonmagnetic intermediate layer 173, and first and second free magnetic layers 171 and 192 with the nonmagnetic intermediate layer 173 provided therebetween.

The antiferromagnetic layer 22, the first free magnetic layer 171, the nonmagnetic intermediate layer 173, the nonmagnetic conductive layer 29, the pinned magnetic layer 40 (the nonmagnetic layer 43 and first and second pinned magnetic layers 41 and 42), the bias underlying layers 331, the bias layers 332, the intermediate layers 333, and the electrode layers 334 shown in FIG. 23 have the same constructions and are made of the same materials as the antiferromagnetic layer, the first free magnetic layer, the nonmagnetic intermediate layer, the nonmagnetic conductive layer, the pinned magnetic layer (the nonmagnetic layer and first and second pinned magnetic layers), the bias underlying layers, the bias layers, the intermediate layers, and the electrode layers of the third or fourth embodiment. Therefore, description of these layers is omitted.

The spin valve element 13 is different from the spin valve element 11 of the eleventh embodiment only in that the second free magnetic layer 192 comprises three layers of a second ferromagnetic conductive film 193, a second ferromagnetic insulating film 177 and a third ferromagnetic conductive film 178.

The second free magnetic layer 192 comprises the second ferromagnetic conductive film 193 and the second ferromagnetic insulating film 177 which are formed in contact with the nonmagnetic intermediate layer 173 and the nonmagnetic conductive layer 29, respectively, and which are brought into the ferromagnetic state by ferromagnetic coupling.

The second ferromagnetic insulating film 177 is ferromagnetic and has high resistivity. Examples of such a ferromagnetic insulating film include a ferromagnetic insulating oxide film and a ferromagnetic insulating nitride film, which are the same as the ferromagnetic insulating oxide film or ferromagnetic insulating nitride film which forms the first free magnetic layer of the spin valve element of the first embodiment.

The second ferromagnetic conductive film 193 is ferromagnetic and has low resistivity, and is made of, for example, any one of Co, a CoFe alloy, a NiFe alloy, a CoNi alloy, and a CoNiFe alloy.

The thickness of the second ferromagnetic conductive film 193 is preferably in the range of 1.5 to 4.5 nm, and the thickness u of the second ferromagnetic insulating film 177 is preferably in the range of 0.5 to 10 nm, more preferably in the range of 1 to 10 nm.

The thickness of the entire second free magnetic layer 192 is preferably in the range of 1.5 to 4.5 nm, and more preferably larger than the first free magnetic layer 171.

By setting the thickness u of the second ferromagnetic insulating film 177 in the range of 0.5 nm$\leq$u$\leq$10 nm, the up-spin conduction electrons moving from the nonmagnetic conductive layer 29 is mostly mirror-reflected by the second ferromagnetic insulating film 177 without passing through the second ferromagnetic insulating film 177.

The second ferromagnetic insulating film 177 and the second ferromagnetic conductive film 193 are brought into the ferromagnetic state by ferromagnetic coupling, and thus the magnetization direction of the second free magnetic layer 192 can be oriented in one direction. Namely, in FIG. 23, when the magnetization direction of the second free magnetic layer 192 is oriented in the $X_1$ direction by the bias layers 332, the magnetization direction of the entire first free magnetic layer 171 is oriented in the direction opposite to the $X_1$ direction. The magnetization of the second free magnetic layer 192 remains to orient the magnetization direction of the entire free magnetic layer 190 in the $X_1$ direction.

Therefore, the first and second free magnetic layers 171 and 192 are antiferromagnetically coupled with each other so that the magnetization directions are antiparallel to each other to bring both layers in a synthetic ferrimagnetic state (synthetic ferrimagnetic free).

Even with a small external magnetic field applied, the magnetization direction of the free magnetic layer 190 put into the ferrimagnetic state can thus be rotated according to the direction of the external magnetic field.

In addition, the second ferromagnetic insulating film 177 comprises the ferromagnetic insulating oxide film or ferromagnetic insulating nitride film having a resistivity of 4 to $2.0 \times 10^3$ μΩ·m, and thus exhibits higher resistivity than the nonmagnetic conductive layer 29. Therefore, a potential barrier is formed at the interface between the second ferromagnetic insulating film 177 and the nonmagnetic conductive layer 29.

Of the conduction electrons moving in the nonmagnetic conductive layer 29, up-spin conduction electrons are mirror-reflected by the potential barrier while maintaining the spin direction.

The up-spin conduction electrons are mirror-reflected by the second ferromagnetic insulating film 177 to extend the mean free path.

The up-spin conduction electrons quite possibly move from the pinned magnetic layer 40 to the second ferromagnetic insulating oxide film 177 through the nonmagnetic conductive layer 29 when the magnetization directions of the pinned magnetic layer 40 and the free magnetic layer 190 are made parallel by the external magnetic field.

The up-spin conduction electrons are mirror-reflected at the interface between the second ferromagnetic insulating film 177 and the nonmagnetic conductive film 29 while maintaining the spin state, and again move in the nonmagnetic conductive layer 29 and the pinned magnetic layer 40.

In this way, the up-spin conduction electrons pass through the nonmagnetic conductive layer 29 and the pinned magnetic layer 40 twice each to significantly extend the mean free path.

Therefore, like in the first embodiment, in the spin valve element 13 of this embodiment, the difference between the mean free paths of the up-spin conduction electrons and down-spin conduction electrons is increased by the mirror reflecting effect, thereby significantly increasing the rate of change in magnetoresistance of the spin valve element 13.

The spin valve element 13 is manufactured by substantially the same method as the spin valve element 10 of the tenth embodiment except that the second free magnetic layer 192 comprises the second ferromagnetic insulating film 177 and the second ferromagnetic conductive film 193.

The spin valve element 13 exhibits substantially the same effect as the spin valve element 8 of the eighth embodiment.

Fourteenth Embodiment

A fourteenth embodiment of the present invention will be described with reference to the drawings.

Figure 24:
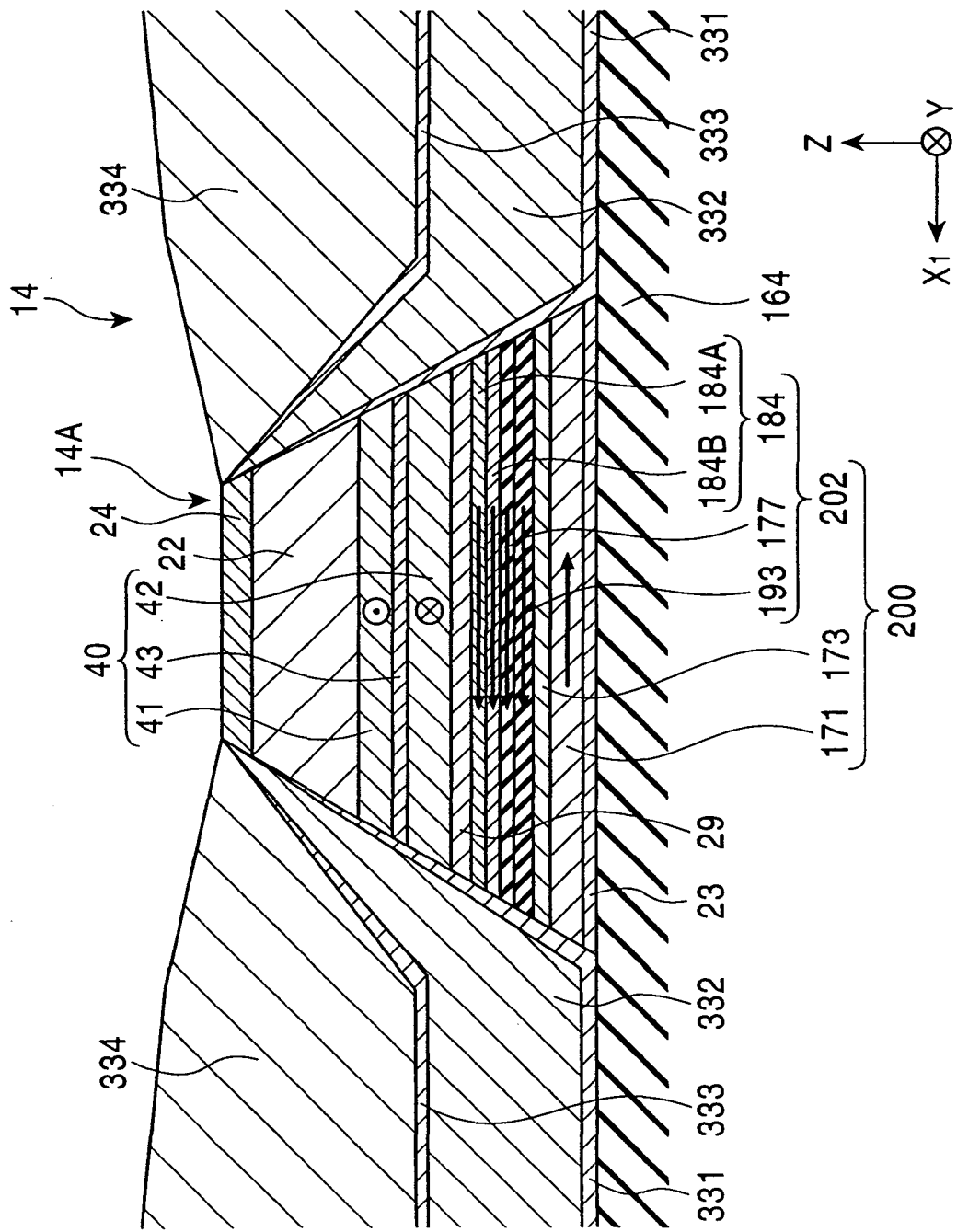
FIG. 24 is a schematic sectional view of a spin valve element according to a fourteenth embodiment of the present invention, as viewed from the magnetic recording medium side.

FIG. 24 is a schematic sectional view of a spin valve element 14 according to the fourteenth embodiment of the present invention, as viewed from the magnetic recording medium side.

The spin valve element 14 shown in FIG. 24 is a top-type single spin valve element in which a free magnetic layer 200, a nonmagnetic conductive layer 29, a pinned magnetic layer 40, and an antiferromagnetic layer 22 are laminated in turn.

In FIG. 24, reference numeral 164 denotes a lower gap layer, and reference numeral 23 denotes an underlying layer. The free magnetic layer 200, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 14A having a substantially trapezoidal sectional shape having a width corresponding to the track width.

The free magnetic layer 200 comprises a nonmagnetic intermediate layer 173, and first and second free magnetic layers 171 and 202 with the nonmagnetic intermediate layer 173 provided therebetween.

The antiferromagnetic layer 22, the first free magnetic layer 171, the nonmagnetic intermediate layer 173, the nonmagnetic conductive layer 29, the pinned magnetic layer 40 (the nonmagnetic layer 43 and first and second pinned magnetic layers 41 and 42), the bias underlying layers 331, the bias layers 332, the intermediate layers 333, and the electrode layers 334 shown in FIG. 24 have the same constructions and are made of the same materials as the antiferromagnetic layer, the first free magnetic layer, the nonmagnetic intermediate layer, the nonmagnetic conductive layer, the pinned magnetic layer (the nonmagnetic layer and first and second pinned magnetic layers), the bias underlying layers, the bias layers, the intermediate layers, and the electrode layers of the third or fourth embodiment. Therefore, description of these layers is omitted.

The spin valve element 14 is different from the spin valve element 13 of the thirteenth embodiment only in that the second free magnetic layer 202 comprises a second ferromagnetic conductive film 193, a second ferromagnetic insulating film 177 and a third ferromagnetic conductive film 184, and the third ferromagnetic conductive film 184 comprises an anti-diffusion film 184A and a ferromagnetic film 184B.

The second free magnetic layer 202 comprises the second ferromagnetic conductive film 193, the second ferromagnetic insulating film 177 and the third ferromagnetic conductive film 184. The second ferromagnetic conductive film 193 and the third ferromagnetic conductive film 184 are formed in contact with the nonmagnetic intermediate layer 173 and the nonmagnetic conductive layer 29, respectively, the second ferromagnetic insulating film 177 being held between the second and third ferromagnetic conductive films 193 and 184. The second ferromagnetic insulating film 177 and the second and third ferromagnetic conductive films 193 and 184 are brought into the ferromagnetic state by ferromagnetic coupling.

The second ferromagnetic conductive film 193 comprises the same second ferromagnetic conductive film of the thirteenth embodiment, which is ferromagnetic, has low resistivity, and is made of, for example, any one of Co, a CoFe alloy, a NiFe alloy, a CoNi alloy, and a CoNiFe alloy.

The second ferromagnetic insulating film 177 is ferromagnetic and has high resistivity. Examples of such a ferromagnetic insulating film include a ferromagnetic insulating oxide film and a ferromagnetic insulating nitride film, which are the same as the ferromagnetic insulating oxide film or ferromagnetic insulating nitride film which forms the first free magnetic layer of the spin valve element of the first embodiment.

Like the third ferromagnetic conductive film of the twelfth embodiment, the third ferromagnetic conductive film 184 comprises the anti-diffusion film 184A and the ferromagnetic film 184B, both of which are ferromagnetic and have low resistivity. The anti-diffusion film 184A and the ferromagnetic film 184B are formed in contact with the nonmagnetic conductive layer 29 and the second ferromagnetic insulating film 177, respectively, and are brought into the ferromagnetic state by ferromagnetic coupling.

The anti-diffusion film 184A comprises a ferromagnetic conductive film of Co or the like, and prevents mutual diffusion between the ferromagnetic film 184B and the nonmagnetic conductive layer 29.

The ferromagnetic film 184B comprises a ferromagnetic conductive film made of, for example, any one of Co, a CoFe alloy, a NiFe alloy, a CoNi alloy, and a CoNiFe alloy, preferably a NiFe alloy.

Like the third ferromagnetic conductive film of the eleventh embodiment, the third ferromagnetic conductive film 184 may comprise a single layer of a ferromagnetic conductive film made of any one of Co, a CoFe alloy, a NiFe alloy, a CoNi alloy, and a CoNiFe alloy.

The thickness of the second ferromagnetic conductive film 193 is preferably in the range of 0.5 to 2.5 nm, and the thickness of the second ferromagnetic insulating film 177 is preferably in the range of 0.5 to 10 nm, more preferably in the range of 1 to 10 nm.

The thickness of the anti-diffusion film 184A is preferably in the range of 0.1 to 1.5 nm, the thickness of the ferromagnetic film 184B is preferably in the range of 1.4 to 4.5 nm, and the thickness of the third ferromagnetic conductive film 184B is preferably in the range of 1.5 to 6.0 nm.

The thickness of the entire second free magnetic layer 202 is preferably in the range of 2.5 to 18.5 nm, and more preferably larger than the first free magnetic layer 171.

By setting the thickness u of the second ferromagnetic insulating film 177 in the range of $0.5 \text{ nm} \leq u \leq 10 \text{ nm}$, the up-spin conduction electrons moving from the nonmagnetic conductive layer 29 is mostly mirror-reflected by the second ferromagnetic insulating film 177 without passing through the second ferromagnetic insulating film 177.

The second ferromagnetic insulating film 177 and the second and third ferromagnetic conductive films 193 and 184 are ferromagnetically coupled with each other to bring the films into the ferromagnetic state, and thus the magnetization direction of the second free magnetic layer 202 can be oriented in one direction. Namely, in FIG. 24, when the magnetization direction of the second free magnetic layer 202 is oriented in the $X_1$ direction by the bias layers 332, the magnetization direction of the entire first free magnetic layer 171 is oriented in the direction opposite to the $X_1$ direction. The magnetization of the second free magnetic layer 202 remains to orient the magnetization direction of the entire free magnetic layer 200 in the $X_1$ direction to form the ferrimagnetic state.

Therefore, the first and second free magnetic layers 171 and 202 are antiferromagnetically coupled with each other so that the magnetization directions are antiparallel to each other to bring both layers in a synthetic ferrimagnetic state (synthetic ferrimagnetic free).

Even with a small external magnetic field applied, the magnetization direction of the free magnetic layer 200 put into the ferrimagnetic state can thus be rotated according to the direction of the external magnetic field.

In addition, the second ferromagnetic insulating film 177 comprises the ferromagnetic insulating oxide film or ferromagnetic insulating nitride film having a resistivity of 4 to $2.0 \times 10^3$ μΩ·m, and thus exhibits higher resistivity than the third ferromagnetic conductive film 184. Therefore, a potential barrier is formed at the interface between the second ferromagnetic insulating film 177 and the third ferromagnetic conductive film 184.

Of the conduction electrons moving in the nonmagnetic conductive layer 29, up-spin conduction electrons are mirror-reflected by the potential barrier while maintaining the spin direction.

The up-spin conduction electrons are mirror-reflected by the second ferromagnetic insulating film 177 to extend the mean free path. As a result, like in the first embodiment, the difference between the mean free paths of the up-spin conduction electrons and down-spin conduction electrons can be increased to significantly increase the rate of change in magnetoresistance of the spin valve element 14.

The spin valve element 14 is manufactured by substantially the same method as the spin valve element 10 of the tenth embodiment except that the second free magnetic layer 202 comprises the second ferromagnetic insulating film 177 and the second and third ferromagnetic conductive films 193 and 184, and the third ferromagnetic conductive film 184 comprises the anti-diffusion film 184A and the ferromagnetic film 184B.

The spin valve element 14 exhibits substantially the same effect as the spin valve element 9 of the ninth embodiment.

Fifteenth Embodiment

A fifteenth embodiment of the present invention will be described with reference to the drawings.

Figure 25:
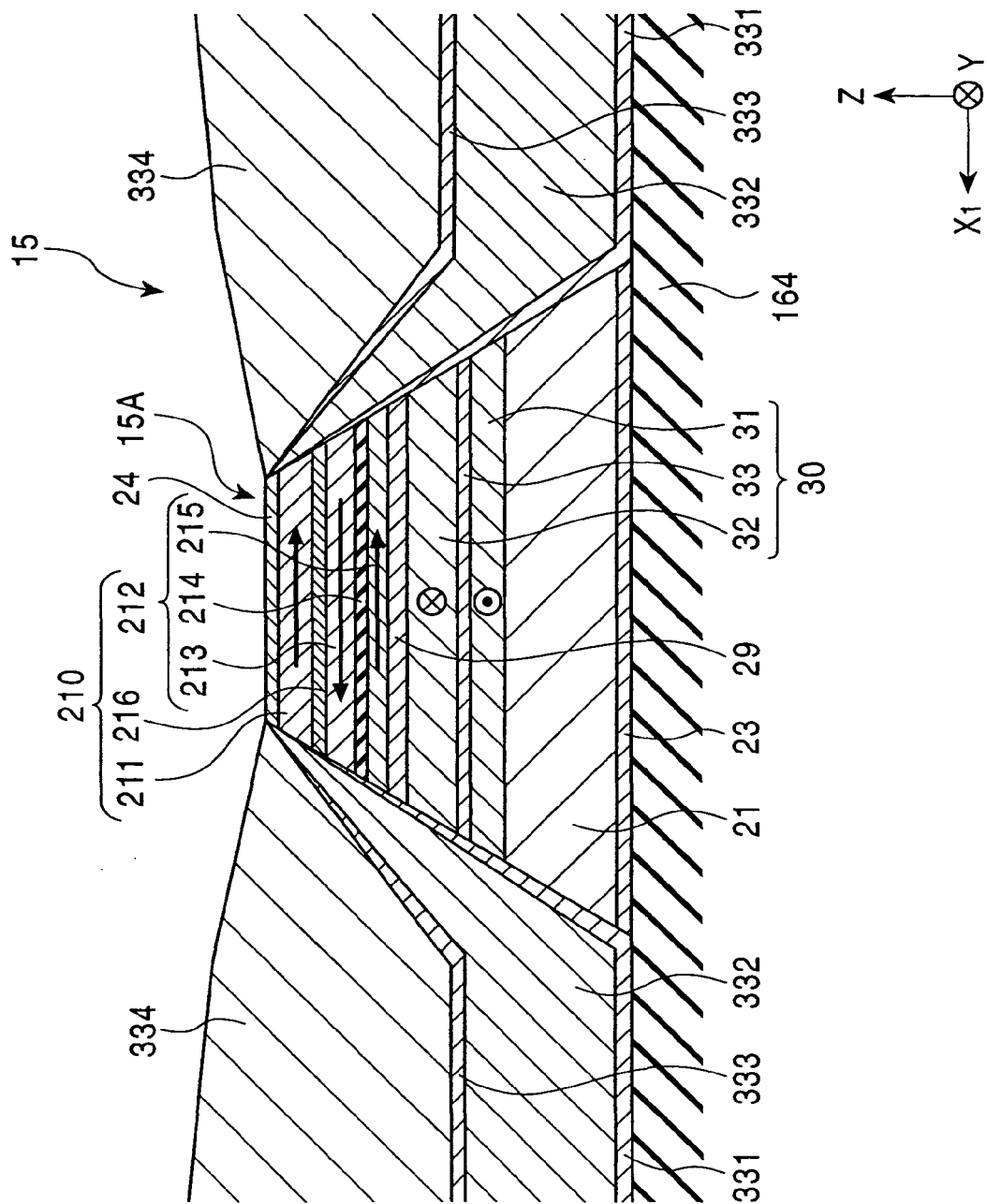
FIG. 25 is a schematic sectional view of a spin valve element according to a fifteenth embodiment of the present invention, as viewed from the magnetic recording medium side.

FIG. 25 is a schematic sectional view of a spin valve element 15 according to the fifteenth embodiment of the present invention, as viewed from the magnetic recording medium side.

The spin valve element 15 shown in FIG. 25 is a bottom-type single spin valve element in which an antiferromagnetic layer 21, a pinned magnetic layer 30, a nonmagnetic conductive layer 29, and a free magnetic layer 210 are laminated in turn.

In FIG. 25, reference numeral 164 denotes a lower gap layer, and reference numeral 23 denotes an underlying layer. The antiferromagnetic layer 21, the pinned magnetic layer 30, the nonmagnetic conductive layer 29, the free magnetic layer 210, and a capping layer 24 are laminated in turn on the underlying layer 23.

In this way, the layers from the underlying layer 23 to the capping layer 24 are laminated in turn to form a laminate 15A having a substantially trapezoidal sectional shape having a width corresponding to the track width.

The antiferromagnetic layer 21, the nonmagnetic conductive layer 29, the pinned magnetic layer 30 (the nonmagnetic layer 33 and first and second pinned magnetic layers 31 and 32), the bias underlying layers 331, the bias layers 332, the intermediate layers 333, and the electrode layers 334 shown in FIG. 25 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the first, second or fifth embodiment. Therefore, description of these layers is omitted.

As shown in FIG. 25, the free magnetic layer 210 of the spin valve element 15 comprises a nonmagnetic intermediate layer 216, and first and second free magnetic layers 211 and 212 with the nonmagnetic intermediate layer 216 provided therebetween. The first and second free magnetic layers 211 and 212 are antiferromagnetically coupled with each other with the nonmagnetic intermediate layer 216 provided therebetween.

The first free magnetic layer 211 is provided in contact with the capping layer 24 on the side of the nonmagnetic intermediate layer 216, which is opposite to the nonmagnetic conductive layer 29. On the other hand, the second free magnetic layer 212 is provided in contact with the nonmagnetic conductive layer 29 on the nonmagnetic conductive layer 29 side of the nonmagnetic intermediate layer 216.

The first free magnetic layer 211 comprises a ferromagnetic conductive film which has low resistivity and is ferromagnetic, and made of, for example, any one of Co, a CoFe alloy, a NiFe alloy, a CoNi alloy, and a CoNiFe alloy, preferably a NiFe alloy, preferably a NiFe alloy.

The thickness of the first free magnetic layer 211 is preferably in the range of 0.5 to 3.5 nm.

The second free magnetic layer 212 comprises a nonmagnetic intermediate insulating film 214, and fourth and fifth ferromagnetic conductive films 213 and 215 with the nonmagnetic intermediate insulating film 214 provided therebetween.

The fourth ferromagnetic conductive film 213 is provided in contact with the nonmagnetic intermediate layer 216 on the side of the nonmagnetic intermediate insulating film 214, which is opposite to the nonmagnetic conductive layer 29. On the other hand, the fifth ferromagnetic conductive film 215 is provided in contact with the nonmagnetic conductive layer 29 on the nonmagnetic conductive layer 29 side of the nonmagnetic intermediate insulating film 214.

The fourth and fifth ferromagnetic conductive films 213 and 215 are brought into the ferrimagnetic state by antiferromagnetic coupling with the nonmagnetic intermediate insulating film 214 provided therebetween.

The fourth and fifth ferromagnetic conductive films 213 and 215 comprise a ferromagnetic conductive film which has low resistivity and is ferromagnetic, and made of, for example, any one of Co, a CoFe alloy, a NiFe alloy, a CoNi alloy, and a CoNiFe alloy, preferably a NiFe alloy, preferably a NiFe alloy.

The nonmagnetic intermediate insulating film 214 is made of a nonmagnetic insulating material which has higher resistivity than the fourth and fifth ferromagnetic conductive films 213 and 215.

The thickness of the fourth ferromagnetic conductive film 213 is preferably in the range of 1.0 nm to 3.0 nm, the thickness of the fifth ferromagnetic conductive film 215 is preferably in the range of 1.5 nm to 4.5 nm, and the thickness of the nonmagnetic intermediate insulating film 214 is preferably in the range of 0.2 nm to 2.0 nm.

The fourth and fifth ferromagnetic conductive films 213 and 215 are preferably formed so that the thickness of any one of both films is larger than that of the other. In FIG. 25, the fourth ferromagnetic conductive film 213 is thicker than the fifth ferromagnetic conductive film 215.

The thickness of the entire second free magnetic layer 212 is preferably in the range of 2.7 nm to 9.5 nm, and larger than that of the first free magnetic layer 211.

The fourth and fifth ferromagnetic conductive films 213 and 215 are brought into the ferrimagnetic state by antiferromagnetic coupling. Therefore, when the magnetization direction of the fifth ferromagnetic conductive film 215 is oriented in the direction opposite to the $X_1$ direction by the bias layers 332, the magnetization direction of the fourth ferromagnetic conductive film 213 is oriented in the $X_1$ direction. The magnetization of the fourth ferromagnetic conductive film 213 remains to orient the magnetization direction of the entire second free magnetic layer 212 in the $X_1$ direction.

Furthermore, the magnetization direction of the first free magnetic layer 211 antiferromagnetically coupled with the second free magnetic layer 212 is oriented in the direction opposite to the $X_1$ direction, and the magnetization of the second free magnetic layer 212 remains to orient the magnetization direction of the entire free magnetic layer 210 in the $X_1$ direction to form the ferrimagnetic state.

Even with a small external magnetic field applied, the magnetization direction of the free magnetic layer 210 put into the ferrimagnetic state can thus be rotated according to the direction of the external magnetic field.

Also, a potential barrier is formed at the interface between the nonmagnetic intermediate insulating film 214 and the fifth ferromagnetic conductive film 215 due to a great difference in resistivity between both layers. Of the conduction electrons moving in the nonmagnetic conductive layer 29, therefore, up-spin conduction electrons are mirror-reflected by the nonmagnetic intermediate insulating film 214 while maintaining the spin direction.

The up-spin conduction electrons are mirror-reflected at the interface between the nonmagnetic intermediate insulating film 214 and the fifth ferromagnetic conductive film 215 to extend the mean free path. As a result, like in the first embodiment, the difference between the mean free paths of the up-spin conduction electrons and the down-spin conduction electrons can be increased to increase the rate of change in magnetoresistance of the spin valve element 15.

This is described with reference to a schematic drawing of FIG. 26.

Figure 26:
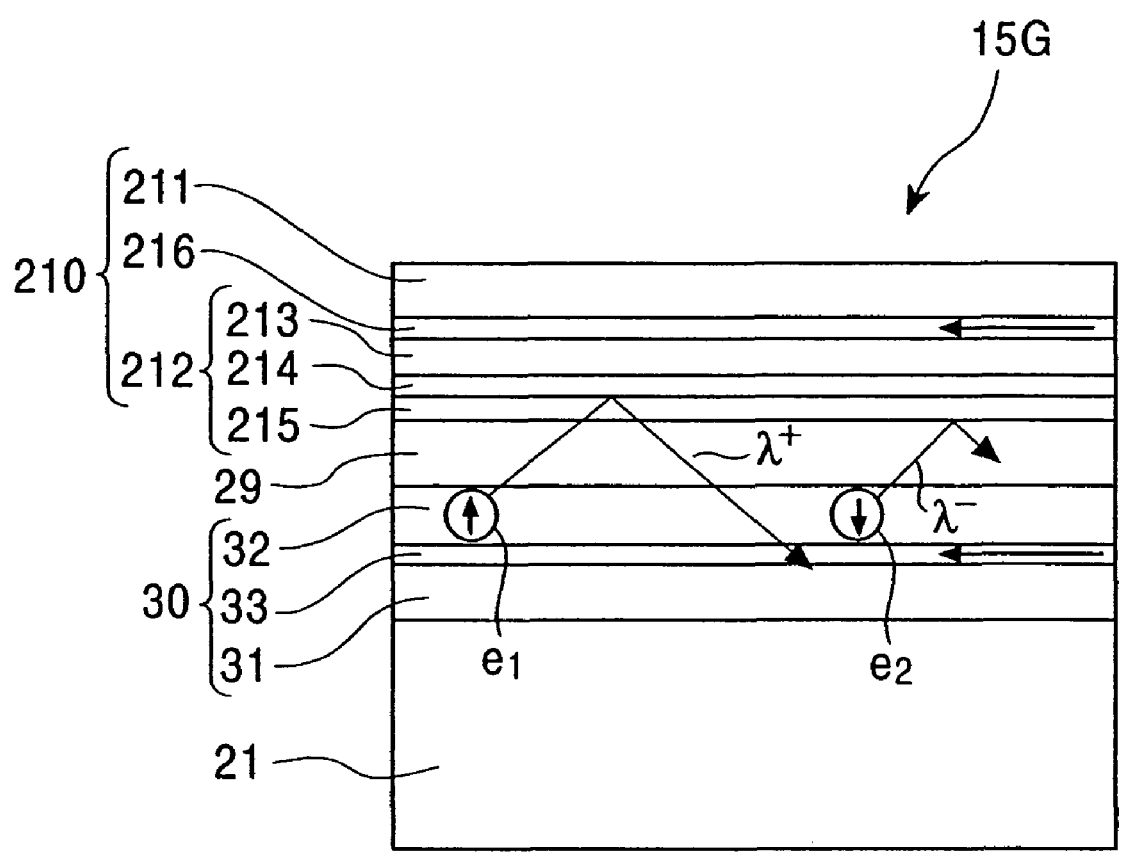
FIG. 26 is a schematic drawing illustrating the operation of the spin valve element shown in FIG. 25.

FIG. 26 shows a laminate 15G in which the antiferromagnetic layer 21, the pinned magnetic layer 30 (the first pinned magnetic layer 31, the nonmagnetic layer 33, the second pinned magnetic layer 32), the nonmagnetic conductive layer 29, and the second free magnetic layer 212 (the fifth ferromagnetic conductive film 215, the nonmagnetic intermediate insulating film 214, and the fourth ferromagnetic conductive film 213), the nonmagnetic intermediate layer 216, and the first free magnetic layer 211 are laminated in turn.

In FIG. 26, the magnetization direction of the free magnetic layer 210 is oriented in the leftward direction in FIG. 26 by the external magnetic field, and the magnetization direction of the pinned magnetic layer 30 is pinned in the leftward direction in FIG. 26 by an exchange coupling magnetic field with the antiferromagnetic layer 21.

When the sensing current is passed through the laminate 15G shown in FIG. 26, the conduction electrons mainly move in the nonmagnetic conductive layer 29 having low electric resistance. In FIG. 26, the up-spin conduction electrons are denoted by reference character $e_1$, and the down-spin conduction electrons are denoted by reference character $e_2$.

The up-spin conduction electrons $e_1$ quite possibly move from nonmagnetic conductive layer 29 to the fifth ferromagnetic conductive film 215 when the magnetization directions of the pinned magnetic layer 30 and the free magnetic layer 210 are made parallel by the external magnetic field.

The up-spin conduction electrons $e_1$ move to the interface between the nonmagnetic intermediate insulating film 214 and the fifth ferromagnetic conductive film 215, are mirror-reflected by the nonmagnetic intermediate insulating film 214, which forms the potential barrier, while maintaining the spin state, and again move in the fifth ferromagnetic conductive film 215.

In this way, the up-spin conduction electrons $e_1$ pass through the fifth ferromagnetic conductive film 215, the nonmagnetic conductive layer 29 and the pinned magnetic layer 30 twice each to significantly extend the mean free path to $\lambda^+$.

On the other hand, the down-spin conduction electrons $e_2$ have the high probability that they are always scattered at the interface between the nonmagnetic conductive layer 29 and the fifth ferromagnetic conductive film 215, and are maintained in the state where the probability of movement to the fifth ferromagnetic conductive film 215 its low, and the mean free path ($\lambda^-$) remains shorter than the mean free path ($\lambda^+$) of the up-spin conduction electrons $e_1$.

The mean free path ($\lambda^+$) of the up-spin conduction electrons $e_1$ becomes longer than the mean free path ($\lambda^-$) of the down-spin conduction electrons $e_2$ due to the action of the external magnetic field, increasing the difference ($\lambda^+-\lambda^-$) between the paths to increase the rate of change in magnetoresistance of the laminate 15G.

Therefore, in the spin valve element 15 of this embodiment, the mean free path of the up-spin conduction electrons $e_1$ can be significantly increased to increase the difference between the mean free paths of the up-spin conduction electrons $e_1$ and the mean free path of the down-spin conduction electrons $e_2$, thereby significantly improving the rate of change in magnetoresistance of the spin valve element 15.

Also, the fifth ferromagnetic conductive film 215 is formed in contact with the nonmagnetic conductive layer 29, and thus the greater giant magnetoresistive effect can be manifested at the interface between the fifth ferromagnetic conductive film 215 and the nonmagnetic conductive layer 29.

The spin valve element 15 is manufactured by substantially the same method as the spin valve element 5 of the fifth embodiment except that the second free magnetic layer 212 comprises the fourth ferromagnetic conductive film 213, the nonmagnetic intermediate insulating film 214, and the fifth ferromagnetic conductive film 215.

In the spin valve element 15, the up-spin conduction electrons can be mirror-reflected by the nonmagnetic intermediate insulating film 214 to extend the mean free path of the up-spin conduction electrons. Therefore, the difference between the mean free paths of the up-spin and down-spin conduction electrons can be increased to increase the rate of change in magnetoresistance of the spin valve element 15.

Also, the fifth ferromagnetic conductive film 215 is formed in contact with the nonmagnetic conductive layer 29, and thus the greater giant magnetoresistive effect can be manifested at the interface between the fifth ferromagnetic conductive film 215 and the nonmagnetic conductive layer 29 to further increase the rate of change in magnetoresistance of the spin valve element 15.

Furthermore, the first and second free magnetic layers 211 and 212 are brought into the ferrimagnetic state, and the fourth and fifth ferromagnetic conductive films 213 and 215, which constitute the second free magnetic layer 212, are brought into the ferrimagnetic state with the nonmagnetic intermediate insulating film 214 provided therebetween. Therefore, the entire free magnetic layer 210 can be more stably put into the ferrimagnetic state.

Sixteenth Embodiment

A sixteenth embodiment of the present invention will be described with reference to the drawings.

Figure 27:
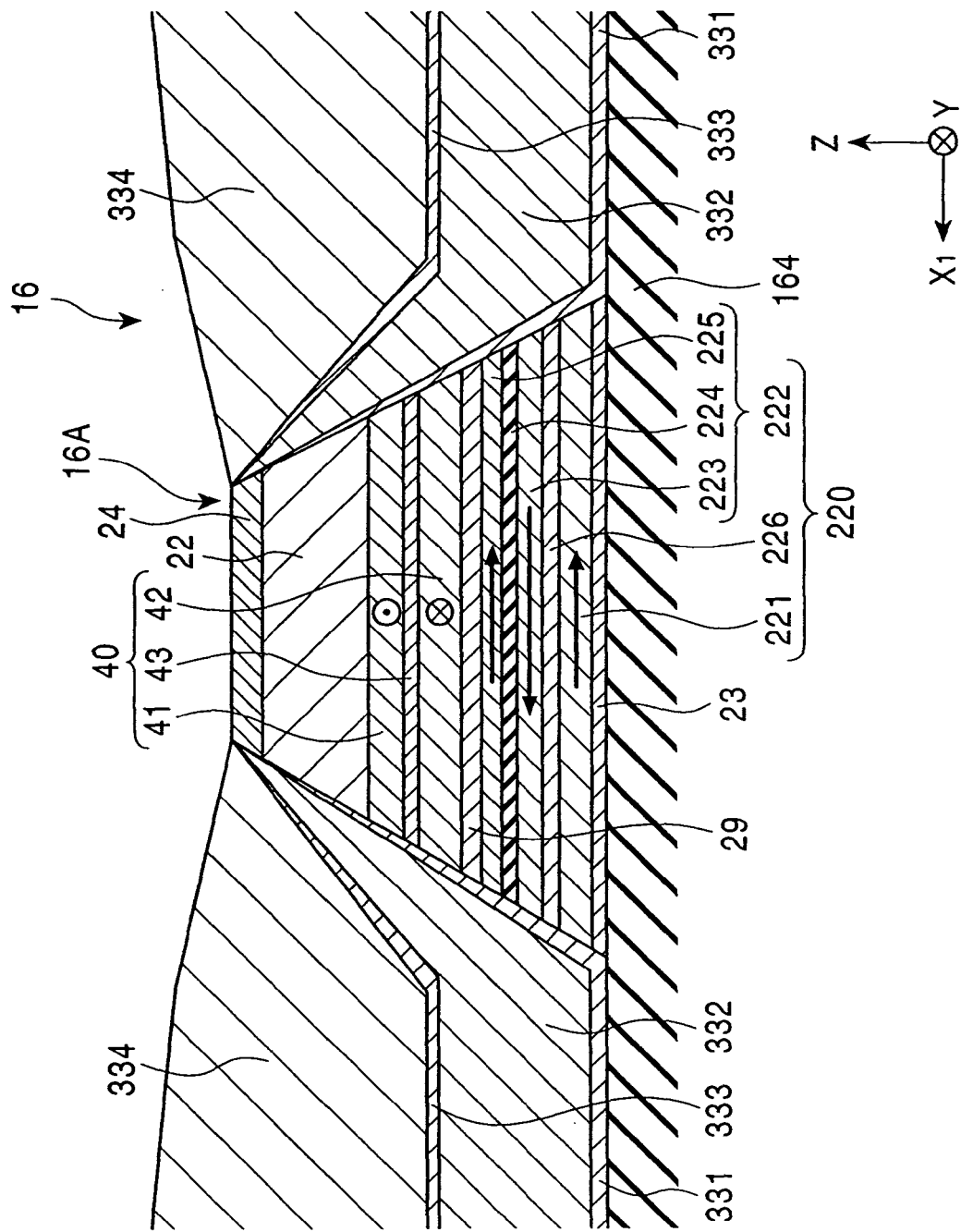
FIG. 27 is a schematic sectional view of a spin valve element according to a sixteenth embodiment of the present invention, as viewed from the magnetic recording medium side.

FIG. 27 is a schematic sectional view of a spin valve element 16 according to the sixteenth embodiment of the present invention, as viewed from the magnetic recording medium side.

The spin valve element 16 shown in FIG. 27 is a top-type single spin valve element in which a free magnetic layer 220, a nonmagnetic conductive layer 29, a pinned magnetic layer 40, and an antiferromagnetic layer 22 are laminated in turn.

In FIG. 27, reference numeral 164 denotes a lower gap layer, and reference numeral 23 denotes an underlying layer. The free magnetic layer 220, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 16A having a substantially trapezoidal sectional shape having a width corresponding to the track width.

The antiferromagnetic layer 22, the nonmagnetic conductive layer 29, the pinned magnetic layer 40 (the nonmagnetic layer 43 and first and second pinned magnetic layers 41 and 42), the bias underlying layers 331, the bias layers 332, the intermediate layers 333, and the electrode layers 334 shown in FIG. 27 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the third, fourth or tenth embodiment. Therefore, description of these layers is omitted.

As shown in FIG. 27, the free magnetic layer 220 of the spin valve element 16 comprises a nonmagnetic intermediate layer 226, and first and second free magnetic layers 221 and 222 with the nonmagnetic intermediate layer 226 provided therebetween. The first and second free magnetic layers 221 and 222 are antiferromagnetically coupled with each other with the nonmagnetic intermediate layer 226 provided therebetween.

The first free magnetic layer 221 is provided in contact with the underlying layer 23 on the side of the nonmagnetic intermediate layer 226, which is opposite to the nonmagnetic conductive layer 29, while the second free magnetic layer 222 is provided in contact with the nonmagnetic conductive layer 29 on the nonmagnetic conductive layer 29 side of the nonmagnetic intermediate layer 226.

The first free magnetic layer 221 comprises a ferromagnetic conductive film which is made of the same material as the first free magnetic layer of the fifteenth embodiment.

The thickness of the first free magnetic layer 221 is preferably in the range of 0.5 to 3.5 nm.

The second free magnetic layer 222 comprises a nonmagnetic intermediate insulating film 224, and fourth and fifth ferromagnetic conductive films 223 and 225 with the nonmagnetic intermediate insulating film 224 provided therebetween.

The fourth ferromagnetic conductive film 223 is provided in contact with the nonmagnetic intermediate layer 226 on the side of the nonmagnetic intermediate insulating film 224, which is opposite to the nonmagnetic conductive layer 29. On the other hand, the fifth ferromagnetic conductive film 225 is provided in contact with the nonmagnetic conductive layer 29 on the nonmagnetic conductive layer 29 side of the nonmagnetic intermediate insulating film 224.

The fourth and fifth ferromagnetic conductive films 223 and 225 are brought into the ferrimagnetic state by antiferromagnetic coupling with the nonmagnetic intermediate insulating film 224 provided therebetween.

The fourth and fifth ferromagnetic conductive films 223 and 225 comprise a ferromagnetic conductive film of the same material as the fourth and fifth ferromagnetic conductive films of the fifteenth embodiment.

The nonmagnetic intermediate insulating film 224 is made of a nonmagnetic insulating material which has higher resistivity than the fourth and fifth ferromagnetic conductive films 223 and 225.

The thickness of the fourth ferromagnetic conductive film 223 is preferably in the range of 1.0 nm to 3.0 nm, the thickness of the fifth ferromagnetic conductive film 225 is preferably in the range of 1.5 nm to 4.0 nm, and the thickness of the nonmagnetic intermediate insulating film 224 is preferably in the range of 0.2 nm to 2.0 nm.

The fourth and fifth ferromagnetic conductive films 223 and 225 are preferably formed so that the thickness of any one of both films is larger than that of the other. In FIG. 27, the fourth ferromagnetic conductive film 223 is thicker than the fifth ferromagnetic conductive film 225.

The thickness of the entire second free magnetic layer 222 is preferably in the range of 2.7 nm to 9.5 nm, and larger than that of the first free magnetic layer 221.

The fourth and fifth ferromagnetic conductive films 223 and 225 are brought into the ferrimagnetic state by antiferromagnetic coupling. Therefore, when the magnetization direction of the fifth ferromagnetic conductive film 225 is oriented in the direction opposite to the $X_1$ direction by the bias layers 332, the magnetization direction of the fourth ferromagnetic conductive film 223 is oriented in the $X_1$ direction. The magnetization of the fourth ferromagnetic conductive film 223 remains to orient the magnetization direction of the entire second free magnetic layer 222 in the $X_1$ direction.

Furthermore, the magnetization direction of the first free magnetic layer 221 antiferromagnetically coupled with the second free magnetic layer 222 is oriented in the direction opposite to the $X_1$ direction, and the magnetization of the second free magnetic layer 222 remains to orient the magnetization direction of the entire free magnetic layer 220 in the $X_1$ direction to form the ferrimagnetic state.

Even with a small external magnetic field applied, the magnetization direction of the free magnetic layer 220 put into the ferrimagnetic state can thus be rotated according to the direction of the external magnetic field.

Also, a potential barrier is formed at the interface between the nonmagnetic intermediate insulating film 224 and the fifth ferromagnetic conductive film 225 due to a great difference in resistivity between both layers.

Of the conduction electrons moving in the nonmagnetic conductive layer 29, therefore, up-spin conduction electrons are mirror-reflected by the potential barrier while maintaining the spin direction.

The up-spin conduction electrons are mirror-reflected by the nonmagnetic intermediate insulating film 224 to extend the mean free path.

Namely, the up-spin conduction electrons quite possibly move from the pinned magnetic layer 40 to the fifth ferromagnetic conductive film 225 through the nonmagnetic conductive layer 29 when the magnetization directions of the pinned magnetic layer 40 and the free magnetic layer 220 are made parallel by the external magnetic field.

The up-spin conduction electrons are mirror-reflected at the interface between the fifth ferromagnetic conductive film 225 and the nonmagnetic intermediate insulating film 224 while maintaining the spin state, and again move through the fifth ferromagnetic conductive film 225, the nonmagnetic conductive layer 29 and the pinned magnetic layer 40.

In this way, the up-spin conduction electrons move through the fifth ferromagnetic conductive film 225, the nonmagnetic conductive layer 29 and the pinned magnetic layer 40 twice each to significantly extend the mean free path.

Like in the first embodiment, in the spin valve element 16 of this embodiment, the mean free path of the up-spin conduction electrons can be significantly increased by the mirror-reflecting effect to increase the difference between the mean free paths of the up-spin and down-spin conduction electrons. Therefore, the rate of change in magnetoresistance of the spin valve element 16 can be significantly improved.

In addition, the fifth ferromagnetic conductive film 225 is formed in contact with the nonmagnetic conductive layer 29, and thus the greater giant magnetoresistive effect can be manifested at the interface between the fifth ferromagnetic conductive film 225 and the nonmagnetic conductive layer 29.

The spin valve element 16 is manufactured by substantially the same method as the spin valve element 10 of the tenth embodiment except that the second free magnetic layer 222 comprises the fourth ferromagnetic conductive film 223, the nonmagnetic intermediate insulating film 224, and the fifth ferromagnetic conductive film 225.

The spin valve element 16 exhibits substantially the same effect as the spin valve element 15 of the fifteenth embodiment.

Seventeenth Embodiment

A seventeenth embodiment of the present invention will be described with reference to the drawings.

Figure 28:
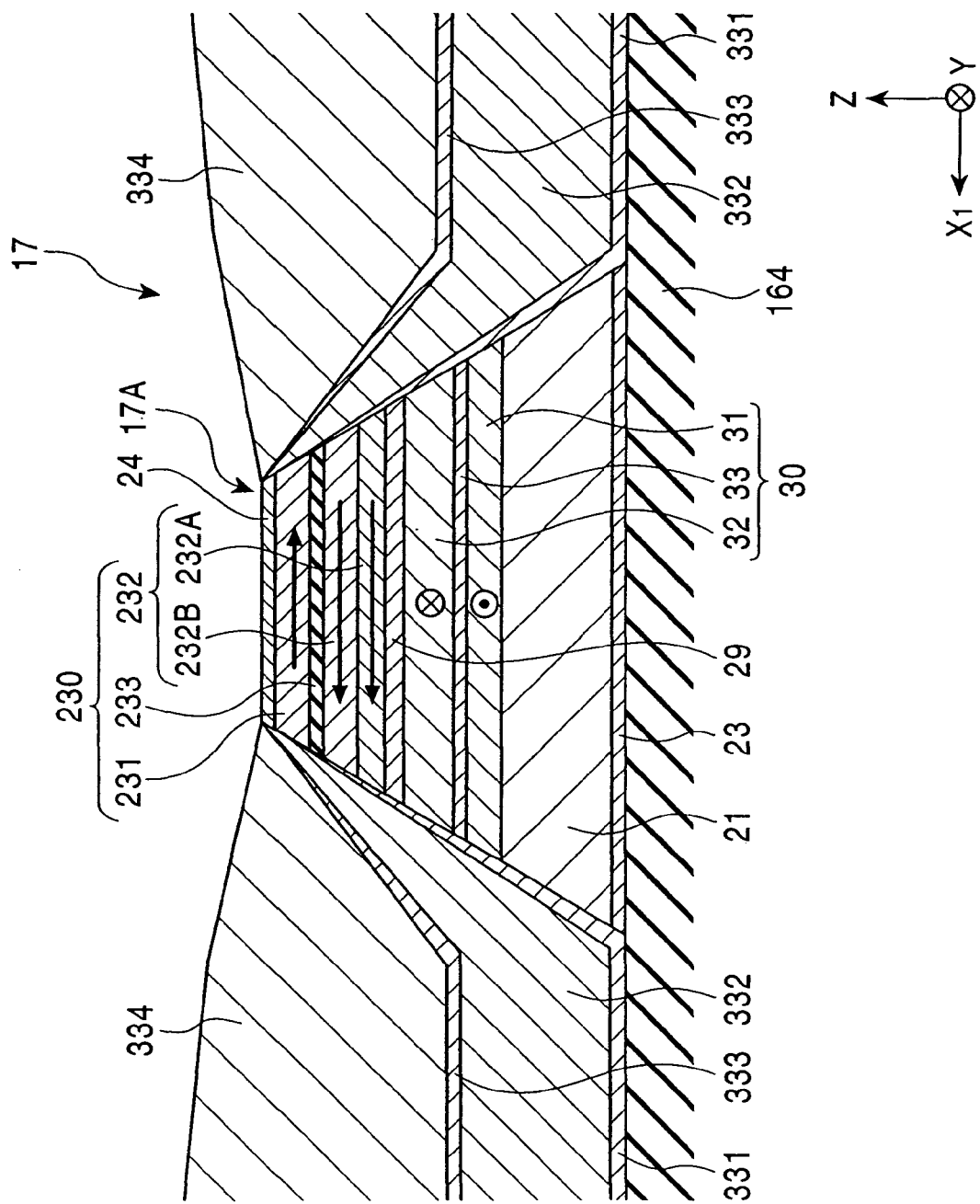
FIG. 28 is a schematic sectional view of a spin valve element according to a seventeenth embodiment of the present invention, as viewed from the magnetic recording medium side.

FIG. 28 is a schematic sectional view of a spin valve element 17 according to the seventeenth embodiment of the present invention, as viewed from the magnetic recording medium side.

The spin valve element 17 shown in FIG. 28 is a bottom-type single spin valve element in which an antiferromagnetic layer 21, a pinned magnetic layer 30, a nonmagnetic conductive layer 29, and a free magnetic layer 230 are laminated in turn.

In FIG. 28, reference numeral 164 denotes a lower gap layer, and reference numeral 23 denotes an underlying layer. The antiferromagnetic layer 21, the pinned magnetic layer 30, the nonmagnetic conductive layer 29, the free magnetic layer 230, and a capping layer 24 are laminated in turn on the underlying layer 23.

In this way, the layers from the underlying layer 23 to the capping layer 24 are laminated in turn to form a laminate 17A having a substantially trapezoidal sectional shape having a width corresponding to the track width.

The antiferromagnetic layer 21, the nonmagnetic conductive layer 29, the pinned magnetic layer 30 (the nonmagnetic layer 33 and first and second pinned magnetic layers 31 and 32), the bias underlying layers 331, the bias layers 332, the intermediate layers 333, and the electrode layers 334 shown in FIG. 28 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the first, second or fifth embodiment. Therefore, description of these layers is omitted.

The free magnetic layer 230 comprises a nonmagnetic intermediate insulating layer 233, and first and second free magnetic layers 231 and 232 with the nonmagnetic intermediate layer 233 provided therebetween. The first and second free magnetic layers 231 and 232 are brought into the ferrimagnetic state by antiferromagnetic coupling with each other with the nonmagnetic intermediate insulating layer 233 provided therebetween.

The first free magnetic layer 231 comprises a ferromagnetic conductive film which has low resistivity and is ferromagnetic, and made of, for example, any one of Co, a CoFe alloy, a NiFe alloy, a CoNi alloy, and a CoNiFe alloy, preferably a NiFe alloy, preferably a NiFe alloy.

The thickness of the first free magnetic layer 231 is preferably in the range of 0.5 to 3.5 nm.

The second free magnetic layer 232 comprises an anti-diffusion film 232A and a ferromagnetic film 232B, which are formed in contact with the nonmagnetic conductive layer 29 and the nonmagnetic intermediate insulating layer 233, respectively.

The anti-diffusion film 232A comprises a ferromagnetic conductive film of Co or the like, and prevents mutual diffusion between the ferromagnetic film 232B and the nonmagnetic conductive layer 29.

Like the anti-diffusion film 232A, the ferromagnetic film 232B comprises a ferromagnetic conductive film made of, for example, any one of Co, a CoFe alloy, a NiFe alloy, a CoNi alloy, and a CoNiFe alloy, preferably a NiFe alloy.

The thickness of the anti-diffusion film 232A is preferably in the range of 0.1 to 1.5 nm, and the thickness of the ferromagnetic film 232B is preferably in the range of 1.4 to 3.0 nm.

The thickness of the entire second free magnetic layer 232 is preferably in the range of 1.5 to 4.5 nm, and more preferably larger than the first free magnetic layer 231.

The nonmagnetic intermediate insulating layer 233 is made of a nonmagnetic insulating material which has higher resistivity than the first and second free magnetic layers 231 and 232.

The first and second free magnetic layers 231 and 232 are brought into the ferrimagnetic state by antiferromagnetic coupling. Therefore, when the magnetization direction of the second free magnetic layer 232 is oriented in the $X_1$ direction by the bias layers 332, the magnetization direction of the first free magnetic layer 231 is oriented in the direction opposite to the $X_1$ direction. The magnetization of the second free magnetic layer 232 remains to orient the magnetization direction of the entire free magnetic layer 230 in the $X_1$ direction.

Furthermore, a potential barrier is formed at the interface between the second free magnetic layer 232 (the ferromagnetic film 232B) and the nonmagnetic intermediate insulating layer 233 due to a great difference in resistivity between both layers. Of the conduction electrons moving in the nonmagnetic conductive layer 29, therefore, up-spin conduction electrons are mirror-reflected by the nonmagnetic intermediate insulating layer 233 while maintaining the spin direction.

The up-spin conduction electrons are mirror-reflected at the interface between the ferromagnetic film 232B and the nonmagnetic intermediate insulating layer 233 to extend the mean free path. As a result, like in the first embodiment, the difference between the mean free paths of the up-spin conduction electrons and the down-spin conduction electrons can be increased to increase the rate of change in magnetoresistance of the spin valve element 17.

This is described with reference to a schematic drawing of FIG. 29.

Figure 29:
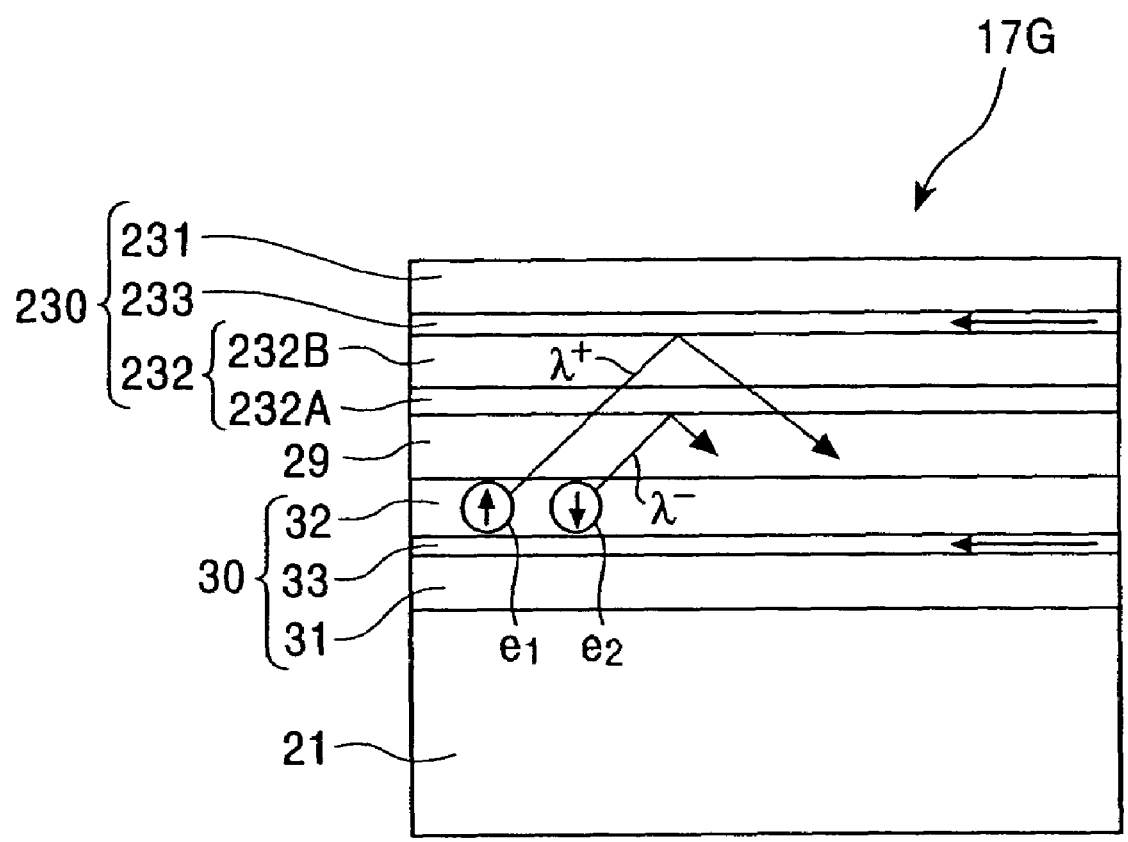
FIG. 29 is a schematic drawing illustrating the operation of the spin valve element shown in FIG. 28.

FIG. 29 shows a laminate 17G in which the antiferromagnetic layer 21, the pinned magnetic layer 30 (the first pinned magnetic layer 31, the nonmagnetic layer 33, the second pinned magnetic layer 32), the nonmagnetic conductive layer 29, and the second free magnetic layer 232 (the anti-diffusion film 232A and the ferromagnetic film 232B), the nonmagnetic intermediate insulating layer 233, and the first free magnetic layer 231 are laminated in turn.

In FIG. 29, the magnetization direction of the free magnetic layer 230 is oriented in the leftward direction in FIG. 29 by the external magnetic field, and the magnetization direction of the pinned magnetic layer 30 is pinned in the leftward direction in FIG. 29 by an exchange coupling magnetic field with the antiferromagnetic layer 21.

When the sensing current is passed through the laminate 17G shown in FIG. 29, the conduction electrons mainly move in the nonmagnetic conductive layer 29 having low electric resistance. In FIG. 29, the up-spin conduction electrons are denoted by reference character $e_1$, and the down-spin conduction electrons are denoted by reference character $e_2$.

The up-spin conduction electrons $e_1$ quite possibly move from nonmagnetic conductive layer 29 to the second free magnetic layer 232 when the magnetization directions of the pinned magnetic layer 30 and the free magnetic layer 230 are made parallel by the external magnetic field.

The up-spin conduction electrons $e_1$ move to the interface between the second free magnetic layer 232 (the ferromagnetic film 232B) and the nonmagnetic intermediate insulating layer 233, are mirror-reflected by the nonmagnetic intermediate insulating layer 233, which forms the potential barrier, while maintaining the spin state, and again move in the second free magnetic layer 232.

In this way, the up-spin conduction electrons $e_1$ pass through the second free magnetic layer 232, the nonmagnetic conductive layer 29 and the pinned magnetic layer 30 twice each to significantly extend the mean free path to $\lambda^+$.

On the other hand, the down-spin conduction electrons $e_2$ have the high probability that they are always scattered at the interface between the nonmagnetic conductive layer 29 and the second free magnetic layer 232 (the ferromagnetic film 232B), and are maintained in the state where the probability of movement to the second free magnetic layer 232 is low, and the mean free path ($\lambda^-$) remains shorter than the mean free path ($\lambda^+$) of the up-spin conduction electrons $e_1$.

The mean free path ($\lambda^+$) of the up-spin conduction electrons $e_1$ becomes longer than the mean free path ($\lambda^-$) of the down-spin conduction electrons $e_2$ due to the action of the external magnetic field, increasing the difference ($\lambda^+-\lambda^-$) between the paths to increase the rate of change in magnetoresistance of the laminate 17G.

Therefore, in the spin valve element 17 of this embodiment, the difference between the mean free paths of the up-spin conduction electrons $e_1$ and the mean free path of the down-spin conduction electrons $e_2$ is increased, thereby significantly improving the rate of change in magnetoresistance of the spin valve element 17.

The spin valve element 17 is manufactured by substantially the same method as the spin valve element 1 of the first embodiment except that the nonmagnetic intermediate insulating layer 233 is formed in place of the nonmagnetic intermediate layer.

In the spin valve element 17, the up-spin conduction electrons can be mirror-reflected by the nonmagnetic intermediate insulating layer 233 to extend the mean free path of the up-spin conduction electrons. Therefore, the difference between the mean free paths of the up-spin and down-spin conduction electrons can be increased to increase the rate of change in magnetoresistance of the spin valve element 17.

Furthermore, the first and second free magnetic layers 231 and 232, which constitute the free magnetic layer 230, are brought into the ferrimagnetic state. Therefore, the magnetization direction of the free magnetic layer 230 can be changed with the small external magnetic field to increase the sensitivity of the spin valve element 17 to the external magnetic field.

Therefore, the spin valve element 17 has the particular effect of significantly increasing the rate of change in magnetoresistance by the effect of mirror-reflecting up-spin conduction electrons, and increasing the sensitivity to the external magnetic field by providing the free magnetic layer 230 in the ferrimagnetic state.

Eighteenth Embodiment

An eighteenth embodiment of the present invention will be described with reference to the drawings.

Figure 30:
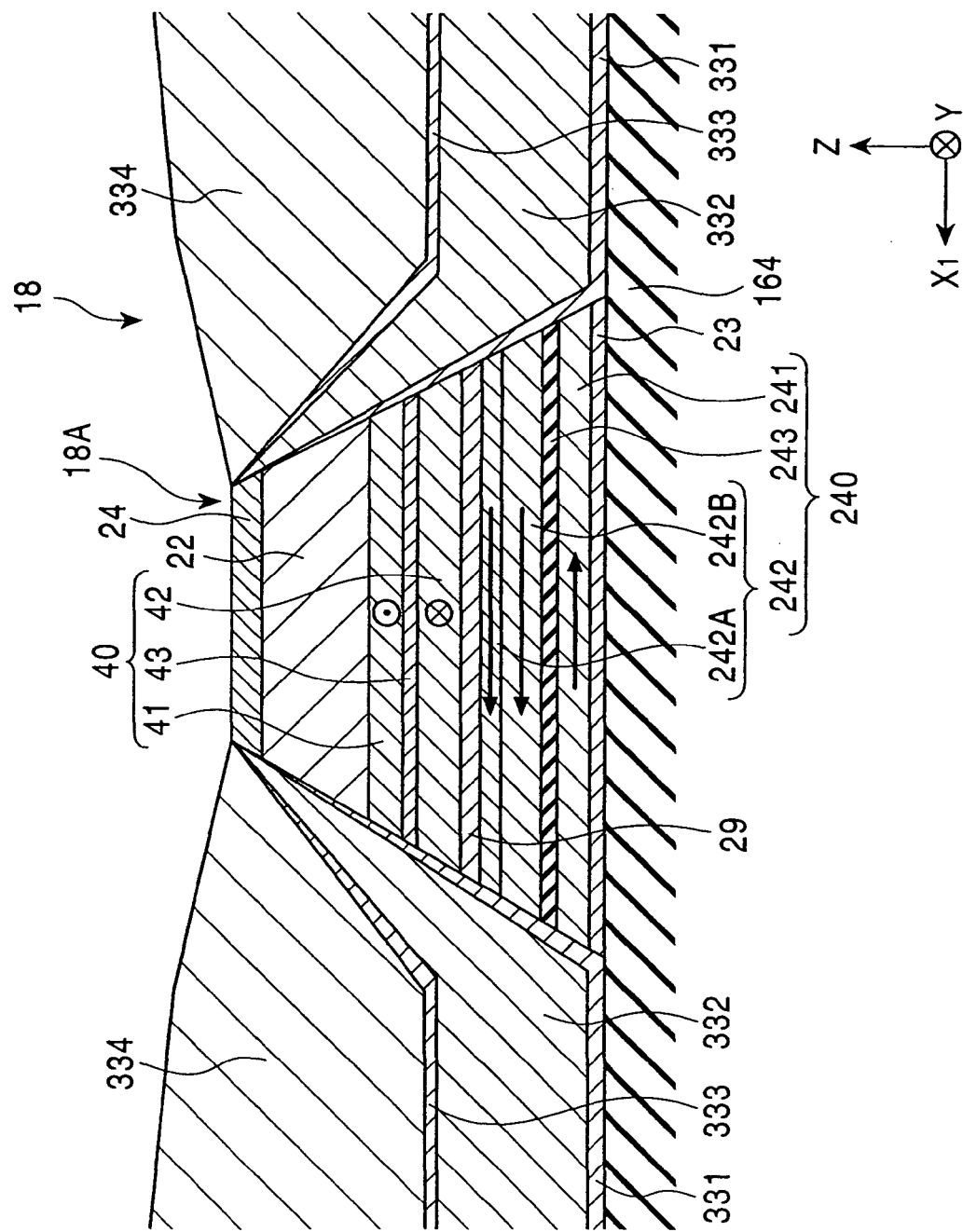
FIG. 30 is a schematic sectional view of a spin valve element according to an eighteenth embodiment of the present invention, as viewed from the magnetic recording medium side.

FIG. 30 is a schematic sectional view of a spin valve element 18 according to the eighteenth embodiment of the present invention, as viewed from the magnetic recording medium side.

The spin valve element 18 shown in FIG. 30 is a top-type single spin valve element in which a free magnetic layer 240, a nonmagnetic conductive layer 29, a pinned magnetic layer 40, and an antiferromagnetic layer 22 are laminated in turn.

In FIG. 30, reference numeral 164 denotes a lower gap layer, and reference numeral 23 denotes an underlying layer. The free magnetic layer 240, the nonmagnetic conductive layer 29, the pinned magnetic layer 40, the antiferromagnetic layer 22, and a capping layer 24 are laminated in turn on the underlying layer 23.

In this way, the layers from the underlying layer 23 to the capping layer 24 are laminated in turn to form a laminate 18A having a substantially trapezoidal sectional shape having a width corresponding to the track width.

The antiferromagnetic layer 22, the nonmagnetic conductive layer 29, the pinned magnetic layer 40 (a nonmagnetic layer 43 and first and second pinned magnetic layers 41 and 42), the bias underlying layers 331, the bias layers 332, the intermediate layers 333, and the electrode layers 334 shown in FIG. 30 have the same constructions and are made of the same materials as the antiferromagnetic layer, the nonmagnetic conductive layer, the pinned magnetic layer (the nonmagnetic layer and first and second pinned magnetic layers), the bias underlying layers, the bias layers, the intermediate layers, and the electrode layers of the third, fourth or tenth embodiment. Therefore, description of these layers is omitted.

The free magnetic layer 240 comprises a nonmagnetic intermediate insulating layer 243, and first and second free magnetic layers 241 and 242 with the nonmagnetic intermediate insulating layer 243 provided therebetween. The first and second free magnetic layers 241, and 242 are brought into the ferrimagnetic state by antiferromagnetic coupling with the nonmagnetic intermediate insulating layer 243 provided therebetween.

The first free magnetic layer 241 comprises a ferromagnetic conductive film which has low resistivity and is ferromagnetic, and which is made of the same material as the first free magnetic layer of the seventeenth embodiment.

The thickness of the first free magnetic layer 241 is preferably in the range of 0.5 to 3.5 nm.

The second free magnetic layer 242 comprises an anti-diffusion film 242A and a ferromagnetic film 242B, which are formed in contact with the nonmagnetic conductive layer 29 and the nonmagnetic intermediate insulating layer 243, respectively.

The anti-diffusion film 242A comprises a ferromagnetic conductive film of Co or the like, and prevents mutual diffusion between the ferromagnetic film 242B and the nonmagnetic conductive layer 29.

Like the anti-diffusion film 242A, the ferromagnetic film 242B comprises a ferromagnetic conductive film made of, for example, any one of Co, a CoFe alloy, a NiFe alloy, a CoNi alloy, and a CoNiFe alloy, preferably a NiFe alloy.

The thickness of the anti-diffusion film 242A is preferably in the range of 0.1 to 1.5 nm, and the thickness of the ferromagnetic film 242B is preferably in the range of 1.4 to 3.0 nm.

The thickness of the entire second free magnetic layer 242 is preferably in the range of 1.5 to 4.5 nm, and more preferably larger than the first free magnetic layer 241.

The nonmagnetic intermediate insulating layer 243 is made of a nonmagnetic insulating material which has higher resistivity than the first and second free magnetic layers 241 and 242.

The first and second free magnetic layers 241 and 242 are brought into the ferrimagnetic state by antiferromagnetic coupling. Therefore, when the magnetization direction of the second free magnetic layer 242 is oriented in the $X_1$ direction by the bias layers 332, the magnetization direction of the first free magnetic layer 241 is oriented in the direction opposite to the $X_1$ direction. The magnetization of the second free magnetic layer 242 remains to orient the magnetization direction of the entire free magnetic layer 240 in the $X_1$ direction.

Furthermore, a potential barrier is formed at the interface between the second free magnetic layer 242 (the ferromagnetic film 242B) and the nonmagnetic intermediate insulating layer 243 due to a great difference in resistivity between both layers.

Of the conduction electrons moving in the nonmagnetic conductive layer 29, therefore, up-spin conduction electrons are mirror-reflected by the potential barrier while maintaining the spin direction.

The up-spin conduction electrons are mirror-reflected by the nonmagnetic intermediate insulating layer 243 to extend the mean free path.

Namely, the up-spin conduction electrons quite possibly move from the pinned magnetic layer 40 to the second free magnetic layer 242 through the nonmagnetic conductive layer 29 when the magnetization directions of the pinned magnetic layer 40 and the free magnetic layer 240 are made parallel by the external magnetic field.

The up-spin conduction electrons are mirror-reflected at the interface between the second free magnetic layer 242 (the ferromagnetic film 242B) and the nonmagnetic intermediate insulating layer 243 while maintaining the spin state, and again move through the second free magnetic layer 242, the nonmagnetic conductive layer 29 and the pinned magnetic layer 40.

In this way, the up-spin conduction electrons move through the second free magnetic layer 242, the nonmagnetic conductive layer 29 and the pinned magnetic layer 40 twice each to significantly extend the mean free path.

Like in the first embodiment, therefore, in the spin valve element 18 of this embodiment, the mean free path of the up-spin conduction electrons can be significantly increased by the mirror-reflecting effect to increase the difference between the mean free paths of the up-spin and down-spin conduction electrons. Therefore, the rate of change in magnetoresistance of the spin valve element 18 can be significantly improved.

The spin valve element 18 is manufactured by substantially the same method as the spin valve element 3 of the third embodiment except that the nonmagnetic intermediate insulating film 243 is formed in place of the nonmagnetic intermediate layer.

The spin valve element 18 exhibits substantially the same effect as the spin valve element 17 of the seventeenth embodiment.

As described in detail above, in the spin valve element of the present invention of the present invention, a free magnetic layer comprises a nonmagnetic intermediate layer, and first and second free magnetic layers with the nonmagnetic intermediate layer provided therebetween, the second free magnetic layer being formed in contact with the nonmagnetic conductive layer. Also the first and second free magnetic layers are put into the ferrimagnetic state by antiferromagnetic coupling with each other, and one of the first and second free magnetic layers comprises a ferromagnetic insulating film. In the case where the first free magnetic layer comprises the ferromagnetic insulating film, the first free magnetic layer has higher resistivity, and the sensing current less flows through the first free magnetic layer to suppress a shunt of the sensing current. Therefore, the shunt loss can be decreased to increase the rate of change in magnetoresistance of the spin valve element.

Since the ferromagnetic insulating film has high resistivity, contact with another layer of low resistivity forms a potential barrier at the interface between both layers. As a result, up-spin conduction electrons are mirror-reflected to extend the mean free path of the up-spin conduction electrons, thereby further increasing the rate of change in magnetoresistance of the spin valve element.

In the spin valve element of the present invention, with the second free magnetic layer comprising a ferromagnetic insulating film, the up-spin conduction electrons are mirror-reflected by the ferromagnetic insulating film to extend the mean free path of the up-spin conduction electrons. Also the up-spin conduction electrons are trapped near the nonmagnetic conductive layer to suppress a shunt of the sensing current, decreasing the shunt loss. Therefore, the rate of change in magnetoresistance of the spin valve element can be further increased.

In the spin valve element of the present invention, the free magnetic layer comprises the nonmagnetic intermediate layer, and the first and second free magnetic layers with the nonmagnetic intermediate layer provided therebetween, and the first and second free magnetic layers are put into the ferrimagnetic state by antiferromagnetic coupling with each other. The second free magnetic layer may comprise a pair of ferromagnetic films which are brought into the ferrimagnetic state by antiferromagnetic coupling with each other. Therefore, the entire free magnetic layer is more stably put into the ferrimagnetic state, and the up-spin conduction electrons are mirror-reflected by the interface between a nonmagnetic intermediate insulating film having high resistivity and one of the ferromagnetic films to extend the mean free path of the up-spin conduction electrons. Therefore, the sensitivity to an external magnetic field can be increased, and the rate of-change in magnetoresistance can be improved.

In the spin valve element of the present invention, the free magnetic layer may comprise a nonmagnetic intermediate insulating layer, and first and second free magnetic layers with the nonmagnetic intermediate insulating layer provided therebetween, and the first and second free magnetic layers are put into the ferrimagnetic state by antiferromagnetic coupling with each other. Therefore, the up-spin conduction electrons are mirror-reflected by the interface between the nonmagnetic intermediate insulating film having high resistivity and the second free magnetic layer to extend the mean free path of the up-spin conduction electrons. Therefore, the sensitivity to an external magnetic field can be increased, and the rate of change in magnetoresistance can be improved.

What is claimed is:

1. A spin valve element comprising an antiferromagnetic layer, a pinned magnetic layer formed in contact with the antiferromagnetic layer so that the magnetization direction thereof is pinned by an exchange coupling magnetic field with the antiferromagnetic layer, a nonmagnetic conductive layer in contact with the pinned magnetic layer, and a free magnetic layer in contact with the nonmagnetic conductive layer;

wherein the free magnetic layer comprises a nonmagnetic intermediate layer, and first and second free magnetic layers with the nonmagnetic intermediate layer provided therebetween, the second free magnetic layer is formed in contact with the nonmagnetic conductive layer, the first and second free magnetic layers are antiferromagnetically coupled with each other to bring both layers into a ferrimagnetic state, and either of the first and second free magnetic layers comprises a ferromagnetic insulating film, wherein the ferromagnetic insulating film comprises a ferromagnetic insulating oxide film comprising a mixture of a fine crystal phase of bcc structure Fe having an average crystal grain diameter of 10 nm or less and an amorphous phase containing large amounts of T or T' and O (wherein T represents at least one element of the rare earth elements, and T' represents at least one element of Ti, Zr, Hf, V, Nb, Ta, and W), and the ratio of the fine crystal phase of bcc structure Fe to the entire structure is 50% or less.

2. A spin valve element according to claim 1, wherein the first free magnetic layer comprises only the ferromagnetic insulating film.

3. A spin valve element according to claim 1, wherein the first free magnetic layer preferably comprises a laminate of the ferromagnetic insulating film and a first ferromagnetic conductive film, the first ferromagnetic conductive film is formed in contact with the nonmagnetic intermediate layer, and the ferromagnetic insulating film and the first ferromagnetic conductive film are ferromagnetically coupled with each other to bring both films into a ferromagnetic state.

4. A spin valve element according to claim 3, wherein the thickness s of the first ferromagnetic conductive film is in the range of 0 nm<s≦3.0 nm.

5. A spin valve element according to claim 1, wherein the first free magnetic layer comprises only a first ferromagnetic conductive film.

6. A spin valve element according to claim 1, wherein the second free magnetic layer comprises only the ferromagnetic insulating film.

7. A spin valve element according to claim 6, wherein the thickness u of the ferromagnetic insulating film is in the range of 0.5 nm≦u≦10 nm.

8. A spin valve element according to claim 1, wherein the second free magnetic layer comprises a laminate of the ferromagnetic insulating film and a second ferromagnetic conductive film, the second ferromagnetic conductive film is formed in contact with the nonmagnetic intermediate layer, and the ferromagnetic insulating film and the second ferromagnetic conductive film are ferromagnetically coupled with each other to bring both films into a ferromagnetic state therebetween.

9. A spin valve element according to claim 1, wherein the second free magnetic layer comprises a laminate of the ferromagnetic insulating film and a third ferromagnetic conductive film, the third ferromagnetic conductive film is formed in contact with the nonmagnetic conductive layer, and the ferromagnetic insulating film and the third ferromagnetic conductive film are ferromagnetically coupled with each other to bring both films into the ferromagnetic state.

10. A spin valve element according to claim 1, wherein the second free magnetic layer comprises the ferromagnetic insulating film, and the second and third ferromagnetic conductive films with the ferromagnetic insulating film provided therebetween, which are ferromagnetically coupled with each other to bring the films into the ferromagnetic state.

11. A spin valve element according to claim 1, wherein the second free magnetic layer comprises only the second ferromagnetic conductive film.

12. A spin valve element according to claim 1, wherein the ferromagnetic insulating oxide film comprises Fe—O or M-Fe—O (wherein M is at least one element of Mn, Co, Ni, Ba, Sr, Y, Gd, Cu, and Zn).

13. A spin valve element according to claim 1, wherein the ferromagnetic insulating film further comprises a ferromagnetic insulating nitride film comprising a fine crystal phase mainly composed of bcc structure Fe having an average crystal grain diameter of 10 nm or less and an amorphous phase mainly composed of a compound of N and at least one element M selected from the group consisting of the rare earth metal elements, Ti, Zr, Hf, V, Nb, Ta, and W, and the ratio of the amorphous phase is 50% or more of the structure.

14. A spin valve element comprising an antiferromagnetic layer, a pinned magnetic layer formed in contact with the antiferromagnetic layer so that the magnetization direction thereof is pinned by an exchange coupling magnetic field with the antiferromagnetic layer, a nonmagnetic conductive layer in contact with the pinned magnetic layer, and a free magnetic layer in contact with the nonmagnetic conductive layer;

wherein the free magnetic layer comprises a nonmagnetic intermediate layer, and first and second free magnetic layers with the nonmagnetic intermediate layer provided therebetween, the second free magnetic layer is formed in contact with the nonmagnetic conductive layer, the first and second free magnetic layers are antiferromagnetically coupled with each other to bring both layers into a ferrimagnetic state, and either of the first and second free magnetic layers comprises a ferromagnetic insulating film, wherein the ferromagnetic insulating film comprises a ferromagnetic insulating nitride film comprising a fine crystal phase mainly composed of bcc structure Fe having an average crystal grain diameter of 10 nm or less and an amorphous phase mainly composed of a compound of N and at least one element T selected from the group consisting of the rare earth metal elements, Ti, Zr, Hf, V, Nb, Ta, and W, and the ratio of the amorphous phase is 50% or more of the structure.

15. A spin valve element according to claim 14, wherein the first free magnetic layer comprises only the ferromagnetic insulating film.

16. A spin valve element according to claim 14, wherein the first free magnetic layer preferably comprises a laminate of the ferromagnetic insulating film and a first ferromagnetic conductive film, the first ferromagnetic conductive film is formed in contact with the nonmagnetic intermediate layer, and the ferromagnetic insulating film and the first ferromagnetic conductive film are ferromagnetically coupled with each other to bring both films into a ferromagnetic state.

17. A spin valve element according to claim 16, wherein the thickness s of the first ferromagnetic conductive film is in the range of 0 nm<s≦3.0 nm.

18. A spin valve element according to claim 14, wherein the first free magnetic layer comprises only a first ferromagnetic conductive film.

19. A spin valve element according to claim 14, wherein the second free magnetic layer comprises only the ferromagnetic insulating film.

20. A spin valve element according to claim 19, wherein the thickness u of the ferromagnetic insulating film is in the range of 0.5 nm≦u≦10 nm.

21. A spin valve element according to claim 14, wherein the second free magnetic layer comprises a laminate of the ferromagnetic insulating film and a second ferromagnetic conductive film, the second ferromagnetic conductive film is formed in contact with the nonmagnetic intermediate layer, and the ferromagnetic insulating film and the second ferromagnetic conductive film are ferromagnetically coupled with each other to bring both films into a ferromagnetic state therebetween.

22. A spin valve element according to claim 14, wherein the second free magnetic layer comprises a laminate of the ferromagnetic insulating film and a third ferromagnetic conductive film, the third ferromagnetic conductive film is formed in contact with the nonmagnetic conductive layer, and the ferromagnetic insulating film and the third ferromagnetic conductive film are ferromagnetically coupled with each other to bring both films into the ferromagnetic state.

23. A spin valve element according to claim 14, wherein the second free magnetic layer comprises the ferromagnetic insulating film, and the second and third ferromagnetic conductive films with the ferromagnetic insulating film provided therebetween, which are ferromagnetically coupled with each other to bring the films into the ferromagnetic state.

24. A spin valve element according to claim 14, wherein the second free magnetic layer comprises only the second ferromagnetic conductive film.

25. A spin valve element according to claim 14, wherein the ferromagnetic insulating film comprises a ferromagnetic insulating oxide film composed of Fe—O or M-Fe—O (wherein M is at least one element of Mn, Co, Ni, Ba, Sr, Y, Gd, Cu, and Zn).

* * * * *